US008901418B2

(12) United States Patent
Walker et al.

(10) Patent No.: US 8,901,418 B2
(45) Date of Patent: Dec. 2, 2014

(54) SERVER CABINET

(71) Applicant: Panduit Corp., Tinley Park, IL (US)

(72) Inventors: Jonathan D. Walker, Chicago, IL (US); Shi Gui Zhang, Wuxi (CN); Robert L. Fritz, Elwood, IL (US); Roger D. Segroves, Lockport, IL (US); Tomasz K. Waz, Orland Park, IL (US); Gregory L. McClain, Homer Glen, IL (US); Matthew C. Isoda, Clarendon Hills, IL (US); Alan F. Wojcik, Cedar Lake, IN (US); Roman J. Churnovic, Joliet, IL (US); Pierre Perez, Alsip, IL (US); Charles T. Newcomb, Naperville, IL (US); Michael R. Walters, Crystal Lake, IL (US); Mark J. Donnell, Orland Park, IL (US); Mark A. Vogel, Mokena, IL (US)

(73) Assignee: Panduit Corp., Tinley Park, IL (US)

( * ) Notice: Subject to any disclaimer, the term of this patent is extended or adjusted under 35 U.S.C. 154(b) by 65 days.

(21) Appl. No.: 13/922,777

(22) Filed: Jun. 20, 2013

(65) Prior Publication Data

US 2013/0342091 A1 Dec. 26, 2013

Related U.S. Application Data

(60) Provisional application No. 61/663,898, filed on Jun. 25, 2012.

(51) Int. Cl.
*H02G 3/08* (2006.01)
*H05K 5/02* (2006.01)
*H05K 5/03* (2006.01)
*H05K 7/14* (2006.01)

(52) U.S. Cl.
CPC ............... *H05K 5/0247* (2013.01); *H05K 5/03* (2013.01); *H05K 5/02* (2013.01); *H05K 7/1488* (2013.01); *H05K 7/1491* (2013.01)
USPC .............................. 174/50; 174/520; 211/26

(58) Field of Classification Search
USPC ...................... 174/520, 50; 211/26
See application file for complete search history.

(56) References Cited

U.S. PATENT DOCUMENTS

| 3,881,829 A | 5/1975 | James |
| 4,712,232 A | 12/1987 | Rodgers |
| 4,952,869 A | 8/1990 | Tuttle |
| 5,094,622 A | 3/1992 | Auclair |
| 5,115,377 A | 5/1992 | Dransman |
| 5,306,080 A | 4/1994 | Lautenschlager et al. |
| 5,326,162 A | 7/1994 | Bovermann |

(Continued)

OTHER PUBLICATIONS

Chatsworth Products, Inc., "Signature Solutions . . . TeraFrame™ Family of Cabinets," Jan. 2009; 12 pages.

(Continued)

*Primary Examiner* — Dhirubhai R Patel
(74) *Attorney, Agent, or Firm* — Christopher S. Clancy; James H. Williams

(57) ABSTRACT

A frame for a cabinet is provided. The frame includes a side-to-side beam, a front-to-back beam connected to the side-to-side beam, and a vertical post connected to the side-to-side beam. The front-to-back beam is inset relative to the vertical post to form a cable-routing area along a side of the frame.

18 Claims, 61 Drawing Sheets

(56) References Cited

U.S. PATENT DOCUMENTS

| | | | | |
|---|---|---|---|---|
| 5,372,262 | A * | 12/1994 | Benson et al. | 211/26 |
| 5,396,405 | A | 3/1995 | Reed et al. | |
| 5,401,193 | A | 3/1995 | Lo Cicero et al. | |
| 5,458,019 | A | 10/1995 | Trevino | |
| 5,548,489 | A | 8/1996 | Reed et al. | |
| 5,624,045 | A | 4/1997 | Highsmith et al. | |
| 5,640,482 | A | 6/1997 | Barry et al. | |
| 5,647,763 | A | 7/1997 | Arnold et al. | |
| 5,788,087 | A | 8/1998 | Orlando | |
| 5,807,008 | A | 9/1998 | Schwenk et al. | |
| 5,975,962 | A | 11/1999 | Laukonis | |
| 5,997,117 | A | 12/1999 | Krietzman | |
| 6,021,909 | A | 2/2000 | Tang et al. | |
| 6,036,290 | A | 3/2000 | Jancsek et al. | |
| 6,044,194 | A | 3/2000 | Meyerhoefer | |
| 6,123,203 | A | 9/2000 | Gibbons | |
| 6,185,098 | B1 | 2/2001 | Benavides | |
| 6,386,495 | B1 | 5/2002 | DeRaffele | |
| 6,388,193 | B2 | 5/2002 | Maynard et al. | |
| 6,394,398 | B1 | 5/2002 | Reed et al. | |
| 6,478,166 | B2 | 11/2002 | Hung | |
| 6,501,899 | B1 | 12/2002 | Marrs et al. | |
| D468,622 | S | 1/2003 | Sarkinen et al. | |
| 6,516,955 | B1 * | 2/2003 | Dudhwala et al. | 211/26 |
| 6,546,179 | B2 | 4/2003 | Petri | |
| 6,586,680 | B1 | 7/2003 | Nelson | |
| 6,614,665 | B2 | 9/2003 | Witty et al. | |
| 6,648,280 | B1 | 11/2003 | Chong | |
| 6,655,533 | B2 * | 12/2003 | Guebre-Tsadik | 211/26 |
| 6,769,551 | B2 | 8/2004 | Rafferty et al. | |
| 6,771,871 | B2 | 8/2004 | Krampotich et al. | |
| 6,785,459 | B2 | 8/2004 | Schmidt et al. | |
| 6,866,154 | B2 | 3/2005 | Hartman et al. | |
| 6,947,654 | B2 | 9/2005 | Krampotich et al. | |
| 6,980,726 | B2 | 12/2005 | Daoud et al. | |
| 7,087,840 | B2 | 8/2006 | Herring et al. | |
| 7,119,280 | B1 | 10/2006 | Ray et al. | |
| 7,187,543 | B2 | 3/2007 | Zimlin | |
| 7,205,481 | B2 | 4/2007 | Higbie | |
| 7,277,273 | B2 | 10/2007 | Smith et al. | |
| 7,293,666 | B2 | 11/2007 | Mattlin et al. | |
| 7,319,804 | B2 | 1/2008 | Hruby et al. | |
| D569,712 | S | 5/2008 | Young, IV | |
| 7,437,048 | B2 | 10/2008 | Farrell et al. | |
| 7,462,779 | B2 | 12/2008 | Caveney et al. | |
| 7,466,890 | B2 | 12/2008 | Kachmar | |
| D584,251 | S | 1/2009 | Lewis, II et al. | |
| D584,252 | S | 1/2009 | Lewis, II et al. | |
| 7,472,970 | B2 | 1/2009 | Bergesch et al. | |
| D588,081 | S | 3/2009 | Lewis, II et al. | |
| 7,498,512 | B2 | 3/2009 | Adducci et al. | |
| 7,526,171 | B2 | 4/2009 | Caveney et al. | |
| D592,618 | S | 5/2009 | Lewis, II et al. | |
| 7,542,287 | B2 | 6/2009 | Lewis, II et al. | |
| 7,697,285 | B2 | 4/2010 | Donowho et al. | |
| 7,734,139 | B2 | 6/2010 | Rector, III | |
| 7,740,329 | B2 | 6/2010 | Hsiung et al. | |
| 7,746,637 | B2 | 6/2010 | Donowho et al. | |
| 7,804,685 | B2 | 9/2010 | Krietzman | |
| 7,839,635 | B2 * | 11/2010 | Donowho et al. | 361/692 |
| 7,894,190 | B2 | 2/2011 | Davis et al. | |
| 7,957,139 | B2 | 6/2011 | Davis et al. | |
| 7,974,105 | B2 | 7/2011 | Dean, Jr. et al. | |
| 8,003,890 | B2 | 8/2011 | Donowho et al. | |
| 8,038,015 | B2 | 10/2011 | Laursen et al. | |
| 8,040,673 | B2 | 10/2011 | Krietzman | |
| RE42,970 | E | 11/2011 | Fournier et al. | |
| 8,061,534 | B2 | 11/2011 | Laursen et al. | |
| 8,107,238 | B2 | 1/2012 | Krietzman et al. | |
| 8,153,893 | B2 | 4/2012 | McSorley et al. | |
| 8,186,174 | B2 | 5/2012 | Gilliland et al. | |
| 8,339,261 | B1 | 12/2012 | Wolski | |
| 8,395,046 | B2 | 3/2013 | Nicewicz et al. | |
| 8,405,984 | B2 | 3/2013 | Donowho et al. | |
| 8,406,082 | B2 | 3/2013 | Michaels et al. | |
| 8,411,465 | B2 | 4/2013 | Dean, Jr. et al. | |
| 8,437,147 | B2 | 5/2013 | Dean, Jr. et al. | |
| 2004/0183409 | A1 | 9/2004 | Rinderer | |
| 2007/0064389 | A1 | 3/2007 | Lewis, II et al. | |
| 2007/0064391 | A1 | 3/2007 | Lewis, II et al. | |
| 2007/0099493 | A1 | 5/2007 | Niazi | |
| 2007/0099494 | A1 | 5/2007 | Niazi et al. | |
| 2008/0035810 | A1 | 2/2008 | Lewis, II | |
| 2008/0037228 | A1 | 2/2008 | Lewis, II | |
| 2008/0062654 | A1 | 3/2008 | Mattlin et al. | |
| 2008/0062655 | A1 | 3/2008 | Laursen et al. | |
| 2008/0316702 | A1 | 12/2008 | Donowho et al. | |
| 2008/0316703 | A1 | 12/2008 | Donowho et al. | |
| 2009/0129013 | A1 | 5/2009 | Donowho et al. | |
| 2009/0147944 | A1 | 6/2009 | McSorley et al. | |
| 2009/0179116 | A1 | 7/2009 | St-Louis et al. | |
| 2009/0190307 | A1 | 7/2009 | Krietzman | |
| 2009/0224110 | A1 | 9/2009 | Donowho et al. | |
| 2009/0239461 | A1 | 9/2009 | Lewis, II et al. | |
| 2009/0261211 | A1 | 10/2009 | Anguiano-Wehde et al. | |
| 2009/0305554 | A1 | 12/2009 | Siano | |
| 2010/0061059 | A1 | 3/2010 | Krietzman et al. | |
| 2010/0068923 | A1 | 3/2010 | Tabet | |
| 2010/0172092 | A1 | 7/2010 | Davis et al. | |
| 2010/0172093 | A1 | 7/2010 | Davis et al. | |
| 2010/0193754 | A1 | 8/2010 | Garza et al. | |
| 2011/0211328 | A1 | 9/2011 | Dean, Jr. et al. | |
| 2011/0211329 | A1 | 9/2011 | Dean, Jr. et al. | |
| 2012/0133510 | A1 | 5/2012 | Pierce et al. | |
| 2012/0229633 | A1 | 9/2012 | Boucino et al. | |

OTHER PUBLICATIONS

APC NetShelter® SX 750-mm Mounting Rail Brush Strips Installation—AR7706; one page; Jul. 2005.

APC NetShelter® SX Air Recirculation Prevention Kit—AR7708, 6 pages, Nov. 2005.

* cited by examiner

SERVER CABINET

CROSS REFERENCE TO RELATED APPLICATIONS

This application claims the benefit of U.S. Provisional Patent Application No. 61/663,898, filed on Jun. 25, 2012, which is incorporated by reference in its entirety.

BACKGROUND OF THE INVENTION

The present invention relates to a server cabinet, and more particularly, a server cabinet having inset front-to-back beams and removable vertical posts.

Server cabinets are well known in the art. For example, U.S. Pat. No. 7,293,666, which is assigned to American Power Conversion Corporation (West Kingston, R.I.), discloses a server cabinet. However, the server cabinet does not have inset front-to-back beams and removable vertical posts.

Therefore, there is a need for a server cabinet having inset front-to-back beams and removable vertical posts.

SUMMARY OF THE INVENTION

A frame for a cabinet is provided. The frame includes a side-to-side beam, a front-to-back beam connected to the side-to-side beam, and a vertical post connected to the side-to-side beam. The front-to-back beam is inset relative to the vertical post to form a cable-routing area along a side of the frame.

DETAILED DESCRIPTION

Figure 1:
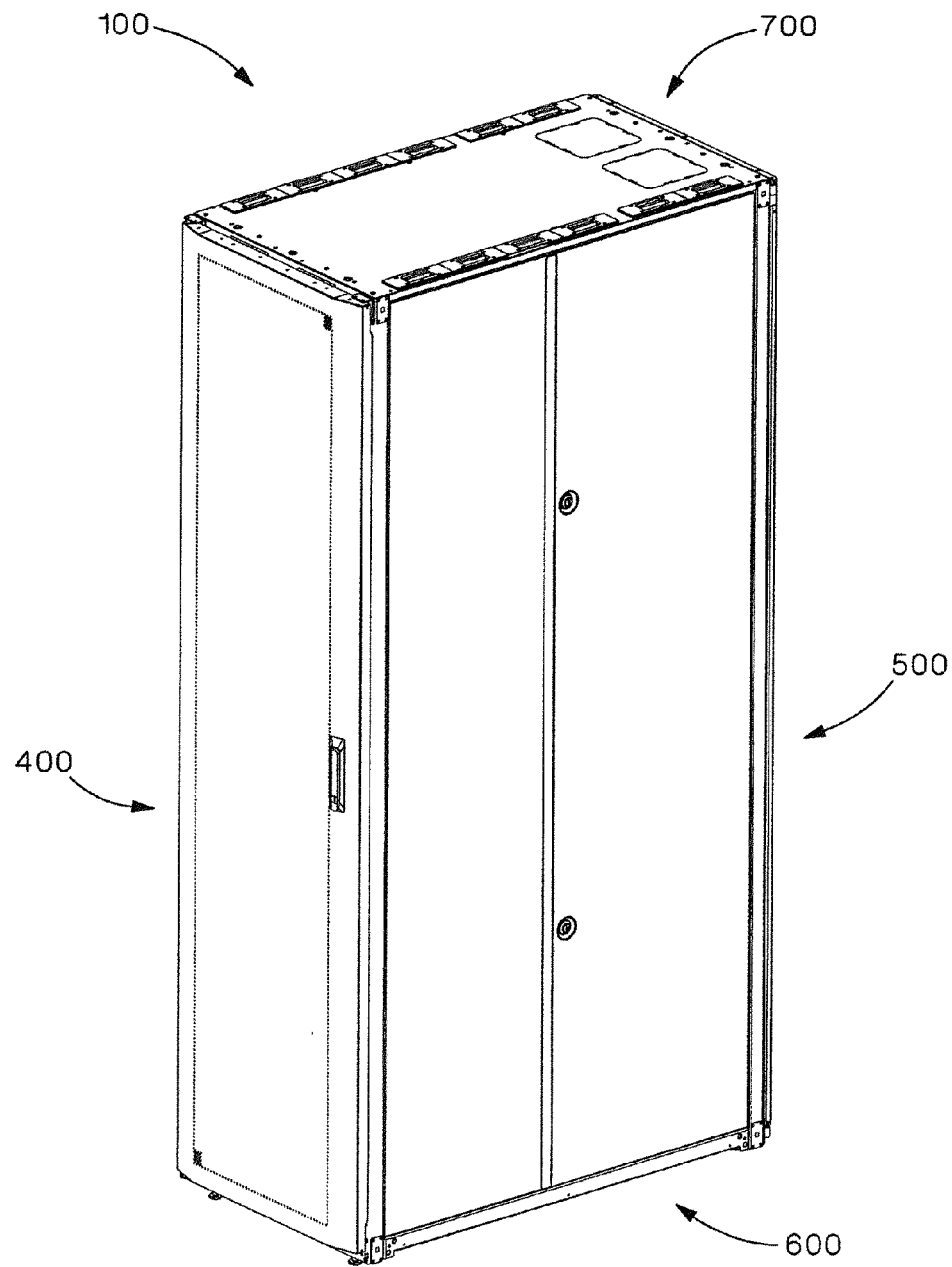
FIG. 1 is a top front perspective view of a server cabinet according to an embodiment of the present invention.
Figure 2:
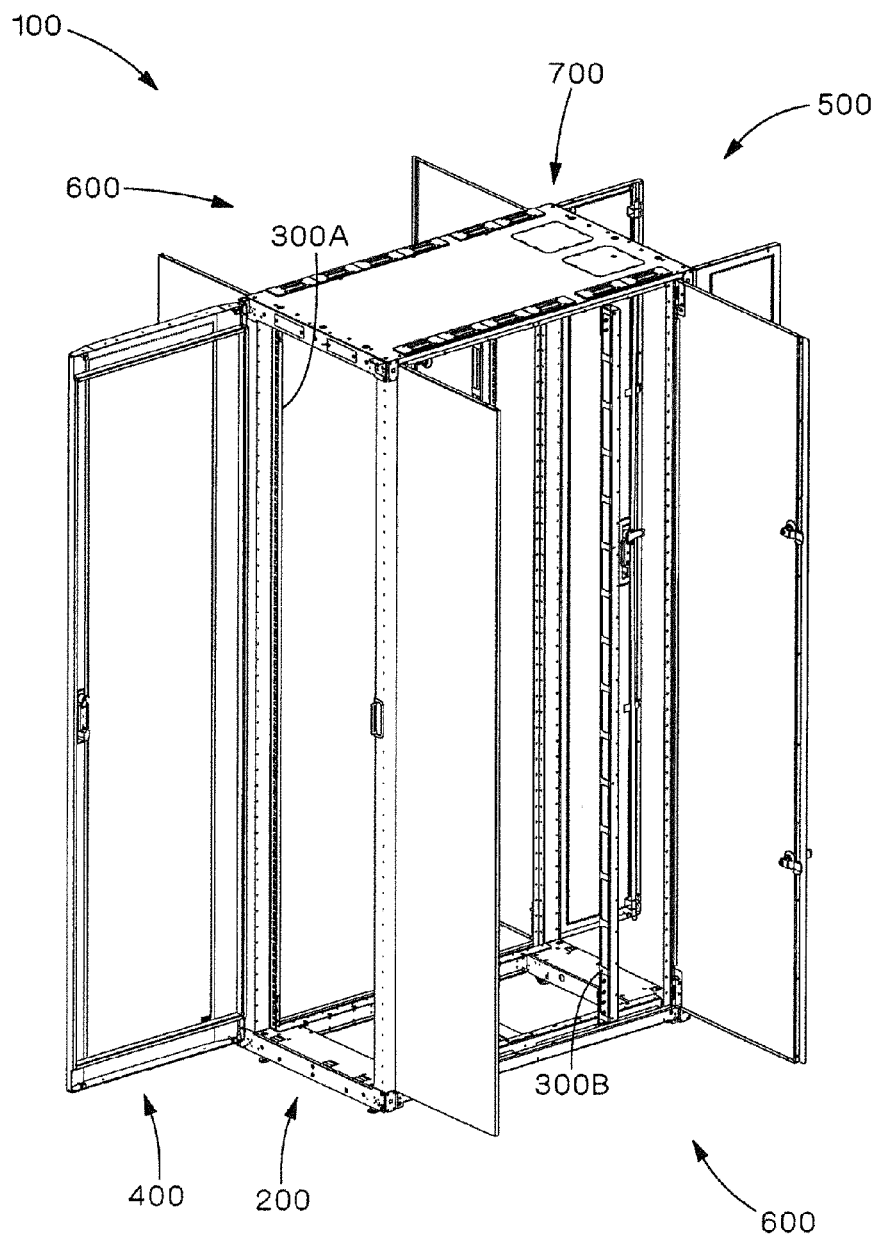
FIG. 2 is a top front perspective view of the server cabinet of FIG. 1, showing the front door, back door, and side panels in an open position.
Figure 3:
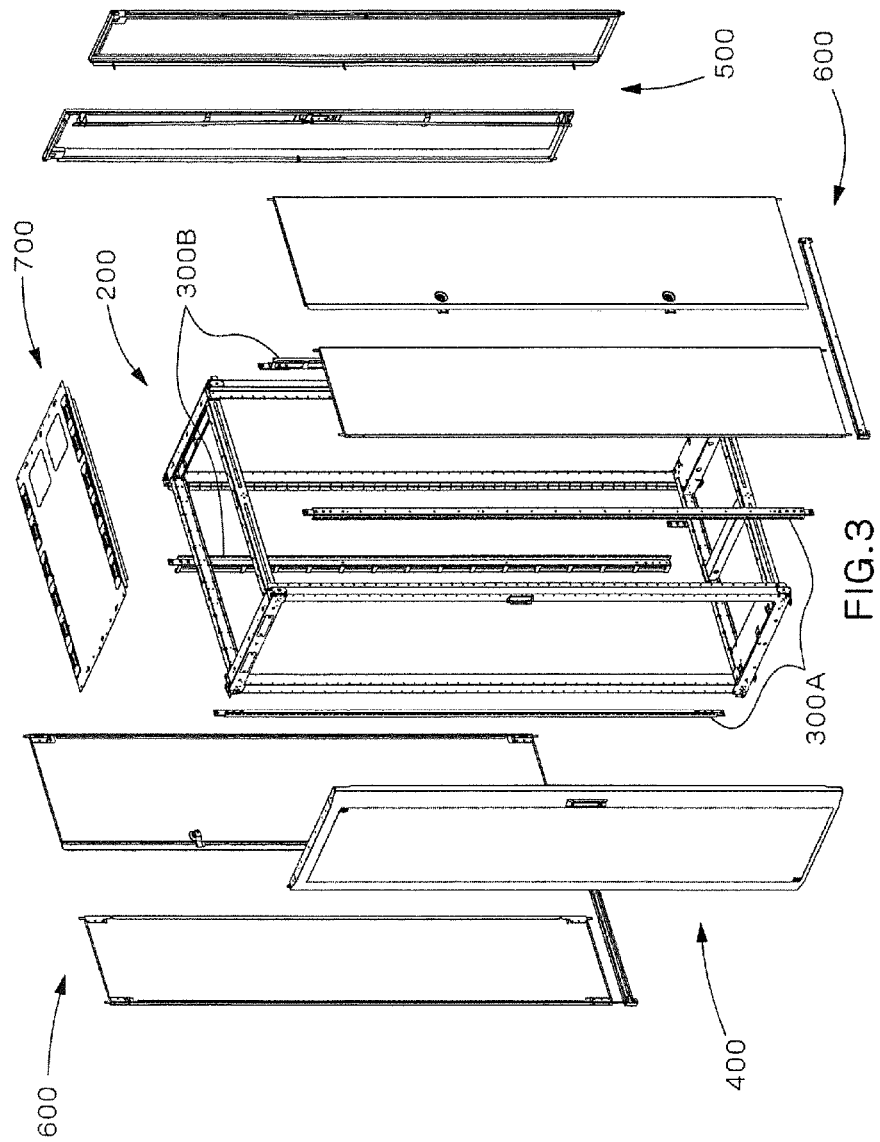
FIG. 3 is an exploded top front perspective view of the server cabinet of FIG. 1.

As shown in FIGS. 1-3, server cabinet 100 includes cabinet frame 200 (FIGS. 4-16), equipment rails 300A, 300B (FIGS. 17-31), front door 400 (FIGS. 32-37), back door 500 (FIGS. 38-43), side door 600 (FIGS. 44-52), and top cap 700 (FIGS. 53-61).

Figure 4:
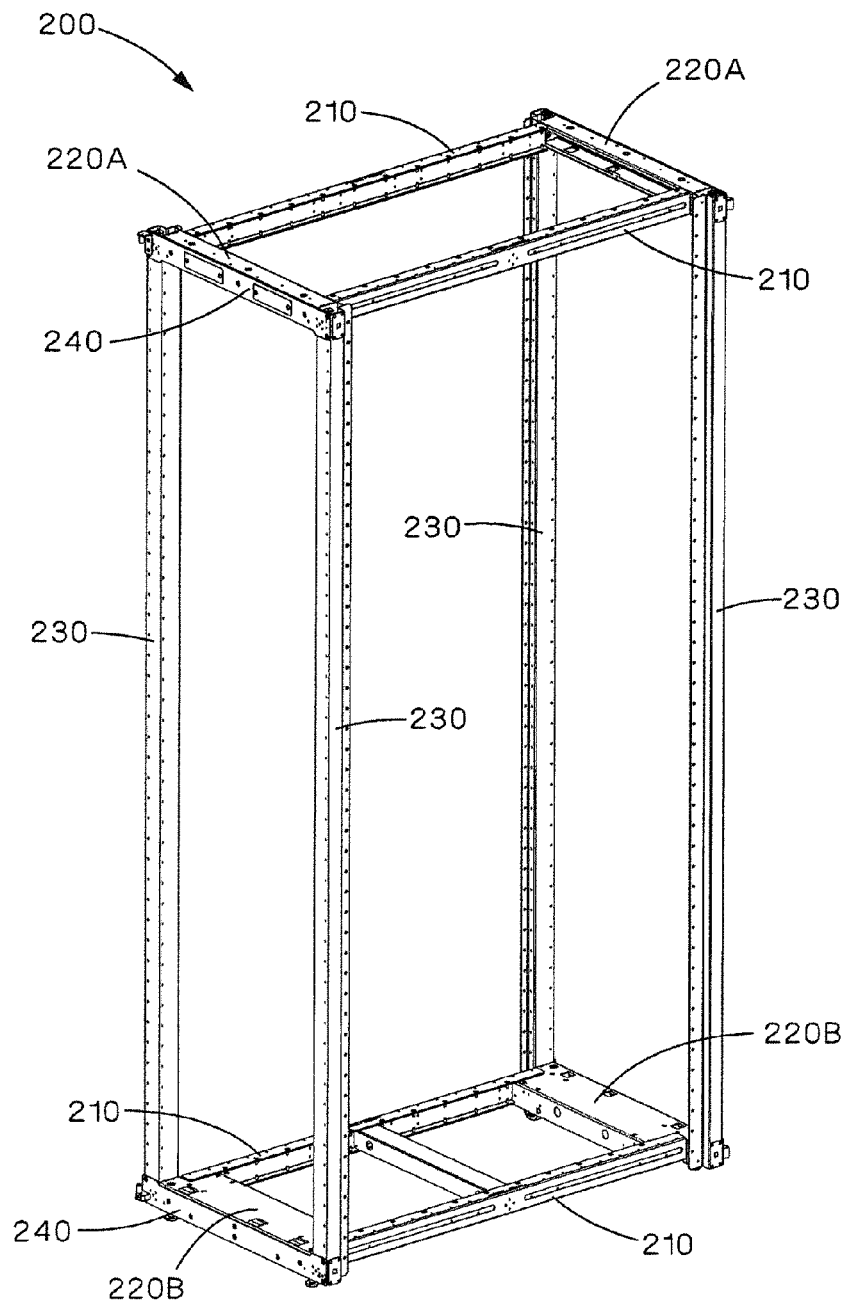
FIG. 4 is a top front perspective view of the cabinet frame of FIG. 3.

As shown in FIG. 4, cabinet frame 200 includes front-to-back beams 210, top and bottom side-to-side beams 220A, 220B, vertical posts 230, and face plates 240.

Figure 5:
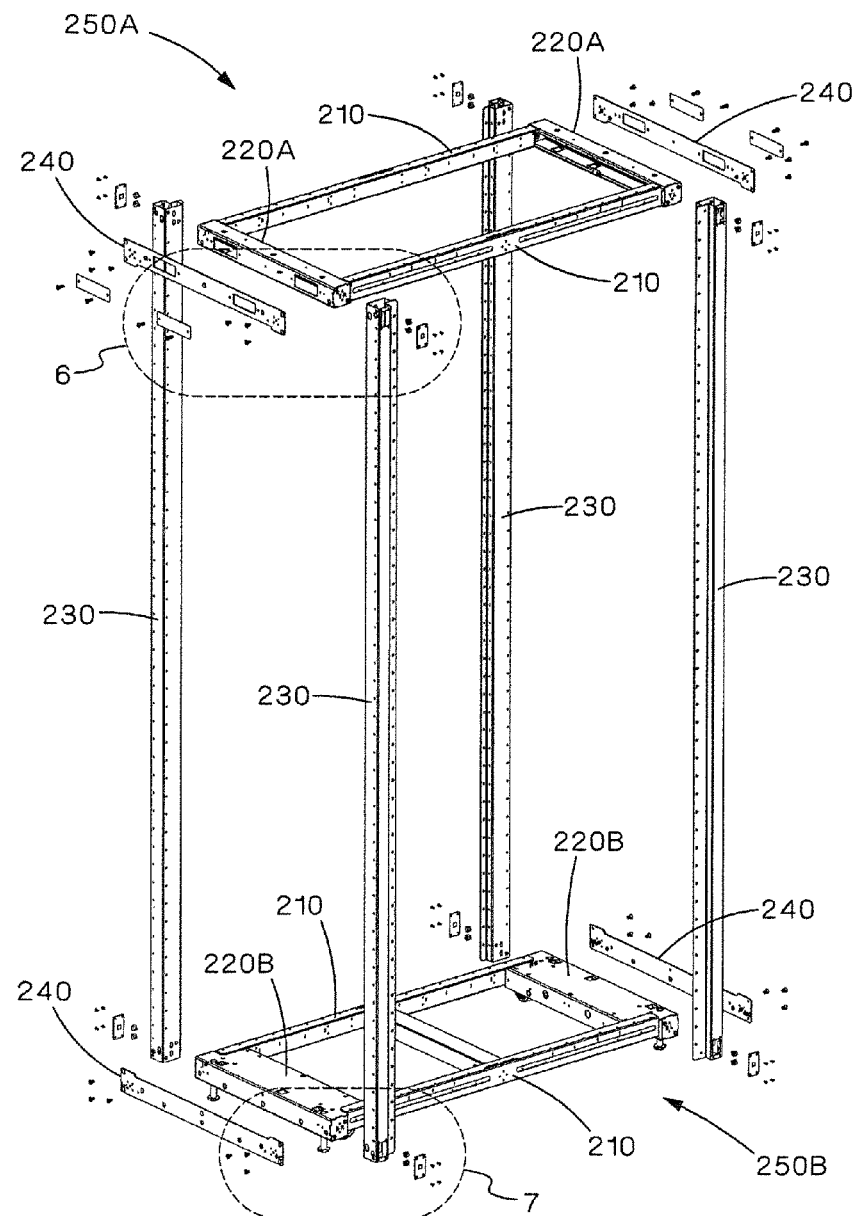
FIG. 5 is an exploded top front perspective view of the cabinet frame of FIG. 4.

As shown in FIG. 5, front-to-back beams 210 and top side-to-side beams 220A are connected to form top frame 250A. Similarly, front-to-back beams 210 and bottom side-to-side beams 220B are connected to form bottom frame 250B. Preferably, front-to-back beams 210 are permanently connected to side-to-side beams 220A, 220B, for example, using permanent connectors, such as rivets and welds, but it is likewise contemplated that front-to-back beams 210 are removably connected to side-to-side beams 220A, 220B, for example, using removable connectors, such as nuts and bolts and screws.

Figure 6:
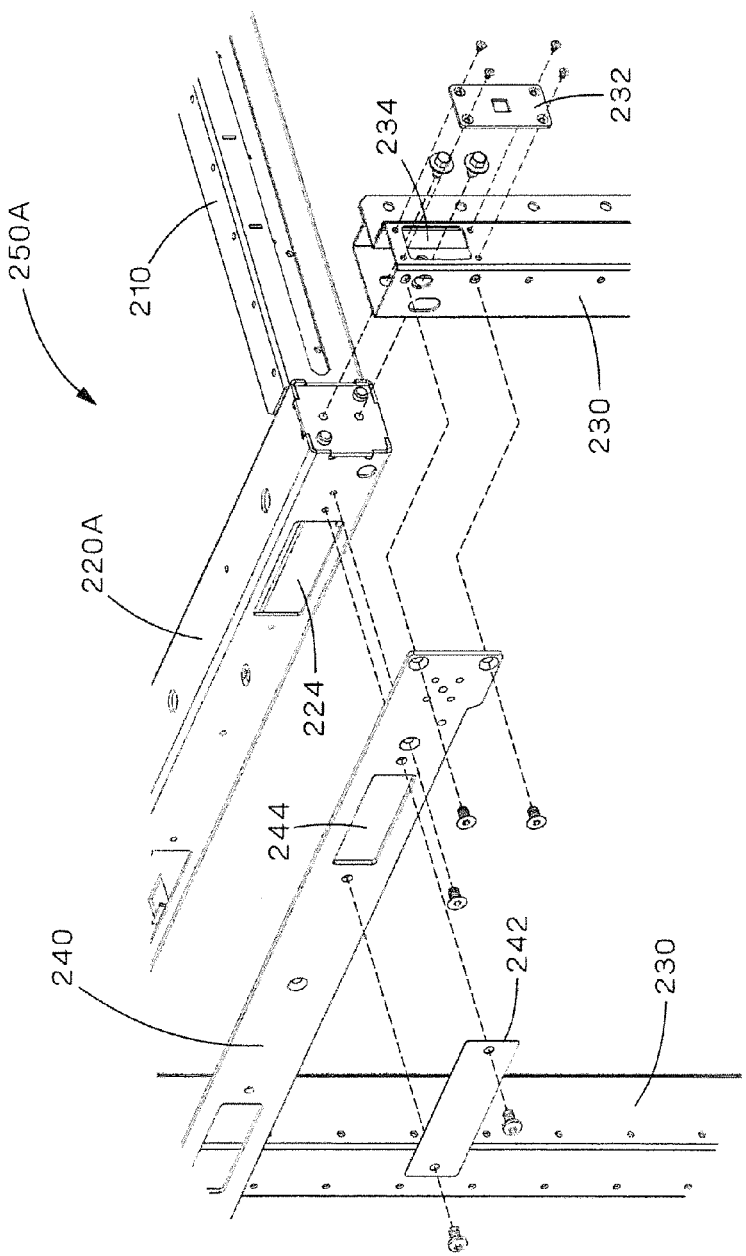
FIG. 6 is an enlarged top front perspective view of detail 6 of FIG. 5.
Figure 7:
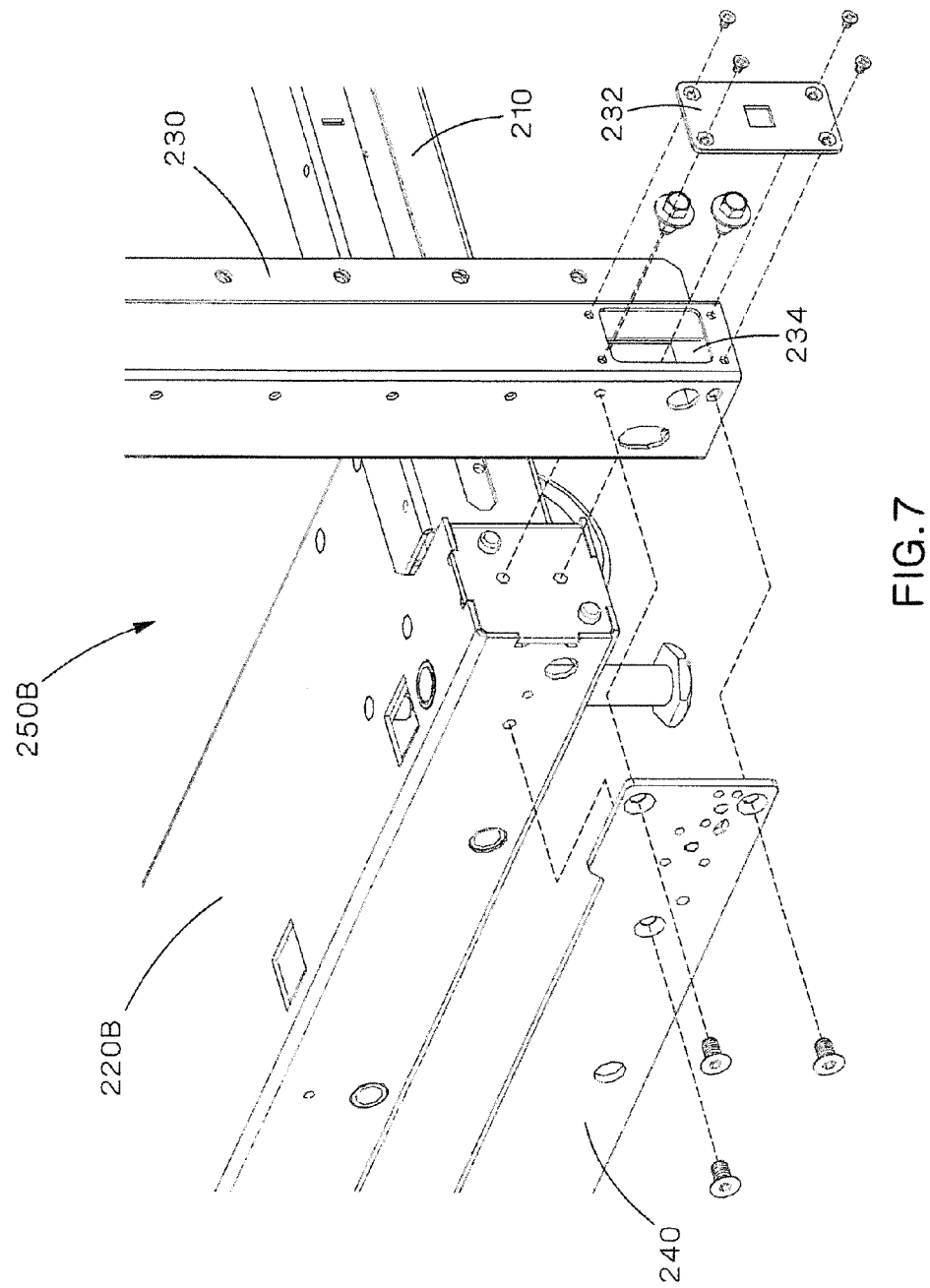
FIG. 7 is an enlarged top front perspective view of detail 7 of FIG. 5.

As shown in FIGS. 6 and 7, vertical posts 230 are connected to top and bottom frames 250A, 250B, and more particularly, side-to-side beams 220A, 220B, to form cabinet frame 200. Preferably, vertical posts 230 are removably connected to side-to-side beams 220A, 220B, for example, using removable connectors, such as nuts and bolts and screws, but it is likewise contemplated that vertical posts 230 are permanently connected to side-to-side beams 220A, 220B, for example, using permanent connectors, such as rivets and welds. Cover plates 232 are removably connected to vertical posts 230, for example, using removable connectors, such as nuts and bolts and screws, and when removed, provide access to cabinet frame assembly openings 234. Additionally, when installed, cover plates 232 act as standoffs for ganging multiple cabinets.

Additionally, face plates 240 are removably connected to side-to-side beams 220A, 220B and vertical posts 230, for example, using removable connectors, such as nuts and bolts and screws, but it is likewise contemplated that face plates 240 are permanently connected to side-to-side beams 220A, 220B, for example, using permanent connectors, such as rivets and welds. Preferably, face plates 240 provide additional stiffness to cabinet frame 200, and more particularly, side-to-side beams 220A, 220B and vertical posts 230. Cover plates 242 are removably connected to face plates 240, and ultimately, side-to-side beams 220A, for example, using removable connectors, such as nuts and bolts and screws, and when removed, provide access to cable routing openings 224, 244.

Preferably, top and bottom frames 250A, 250B are assembled before shipping server cabinet 100, for example, at a factory. However, vertical posts 230 and face plates 240, as well as equipment rails 300, front door 400, back door 500, side door 600, and top cap 700, might be assembled after shipping server cabinet 100, for example, at a data center or a remote assembly facility located near the data center, which reduces the shipping volume, and therefore, the shipping cost of server cabinet 100, without significantly impacting the assembly time.

Figure 8:
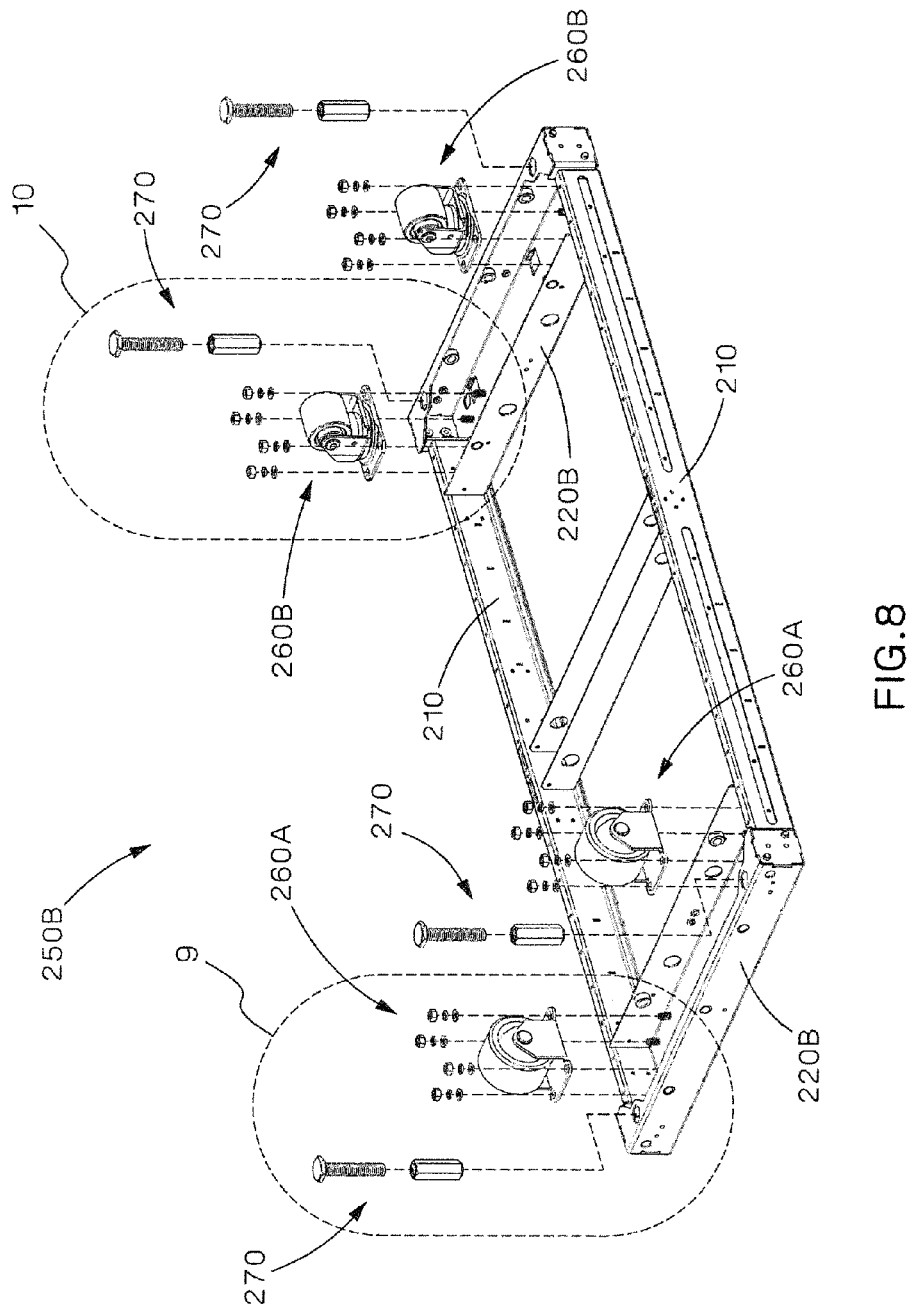
FIG. 8 is an exploded bottom front perspective view of the bottom frame of FIG. 5.
Figure 9:
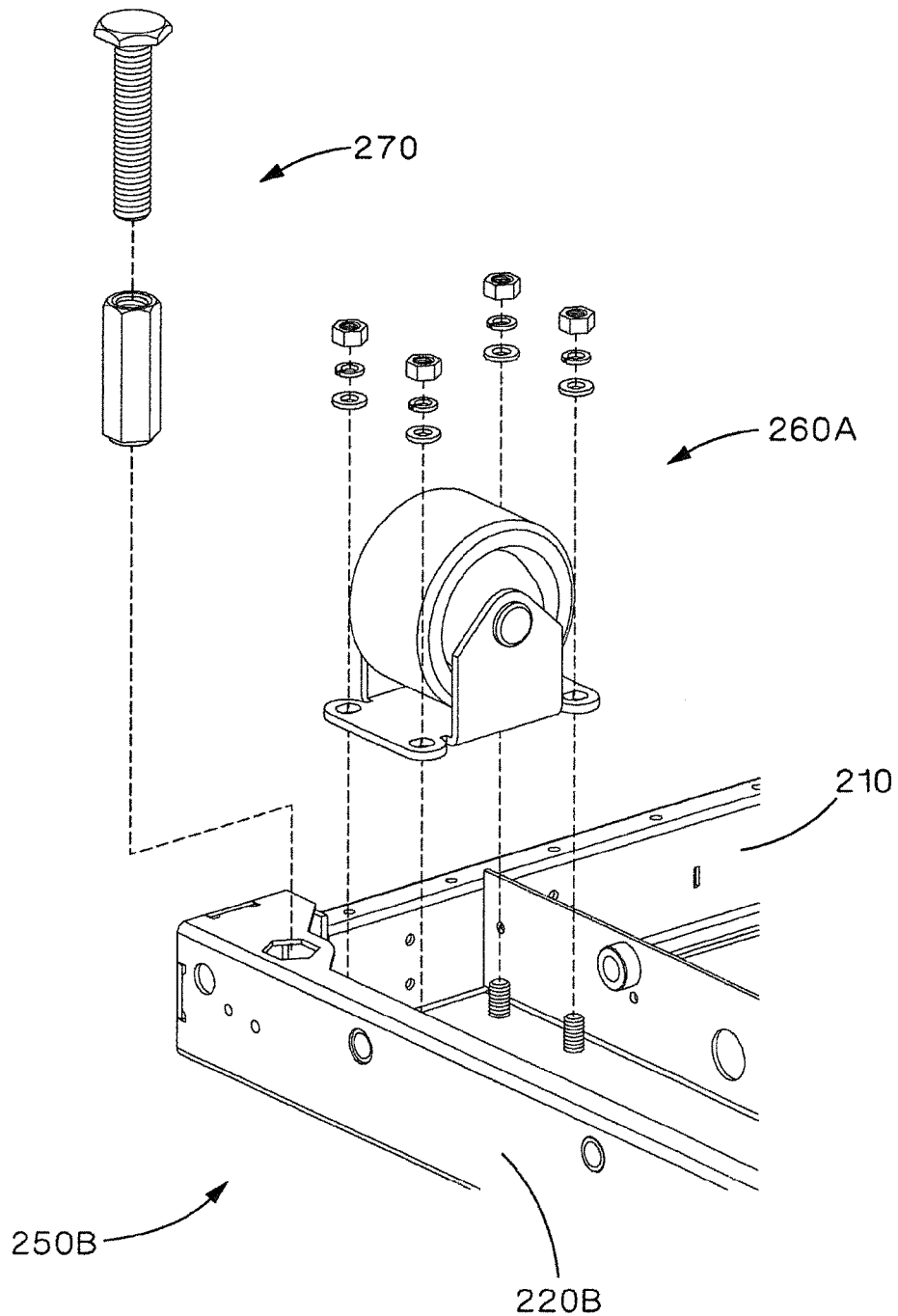
FIG. 9 is an enlarged bottom front perspective view of detail 9 of FIG. 8.
Figure 10:
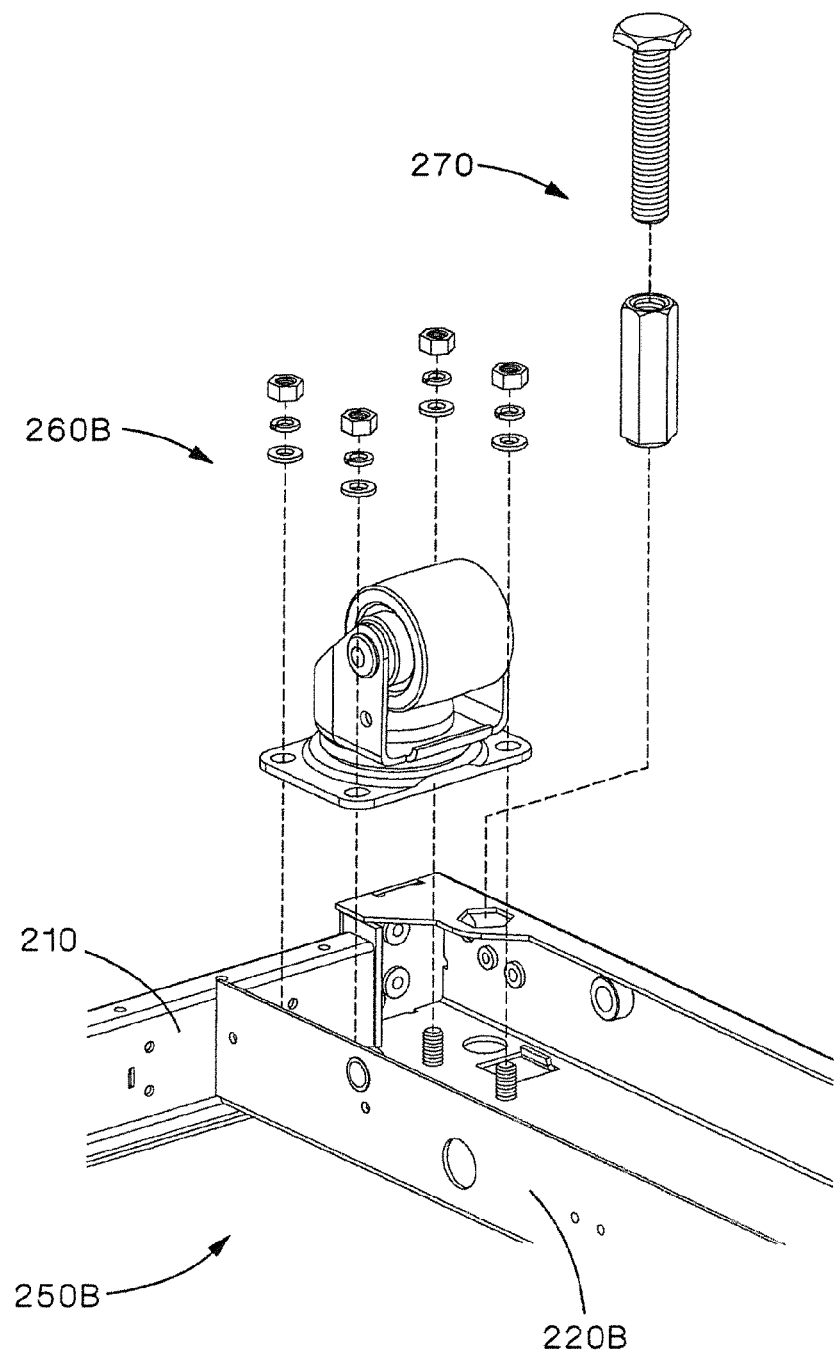
FIG. 10 is an enlarged bottom front perspective view of detail 10 of FIG. 8.

As shown in FIGS. 8-10, front and back casters 260A, 260B and leveling legs 270 are connected to bottom frame 250B, and more particularly, bottom side-to-side beams 220B. Preferably, back casters 260B and leveling legs 270 are rotatably connected to bottom frame 250B, and more particularly, bottom side-to-side beams 220B, to aid in positioning and leveling of server cabinet 100, but it is likewise contemplated that front casters 260A, taken alone or in combination with back casters 260B, are rotatably connected to bottom frame 250B, and more particularly, bottom side-to-side beams 220B, to further aid in positioning of server cabinet 100.

Figure 11:
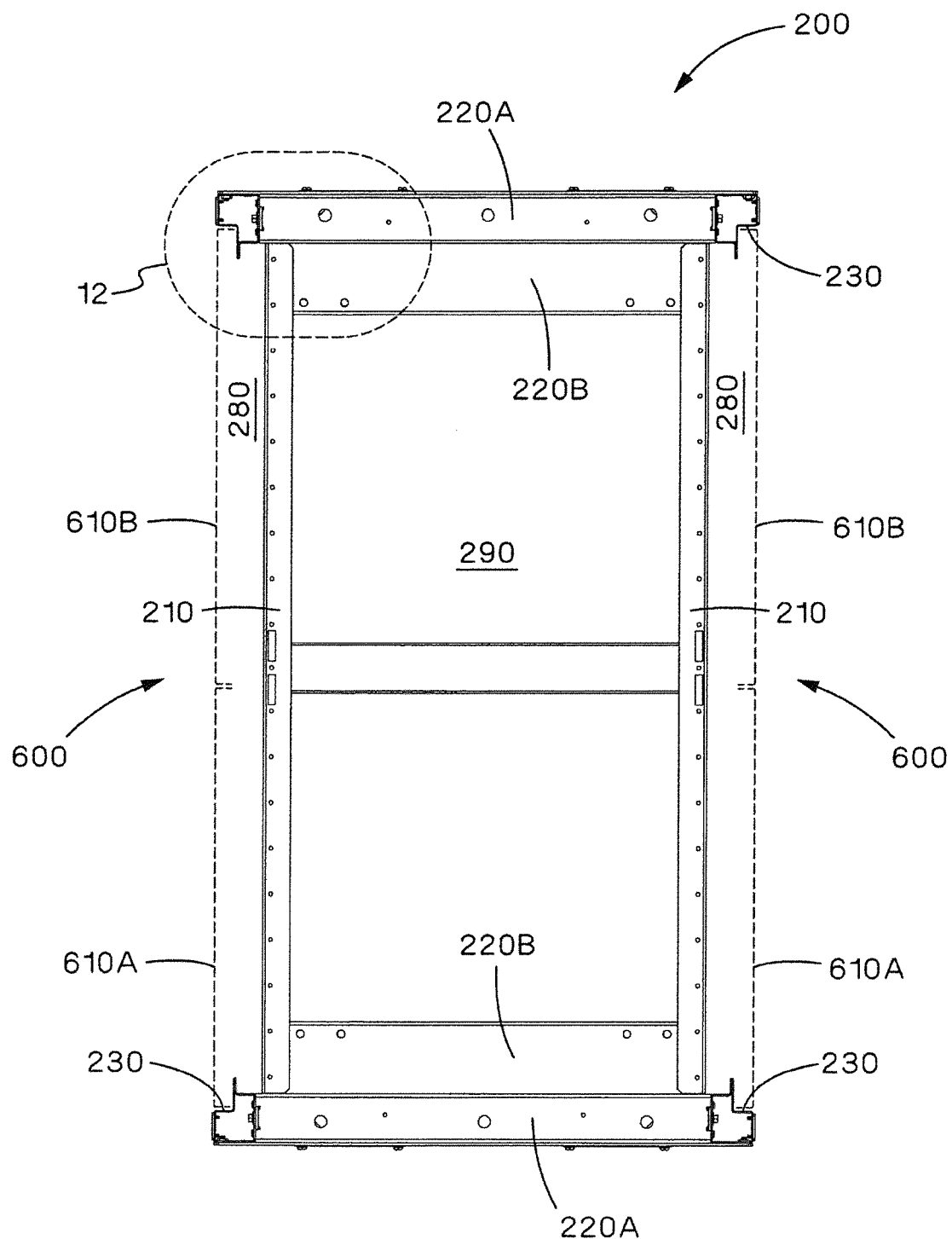
FIG. 11 is a top view of the cabinet frame of FIG. 4.
Figure 12:
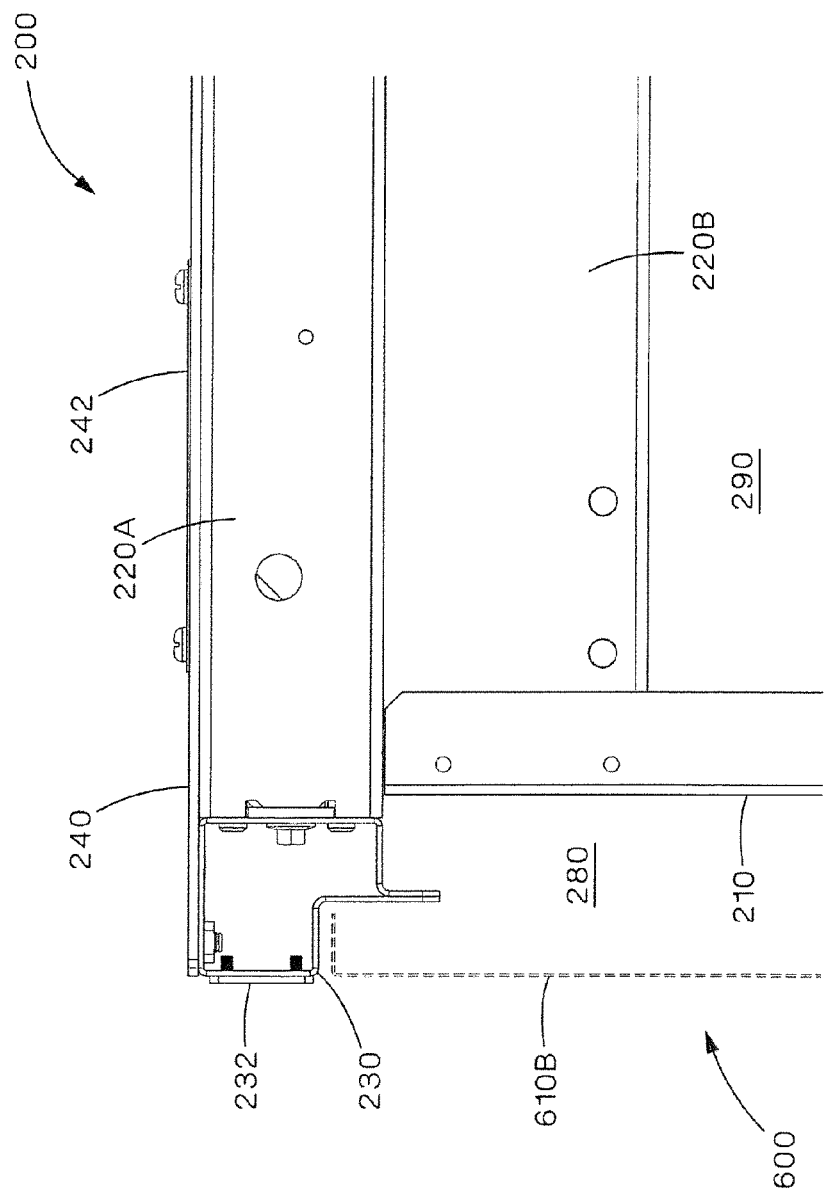
FIG. 12 is an enlarged top view of detail 12 of FIG. 11.
Figure 13:
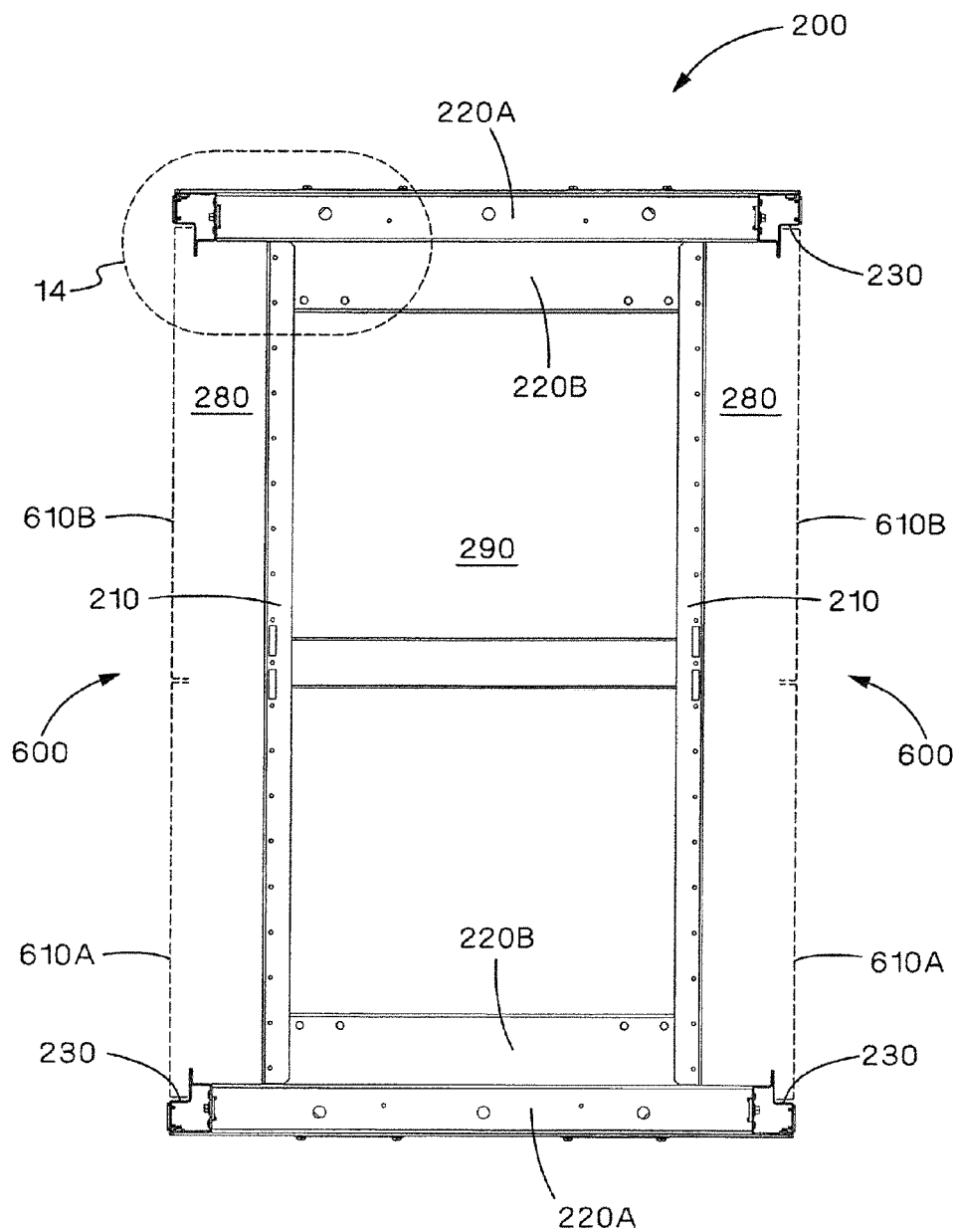
FIG. 13 is a top view of a cabinet frame having a width (e.g., 700 mm) greater than the width (e.g., 600 mm) of the cabinet frame of FIG. 11.
Figure 14:
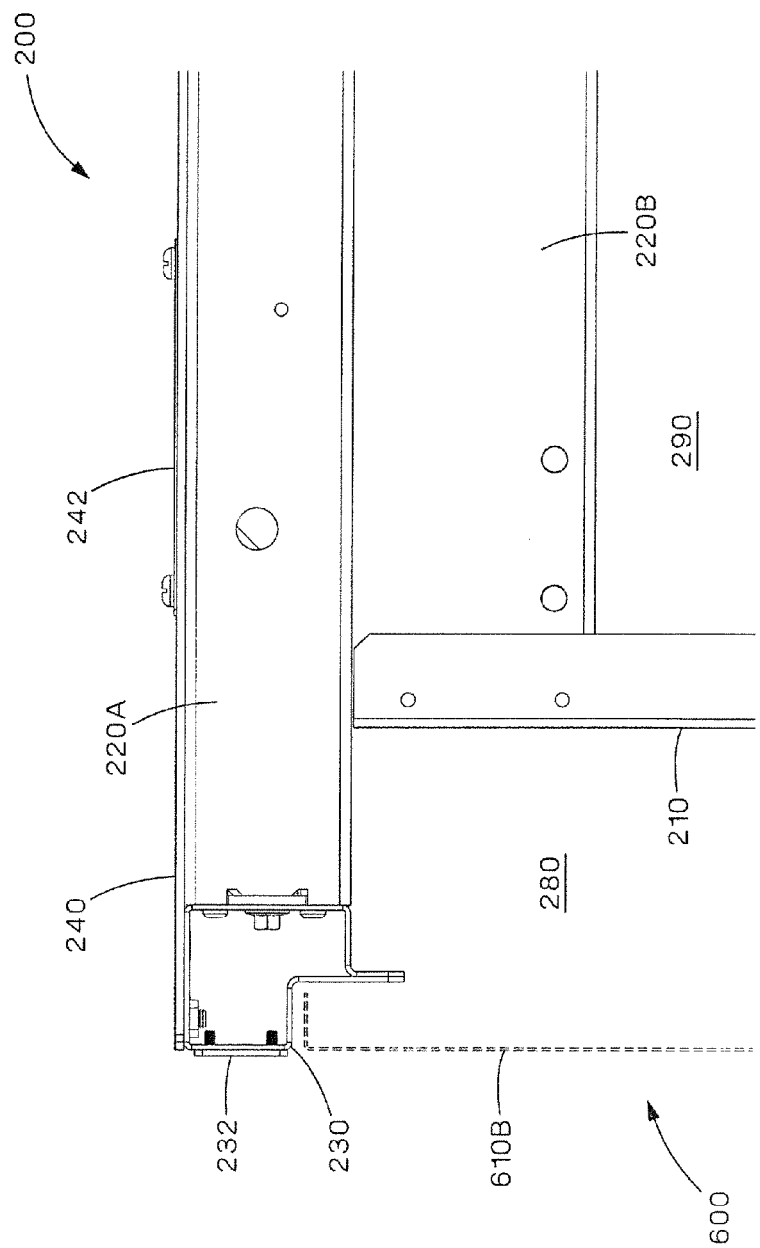
FIG. 14 is an enlarged top view of detail 14 of FIG. 13.
Figure 15:
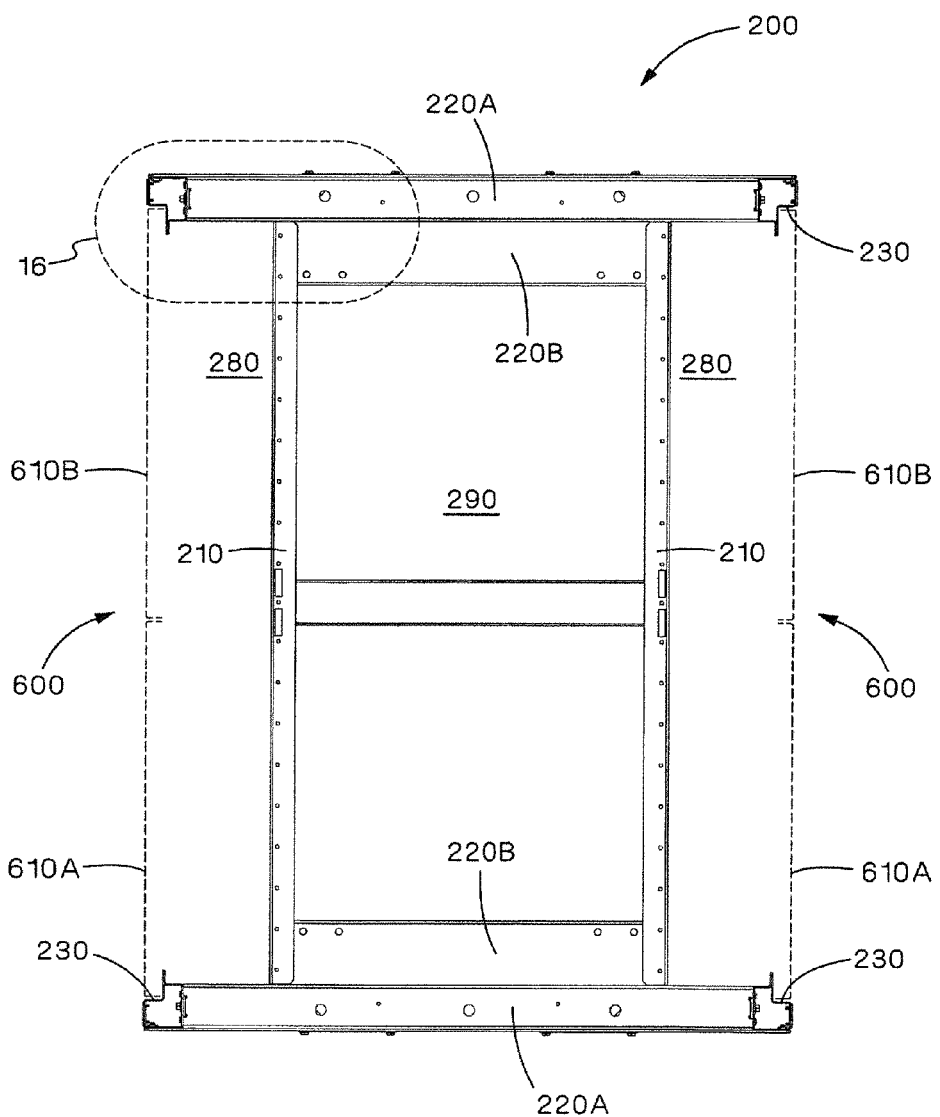
FIG. 15 is a top view of a cabinet frame having a width (e.g., 800 mm) greater than the width (e.g., 700 mm) of the cabinet frame of FIG. 13.
Figure 16:
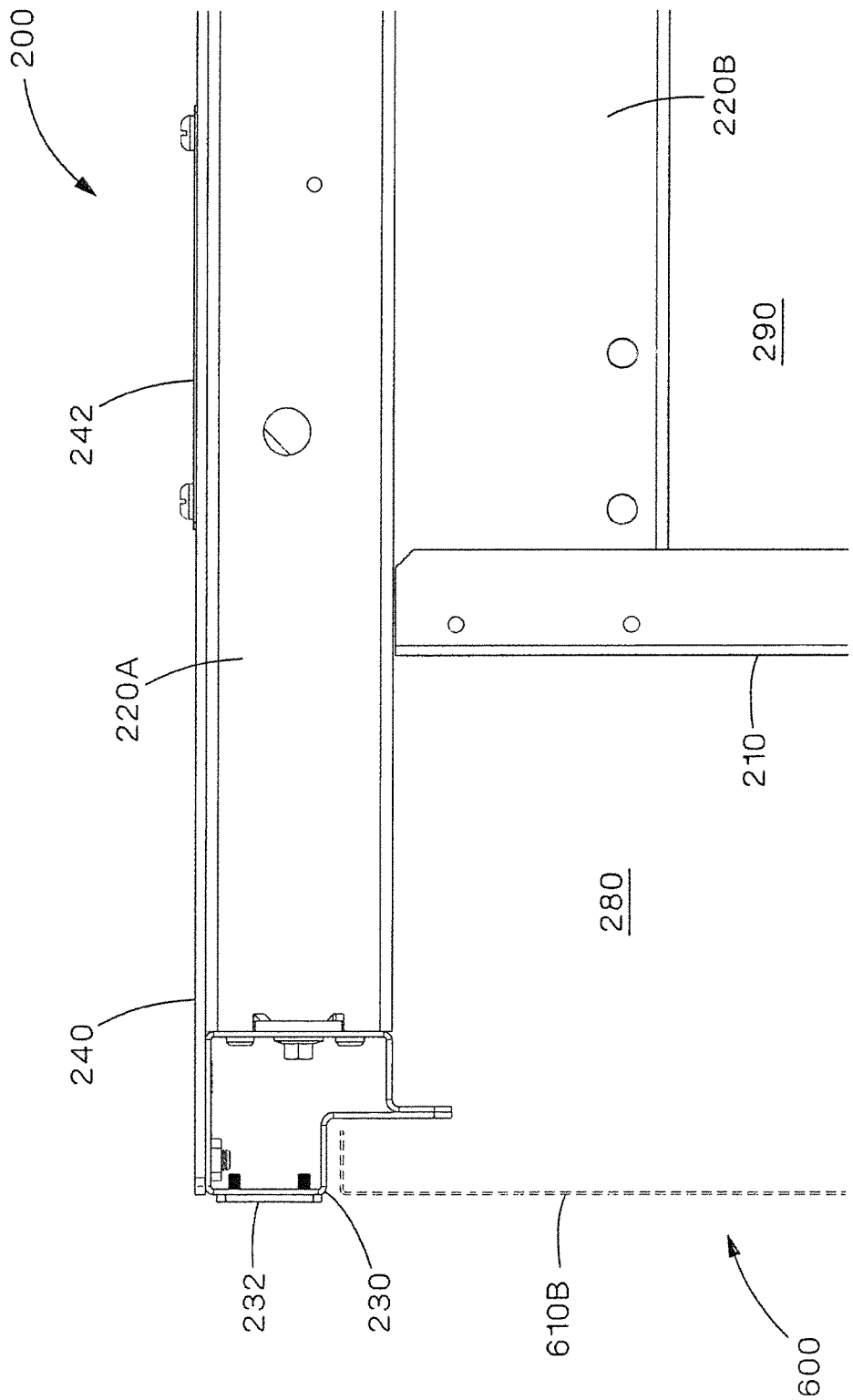
FIG. 16 is an enlarged top view of detail 16 of FIG. 15.
Figure 17:
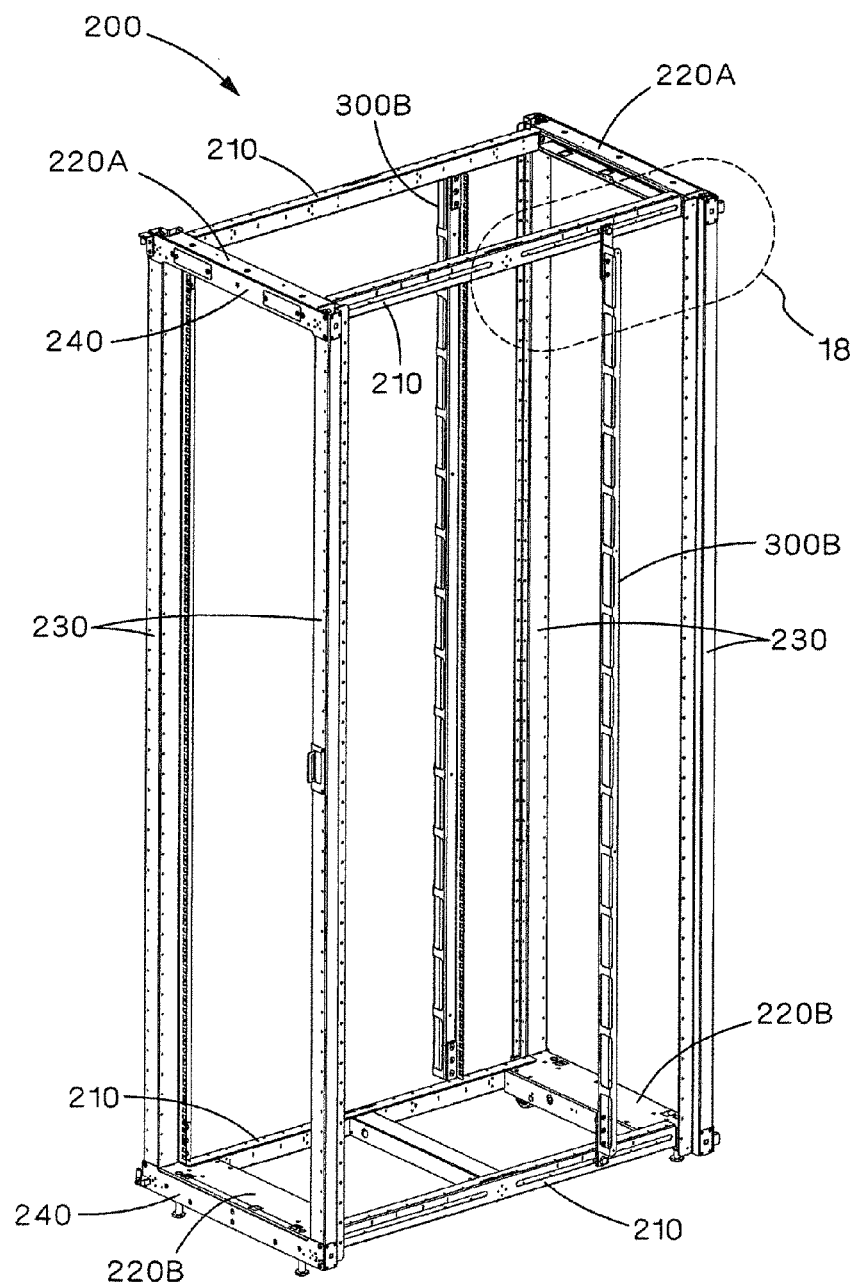
FIG. 17 is a top front perspective view of the cabinet frame of FIG. 4, showing the equipment rails installed.
Figure 18:
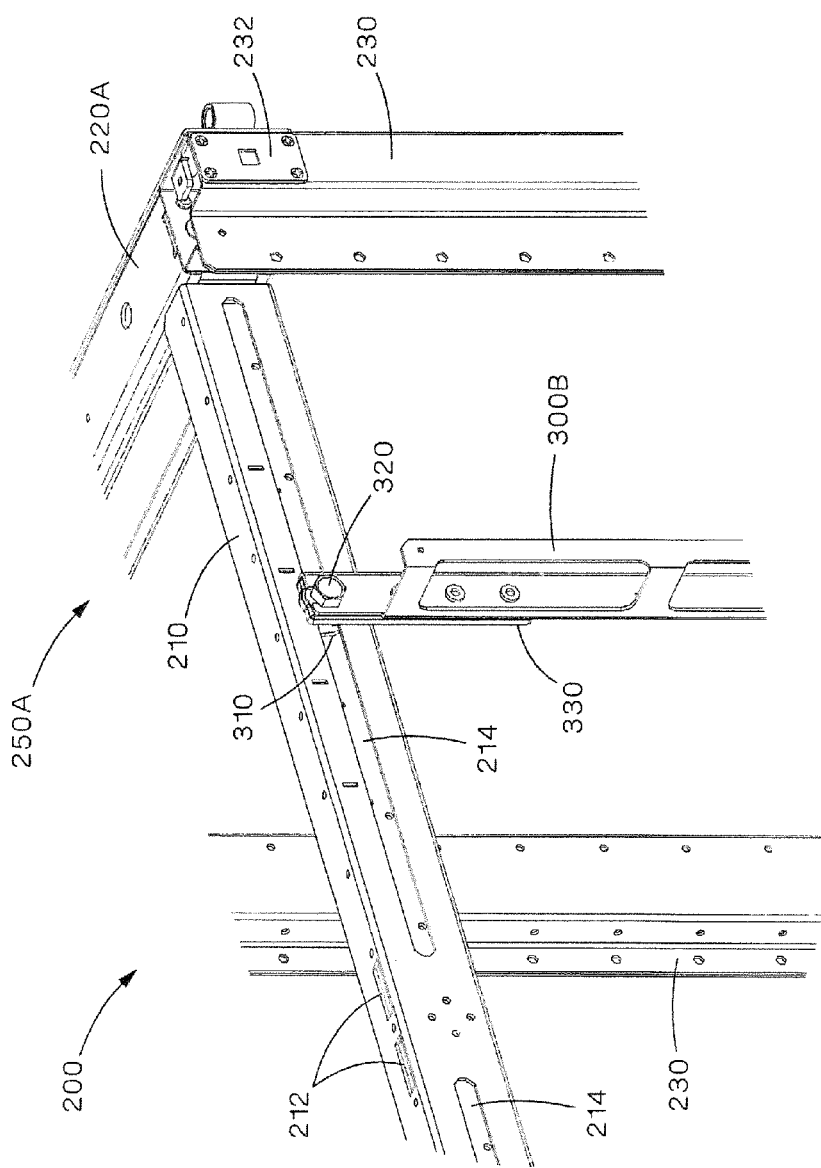
FIG. 18 is an enlarged top front perspective view of detail 18 of FIG. 17.

As shown in FIGS. 11 and 12, front-to-back beams 210 are inset relative to vertical posts 230, and more particularly, intersection of side-to-side beams 220A, 220B and vertical posts 230, forming cable-routing area 280 along the side of cabinet frame 200, for example, between equipment-mounting area 290, as defined by equipment rails 300A, 300B, and side door panels 610A, 610B of side door 600.

As the width of server cabinet 100 is increased, for example, from 600 mm (FIGS. 11 and 12) to 700 mm (FIGS. 13 and 14) and 800 mm (FIGS. 15 and 16), the width of cable-routing area 280 is increased, while the width of equipment-mounting area 290 remains the same.

As shown in FIGS. 17-19 and 28-31, equipment rails 300A, 300B are connected to cabinet frame 200, and more particularly, front-to-back beams 210 of top and bottom frames 250A, 250B. Preferably, equipment rails 300A, 300B are adjustable. That is, equipment rails 300A, 300B are removably connected to cabinet frame 200, and more particularly, front-to-back beams 210 of top and bottom frames 250A, 250B, for example, using removable connectors, such as nuts and bolts and screws.

Figure 19:
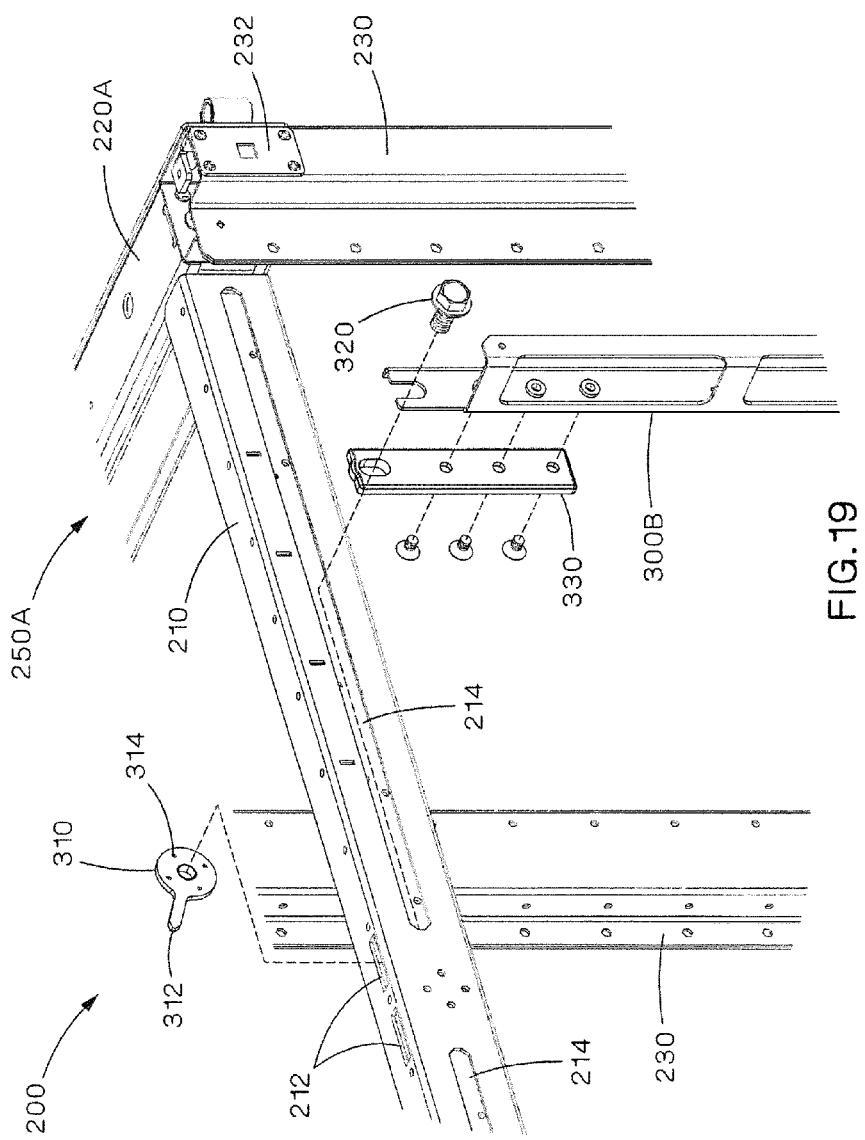
FIG. 19 is an exploded top front perspective view of FIG. 19.
Figure 31:
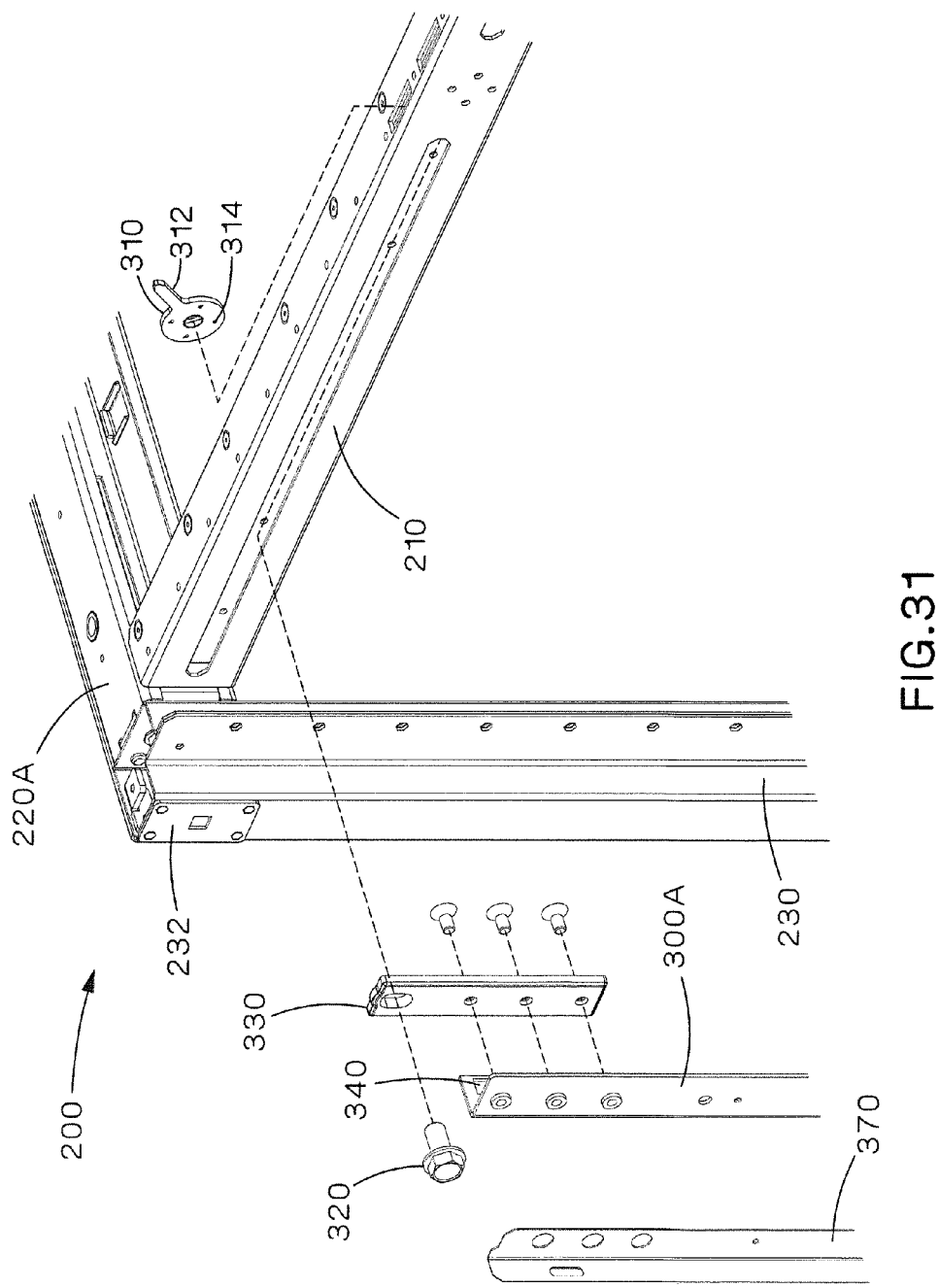
FIG. 31 is a partially exploded top back perspective view of FIG. 30.

For example, as shown in FIGS. 19 and 31, equipment rails 300A, 300B include channel nuts 310 and mounting bolts 320. Channel nuts 310 includes tabs 312 for positioning channel nuts 310 through top openings 212 in front-to-back beams 210 and aligning channel nuts 310 with side openings 214 in front-to-back beam 210. Additionally, channel nuts 310 include barbs 314 for securing channel nuts 310 to front-to-back beams 210 and grounding equipment rails 300 to cabinet frame 200.

Figure 20:
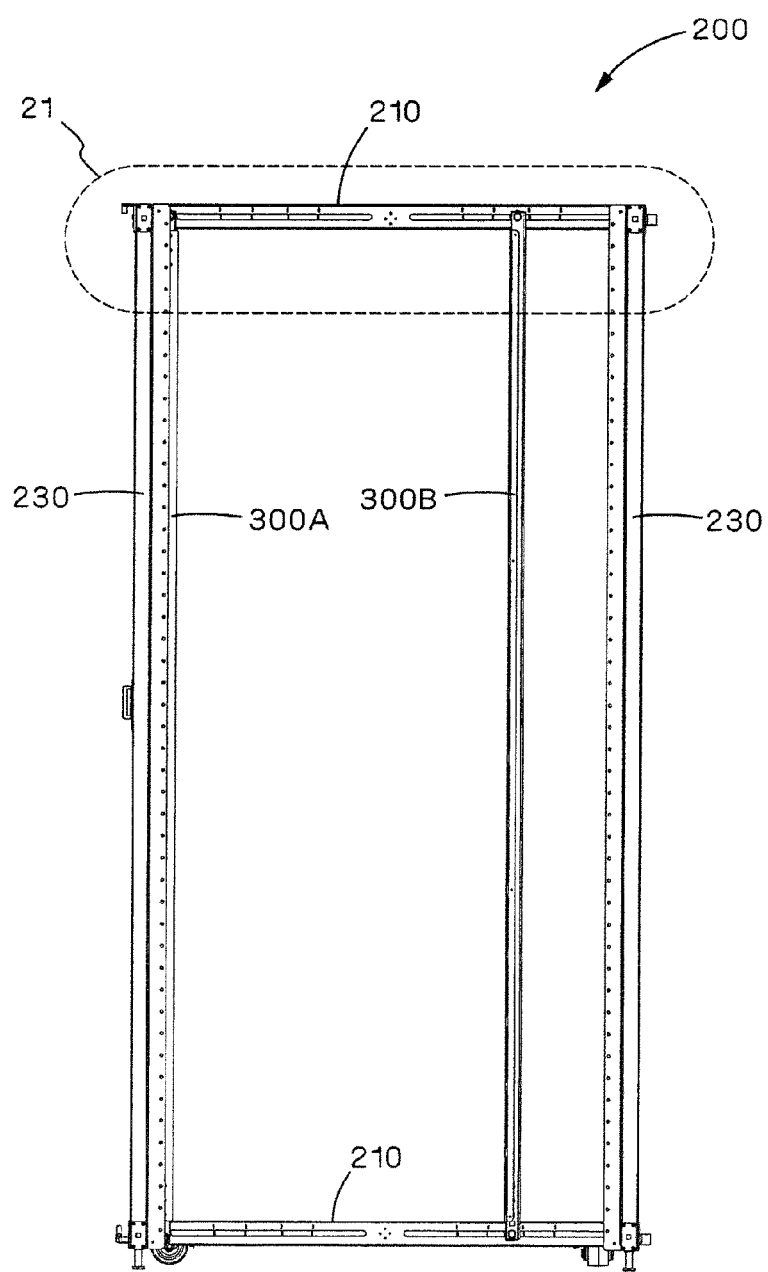
FIG. 20 is a side view of the cabinet frame of FIG. 17.
Figure 21:
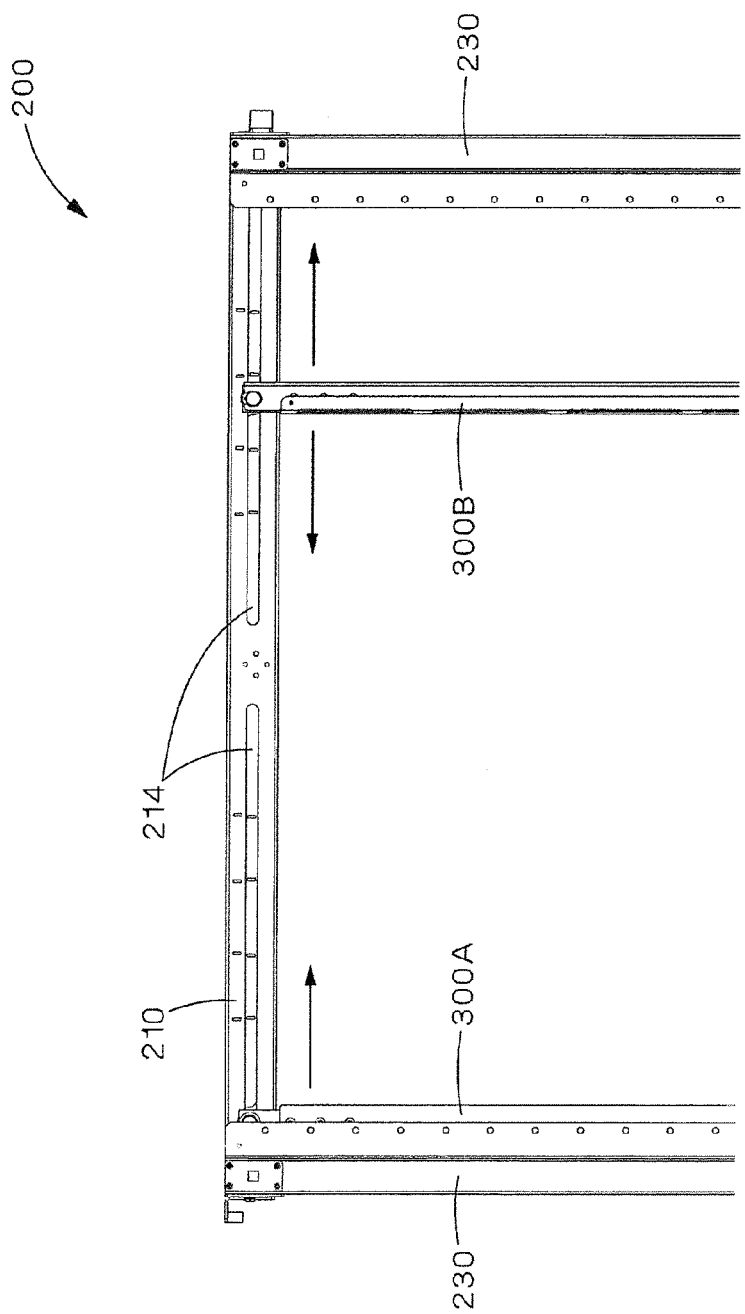
FIG. 21 is a side view of detail 21 of FIG. 20.

As shown in FIGS. 20 and 21, when channel nuts 310 and mounting bolts 320 are engaged and tight, equipment rails 300A, 300B are secured to front-to-back beams 210. However, when channel nuts 310 and mounting bolts 320 are engaged, but loose, equipment rails 300A, 300B slide along elongated openings 214 in front-to-back beams 210, allowing equipment rails 300A, 300B to be positioned at any number of locations along elongated openings 214 in front-to-back beams 210.

Depending on the location of equipment rails 300A, 300B, additional cable routing areas 280 might be provided, for example, in the front of server cabinet 100 and in the back of server cabinet 100.

Additionally, as shown in FIGS. 19 and 31, equipment rails 300A, 300B include stiffeners 330, which are removably connected to equipment rails 300A, 300B, for example, using removable connectors, such as nuts and bolts and screws, but it is likewise contemplated that stiffeners 330 are permanently connected to equipment rails 300A, 300B, for example, using permanent connectors, such as rivets and welds. Alternatively, equipment rails 300A, 300B and stiffeners 330 are integrally formed.

As shown in FIGS. 22-27, equipment rails 300B include mounting openings 340 for mounting electronic equipment, such as servers, patch panels, and switches, in server cabinet 100, and are configured to receive accessory mounting brackets, such as patch panel cassette mounting brackets 350 and cable management finger mounting brackets 360, for mounting accessories, such as patch panel cassettes 352 and cable management fingers 362 in server cabinet 100, and more particularly, cable routing area 280 of server cabinet 100.

Figure 22:
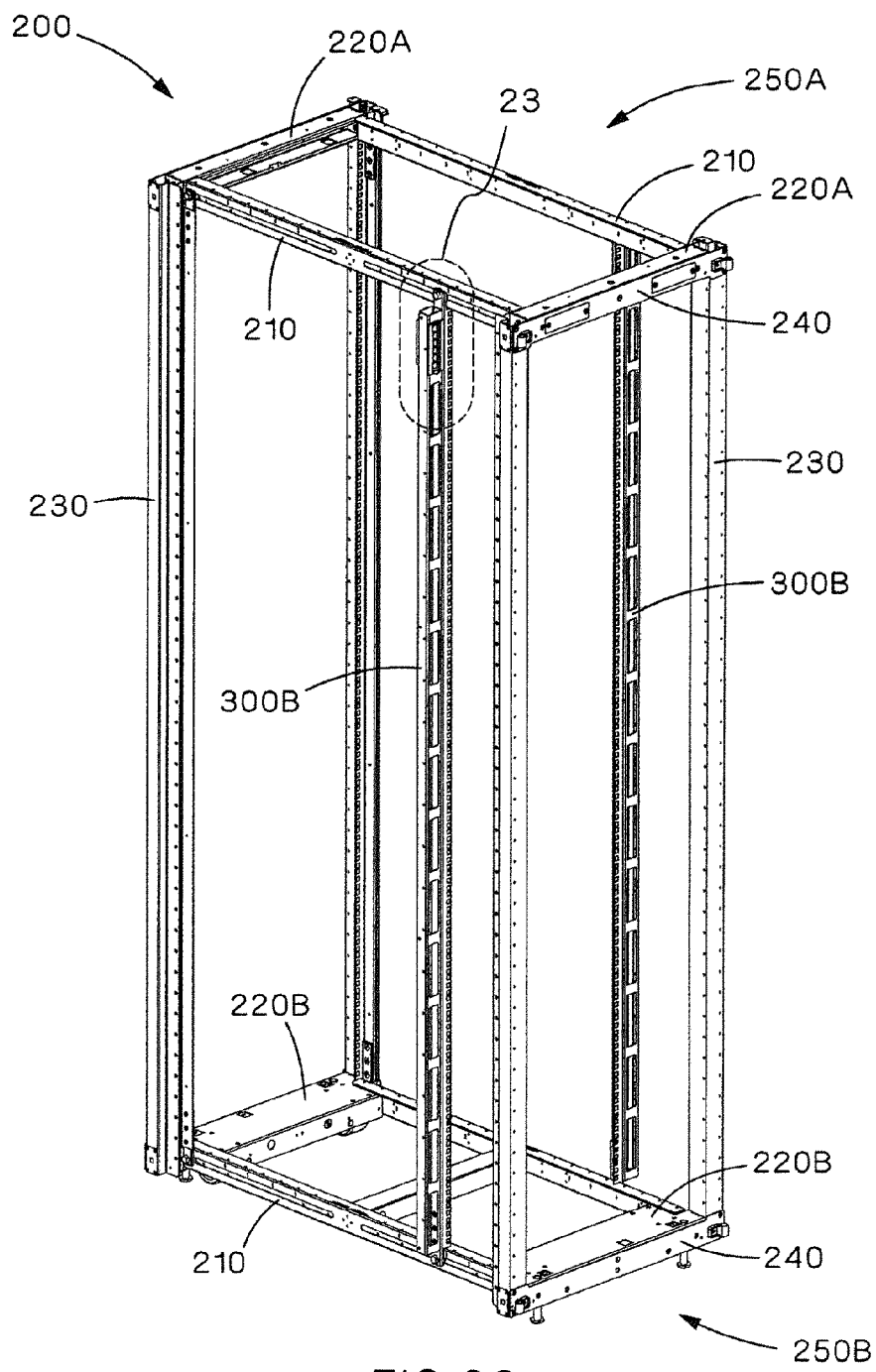
FIG. 22 is top back perspective view of the cabinet frame of FIG. 17, showing patch panel cassettes installed on the equipment rails.
Figure 23:
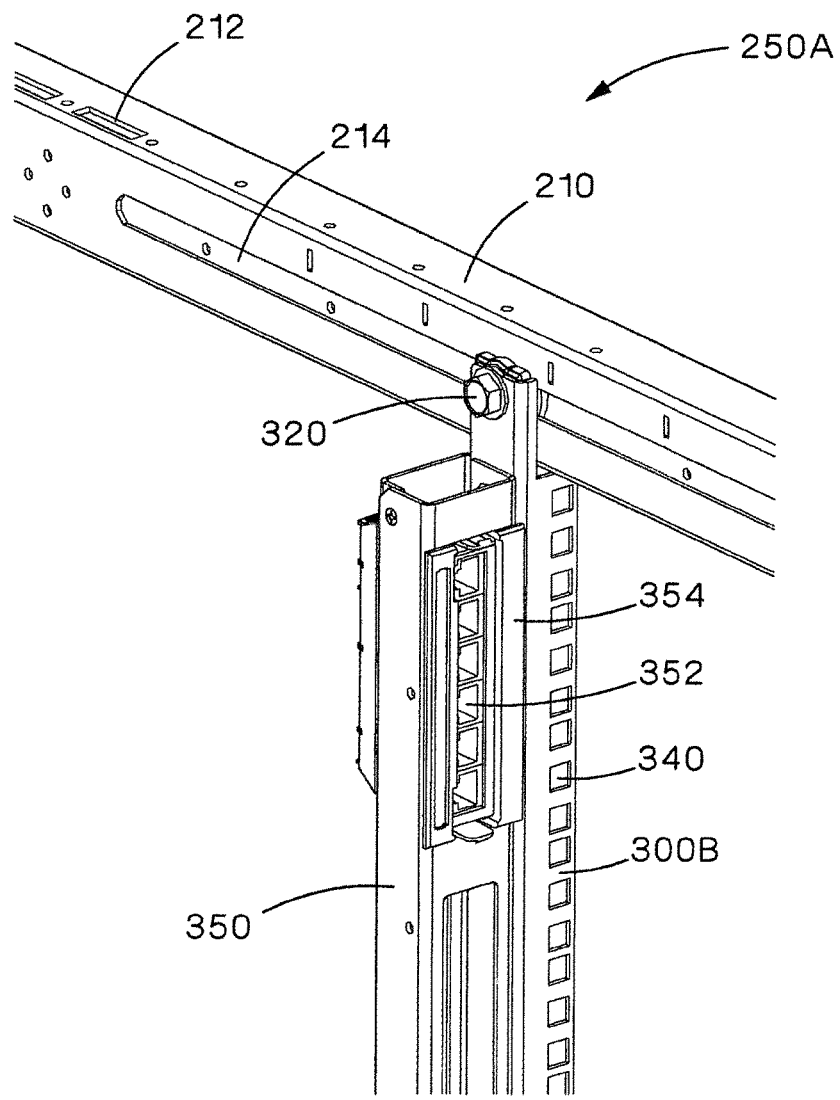
FIG. 23 is an enlarged top back perspective view of detail 23 of FIG. 22.
Figure 24:
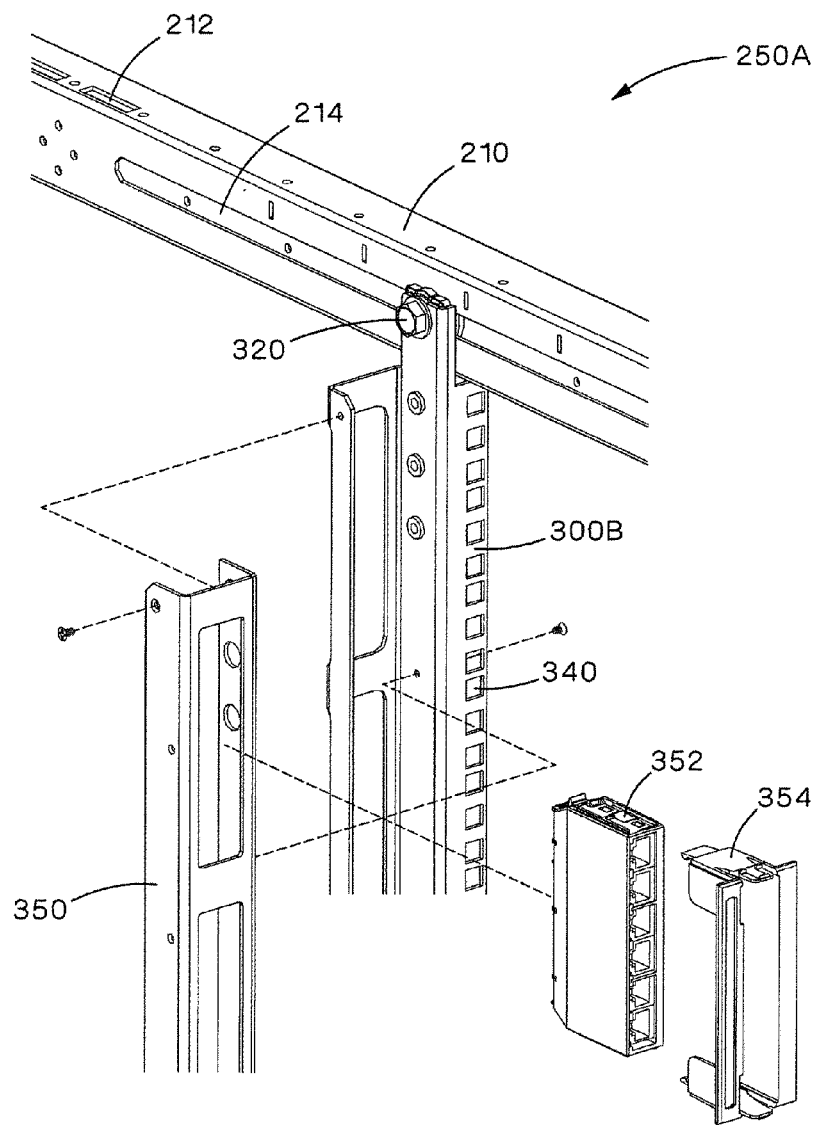
FIG. 24 is a partially exploded top back perspective view of FIG. 23.

For example, as shown in FIGS. 22-24, equipment rails 300B include patch panel cassette mounting brackets 350 for mounting patch panel cassettes 352 to equipment rails 300B. As shown in FIG. 24, patch panel cassette mounting brackets 350 are removably connected to equipment rails 300B, for example, using removable connectors, such as nuts and bolts and screws, but it is likewise contemplated that patch panel cassette mounting brackets 350 are permanently connected to equipment rails 300B, for example, using permanent connectors, such as rivets and welds. Alternatively, equipment rails 300B and patch panel cassette mounting brackets 350 are integrally formed. Patch panel cassettes 352 snap-fit into patch panel cassette housings 354, which in turn, snap-fit into patch panel cassette mounting brackets 350. As such, patch panel cassette housings 354 are quickly and easily removed from patch panel cassette mounting brackets 350, providing greater access to patch panel cassettes 350.

Figure 25:
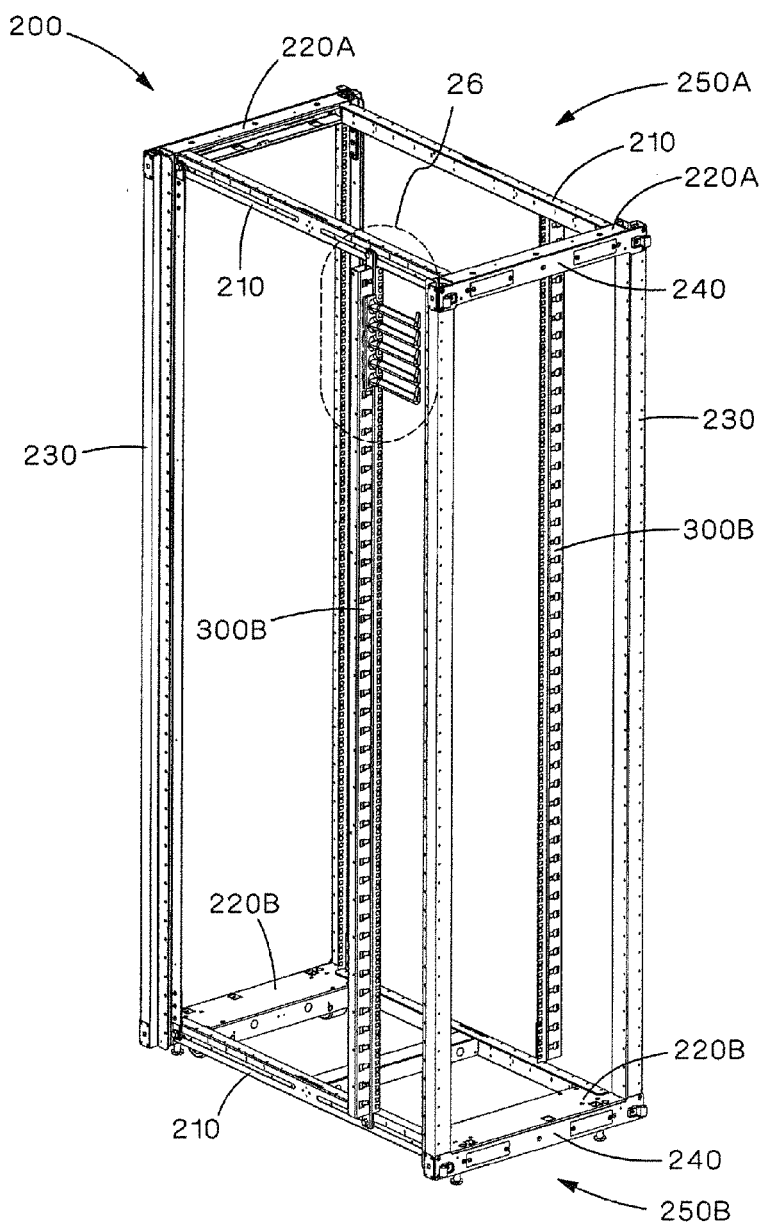
FIG. 25 is a top back perspective view of the cabinet frame of FIG. 17, showing cable management fingers installed on the equipment rails.
Figure 26:
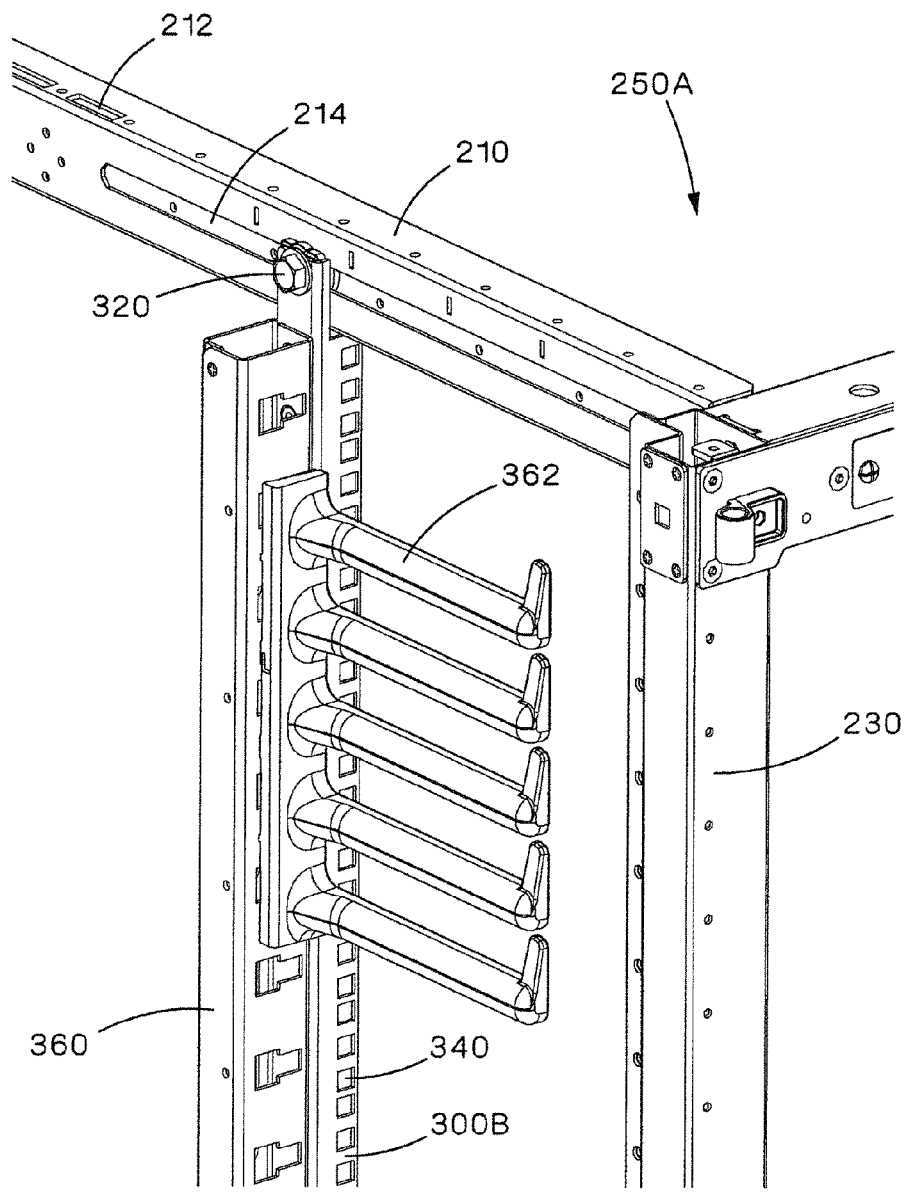
FIG. 26 is an enlarged top back perspective view of detail 26 of FIG. 25.
Figure 27:
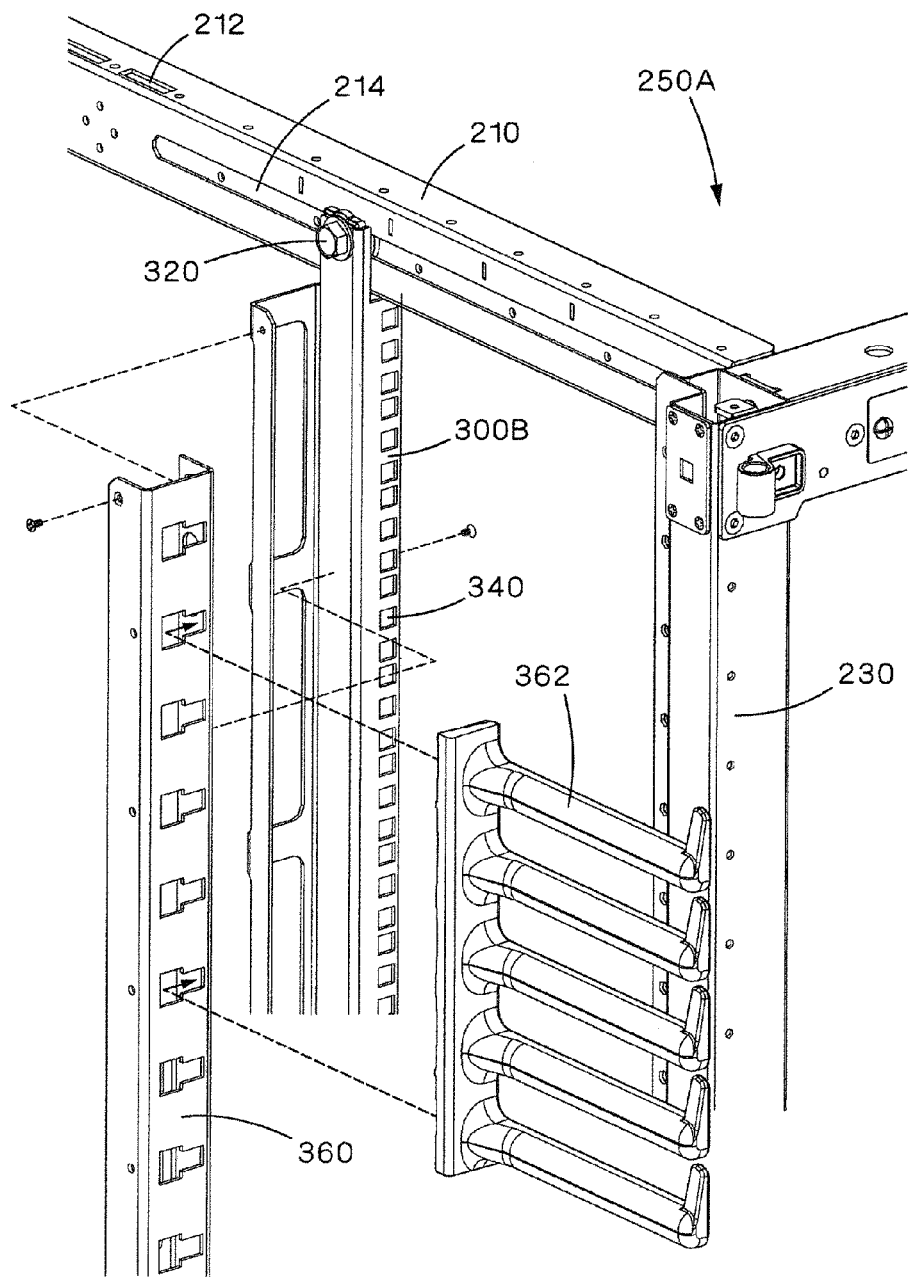
FIG. 27 is a partially exploded top back perspective view of FIG. 26.
Figure 28:
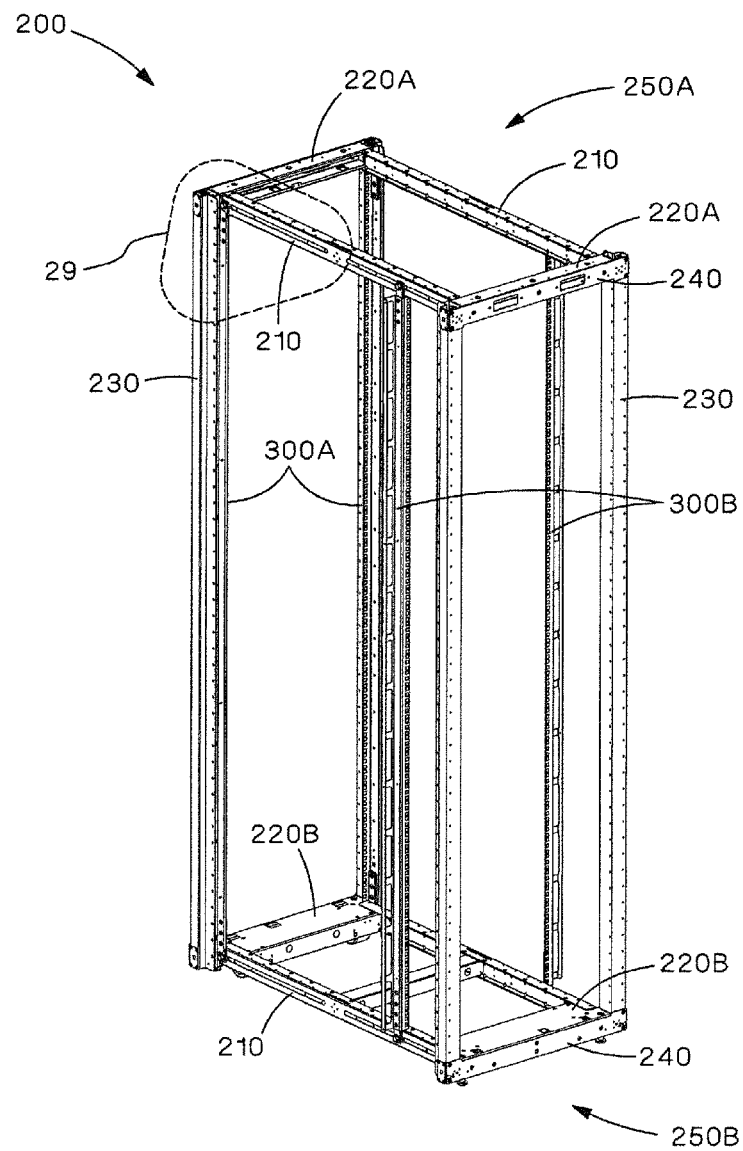
FIG. 28 is a top back perspective view of the cabinet frame of FIG. 17, showing vertical blanking panels installed on the equipment rails.
Figure 29:
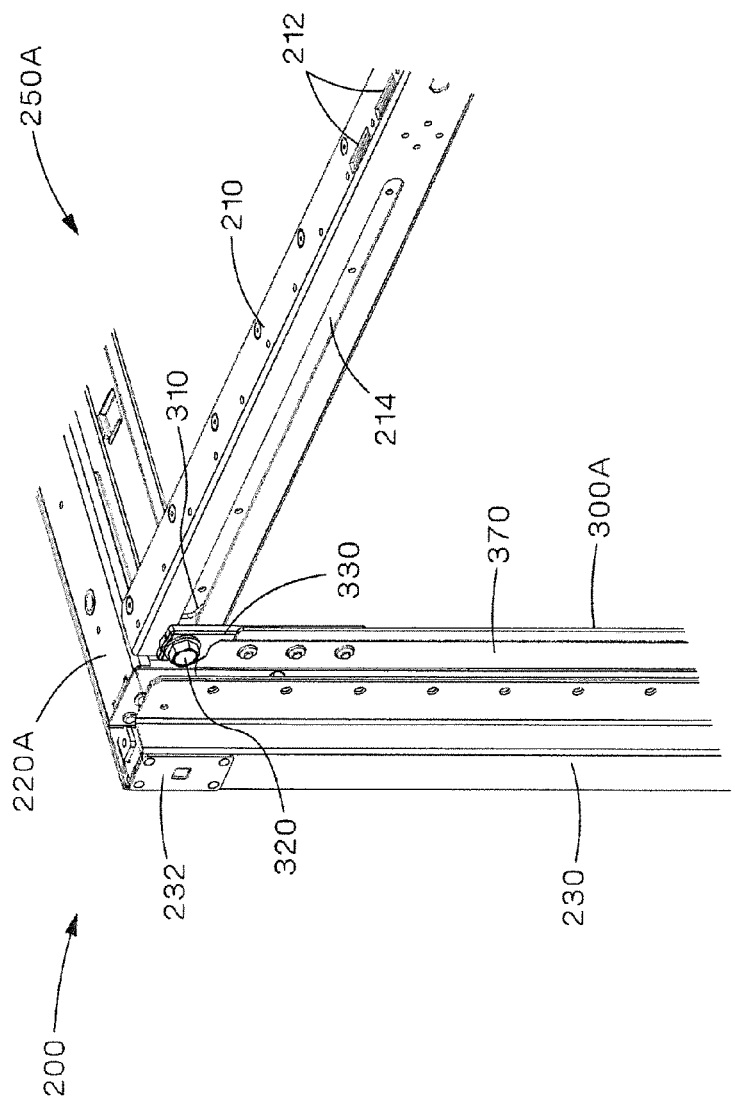
FIG. 29 is an enlarged top back perspective view of detail 29 of FIG. 28.

Alternatively, as shown in FIGS. 25-27, equipment rails 300B include cable management finger mounting brackets 360 for mounting cable management fingers 362 to equipment rails 300B. As shown in FIG. 27, cable management finger mounting brackets 360 are removably connected to equipment rails 300B, for example, using removable connectors, such as nuts and bolts and screws, but it is likewise contemplated that cable management finger mounting brackets 350 are permanently connected to equipment rails 300B, for example, using permanent connectors, such as rivets and welds. Alternatively, equipment rails 300B and cable management finger mounting brackets 360 are integrally formed. Cable management fingers 362 snap-fit into cable management finger mounting brackets 360.

As shown in FIGS. 28-31, equipment rails 300A include mounting openings 340 for mounting electronic equipment, such as servers, patch panels, and switches, in server cabinet 100, and are configured to receive blanking panels, such as horizontal blanking panels (not shown), which are typically mounted to equipment rails 300A using mounting openings 340, and vertical blanking panels 370, for sealing open areas of server cabinet 100 to separate cooled intake air and heated exhaust air.

Figure 30:
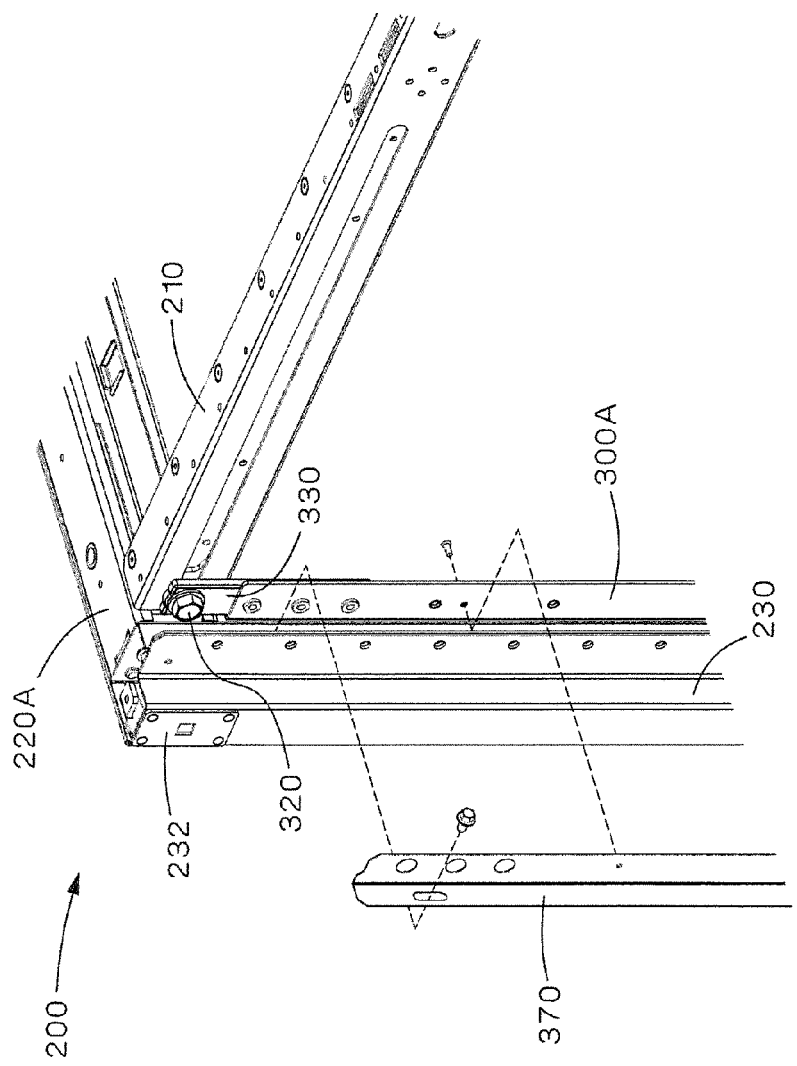
FIG. 30 is a partially exploded top back perspective view of FIG. 29.

For example, as shown in FIGS. 28-31, equipment rails 300A include vertical blanking panels 370. As shown in FIG. 30, vertical blanking panels 370 are removably connected to equipment rails 300A, for example, using removable connectors, such as nuts and bolts and screws, but it is likewise contemplated that vertical blanking panels 370 are permanently connected to equipment rails 300A, for example, using permanent connectors, such as rivets and welds. Alternatively, equipment rails 300A and vertical blanking panels 370 are integrally formed. Additionally, vertical blanking panels 370 are removably connected to vertical posts 230, providing additional stiffness to cabinet frame 200, and more particularly, vertical posts 230.

Figure 32:
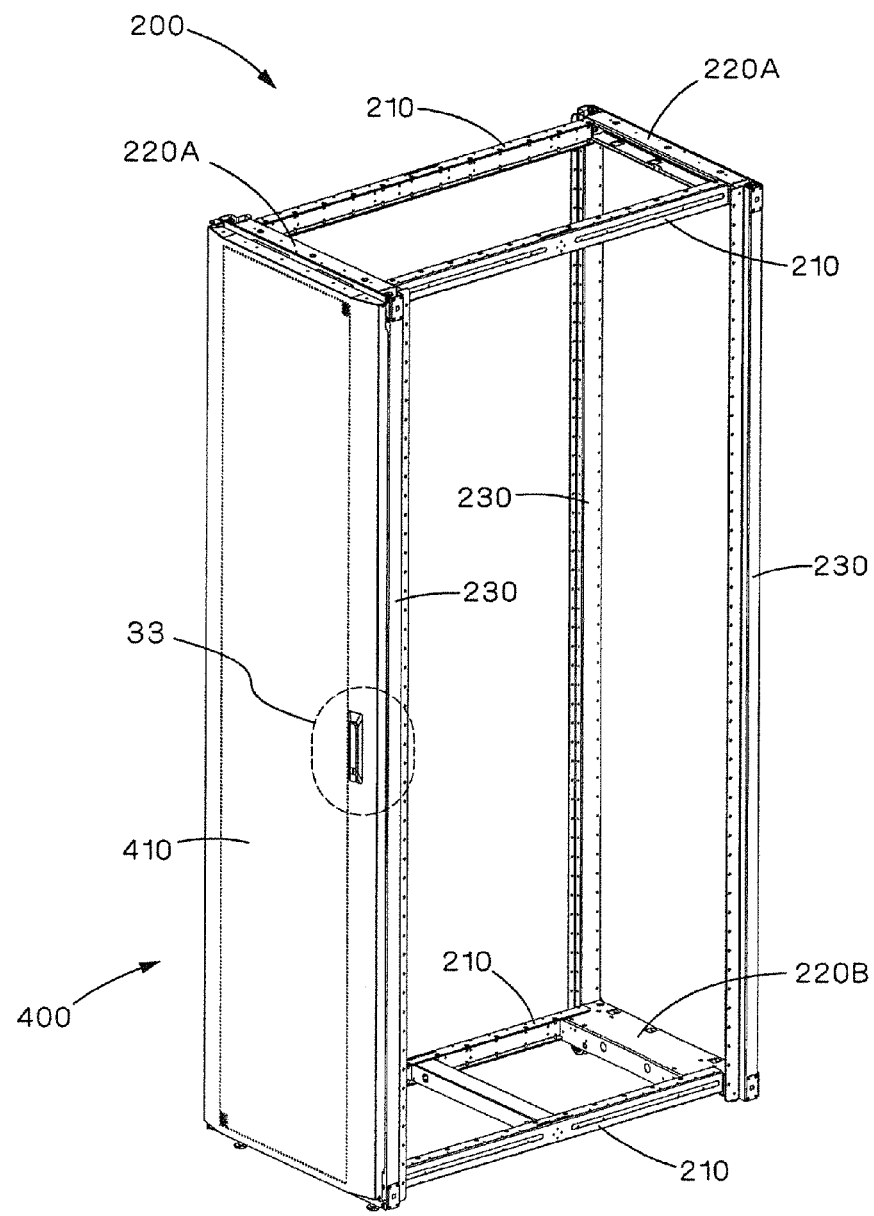
FIG. 32 is a top front perspective view of the cabinet frame of FIG. 4, showing the front door installed and in a closed position.
Figure 33:
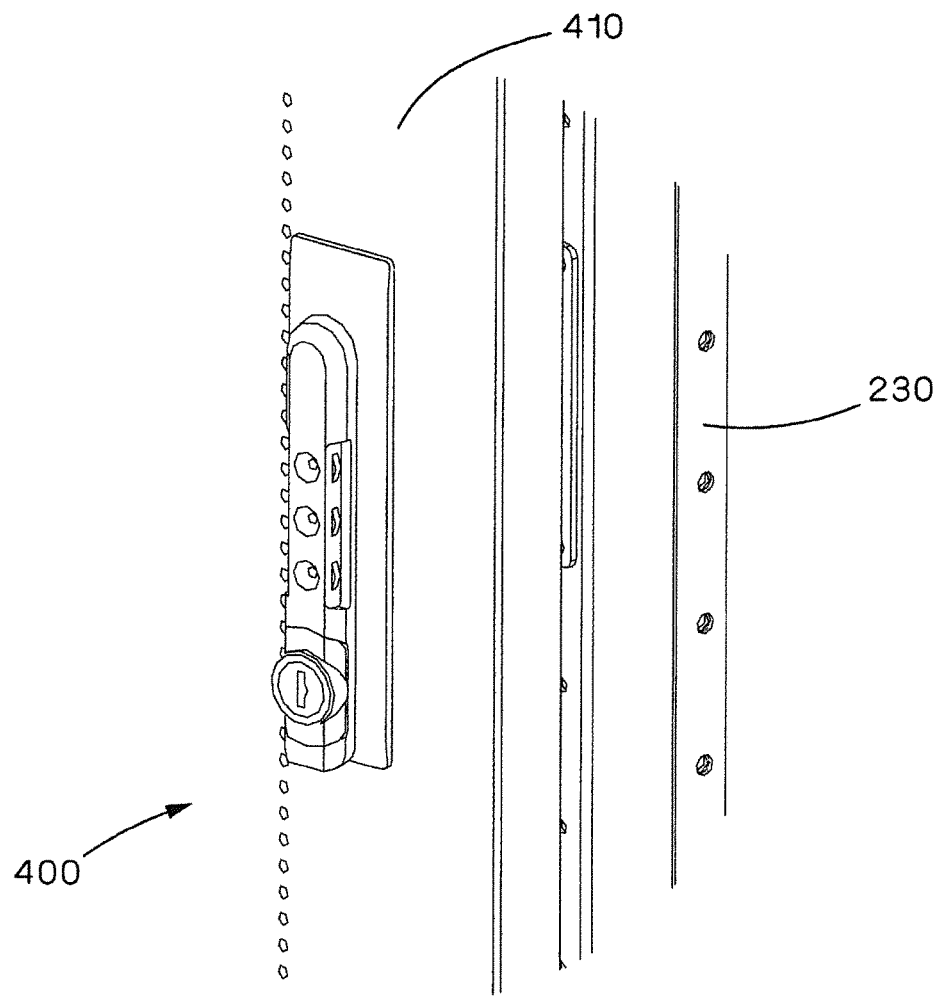
FIG. 33 is an enlarged top front perspective view of detail 33 of FIG. 32.
Figure 34:
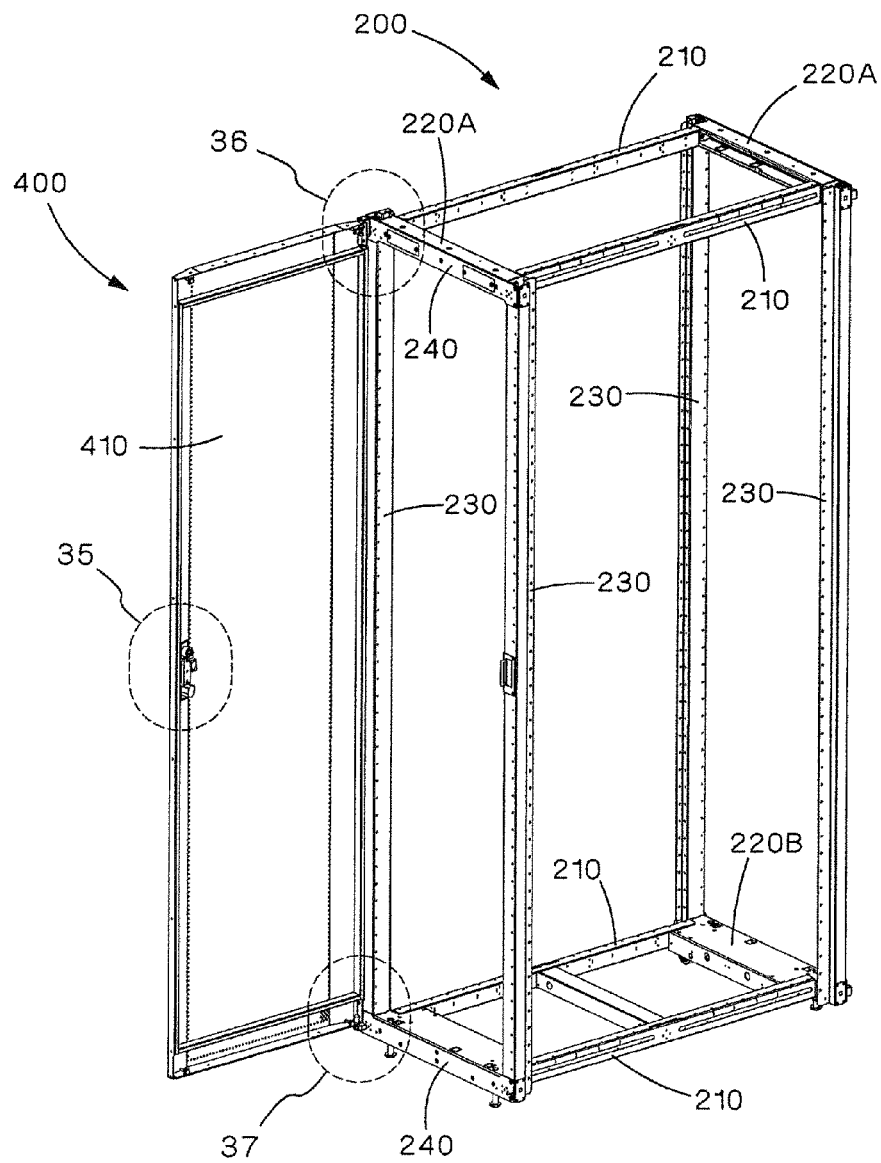
FIG. 34 is a top front perspective view of the cabinet frame of FIG. 32, showing the front door in an open position.
Figure 35:
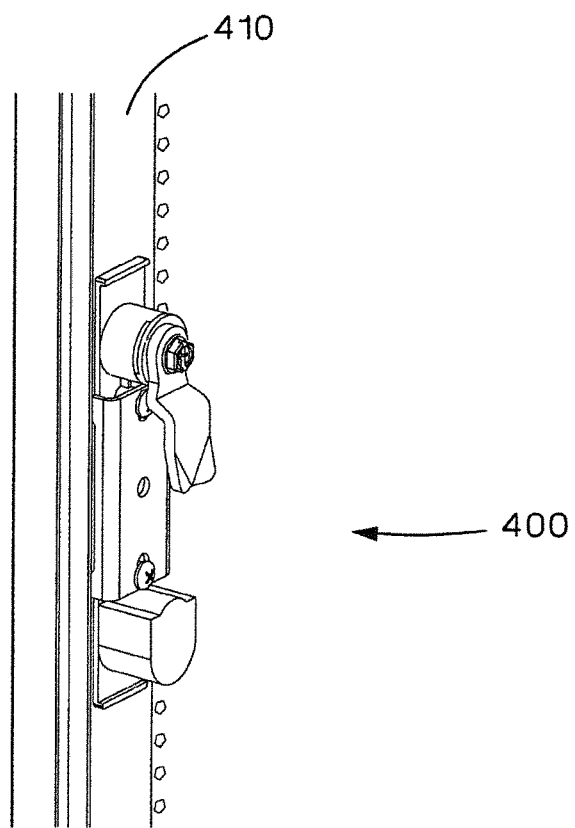
FIG. 35 is an enlarged top front perspective view of detail 35 of FIG. 34.
Figure 36:
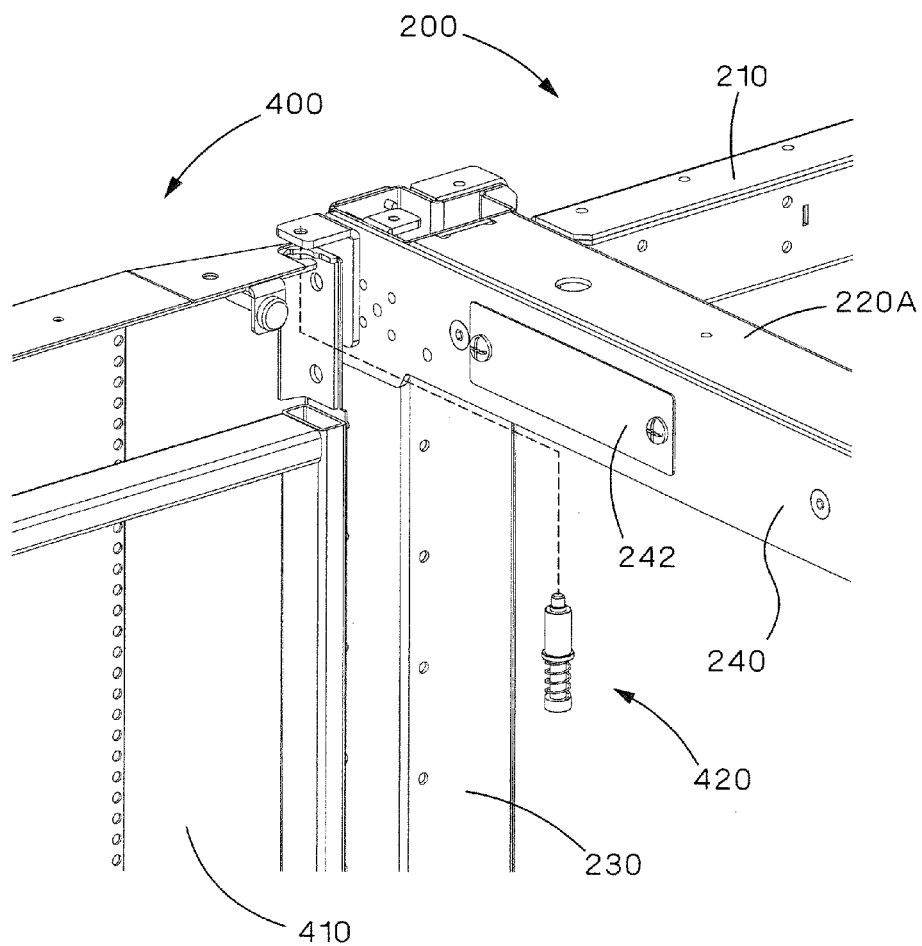
FIG. 36 is an enlarged top front perspective view of detail 36 of FIG. 34.
Figure 37:
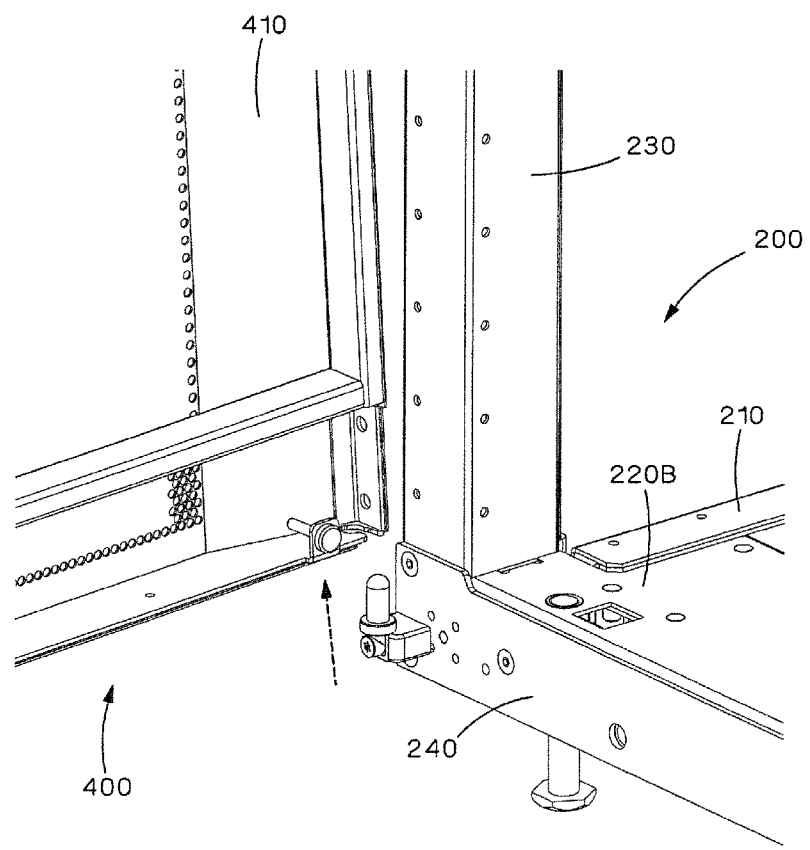
FIG. 37 is an enlarged top front perspective view of detail 37 of FIG. 34.

As shown in FIGS. 32 and 34, front door 400 includes front door panel 410, which is rotatably connected to cabinet frame 200, and more particularly, face plate 240, and ultimately, vertical post 230, and rotates from closed position (FIG. 32) to open position (FIG. 34). Additionally, as shown in FIGS. 36 and 37, front door panel 410 is removably connected to cabinet frame 200, and includes spring-loaded hinge pins 420 for quick and easy installation and removal thereof.

Figure 38:
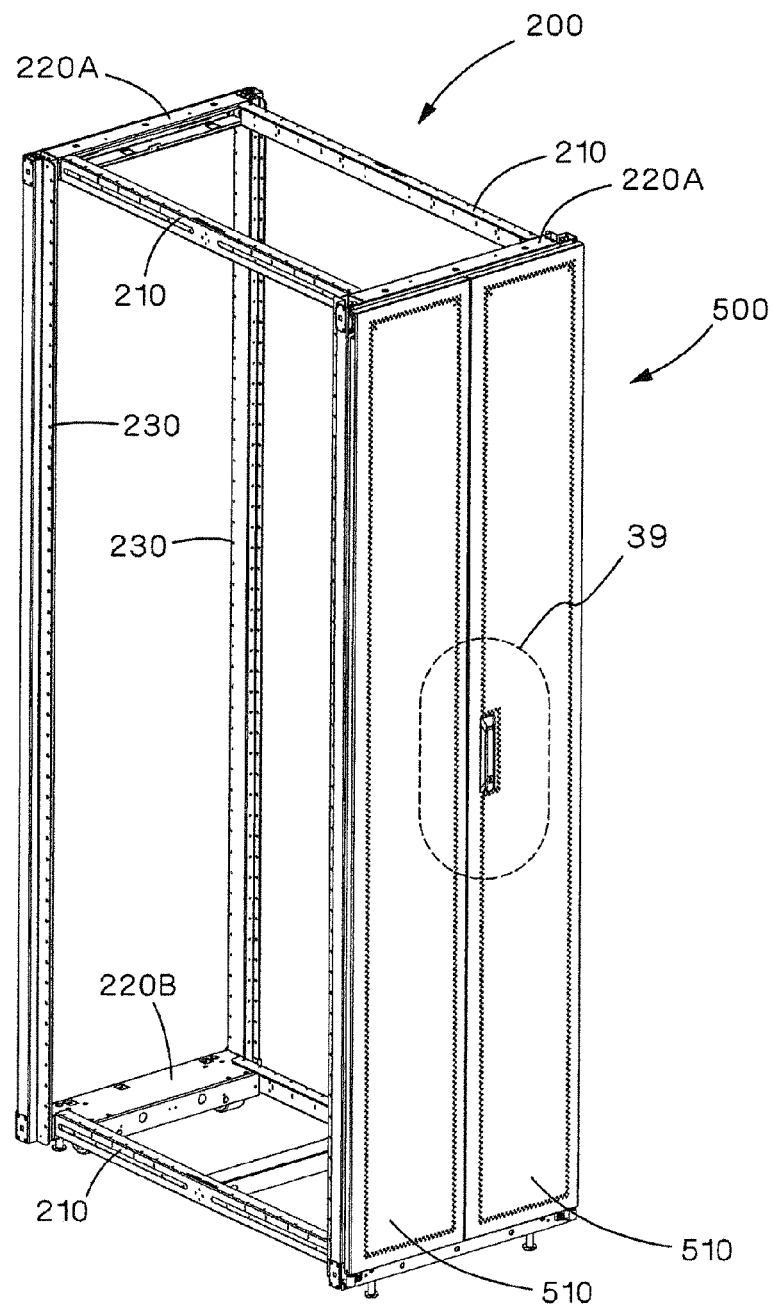
FIG. 38 is a top back perspective view of the cabinet frame of FIG. 4, showing the back door installed and in a closed position.
Figure 39:
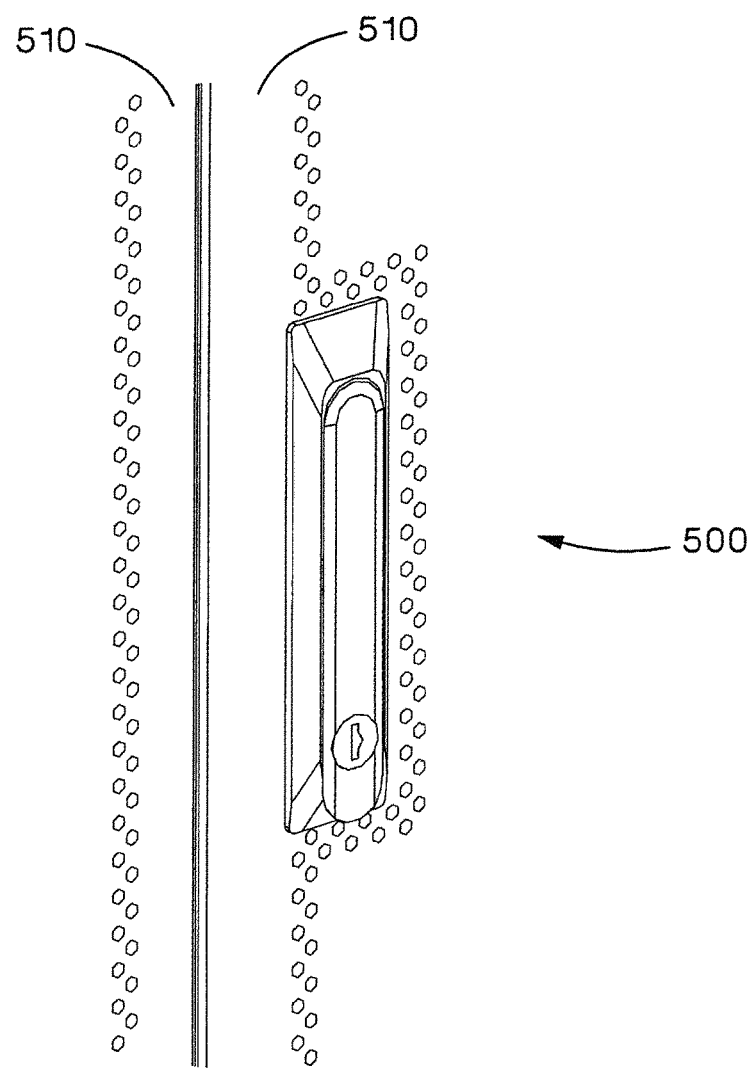
FIG. 39 is an enlarged top back perspective view of detail 39 of FIG. 38.
Figure 40:
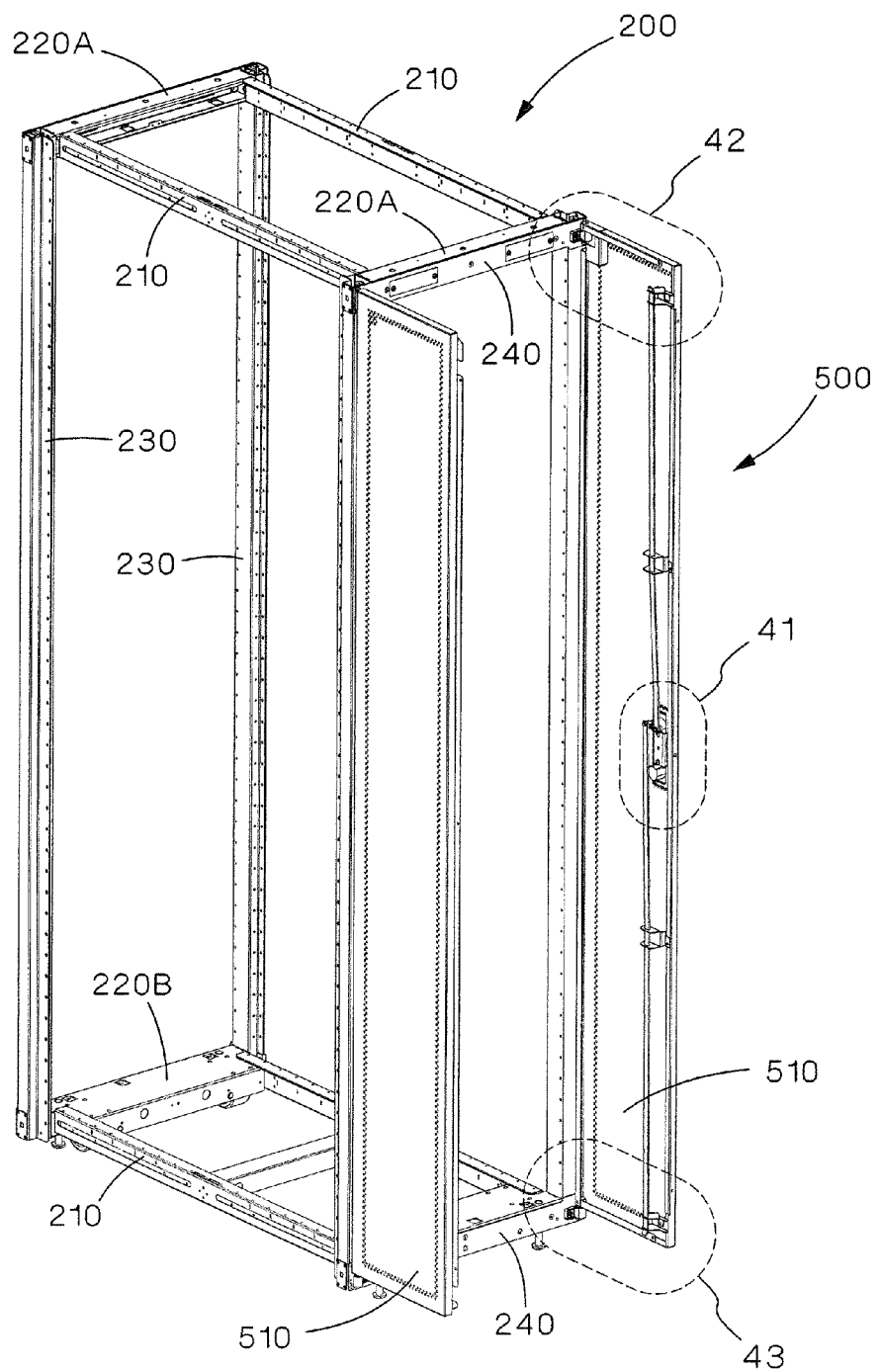
FIG. 40 is a top back perspective view of the cabinet frame of FIG. 38, showing the back door in an open position.
Figure 41:
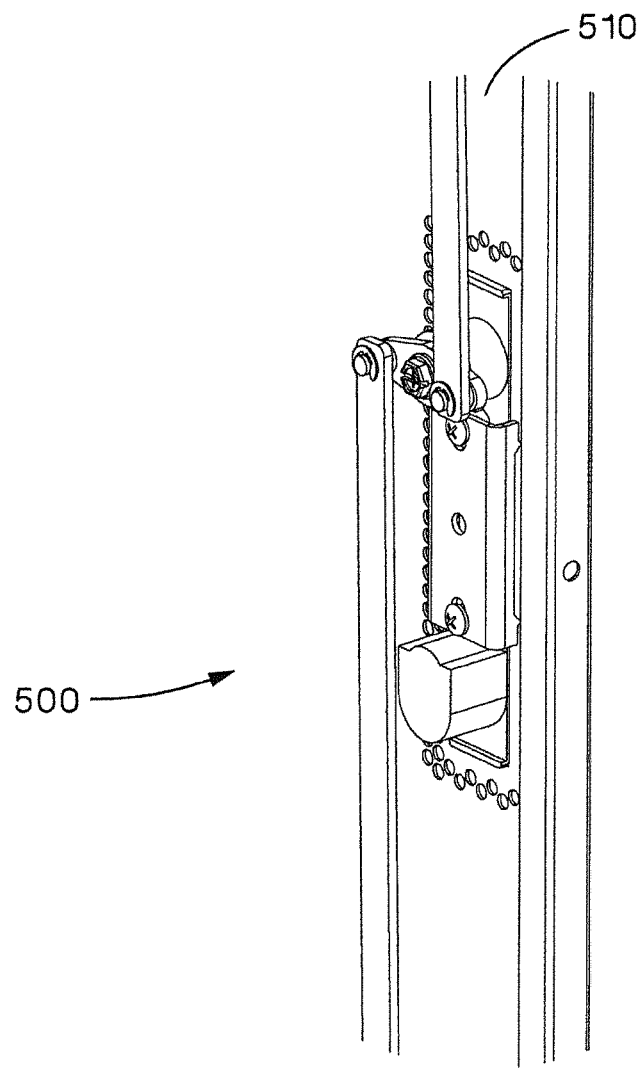
FIG. 41 is an enlarged top back perspective view of detail 41 of FIG. 40.
Figure 42:
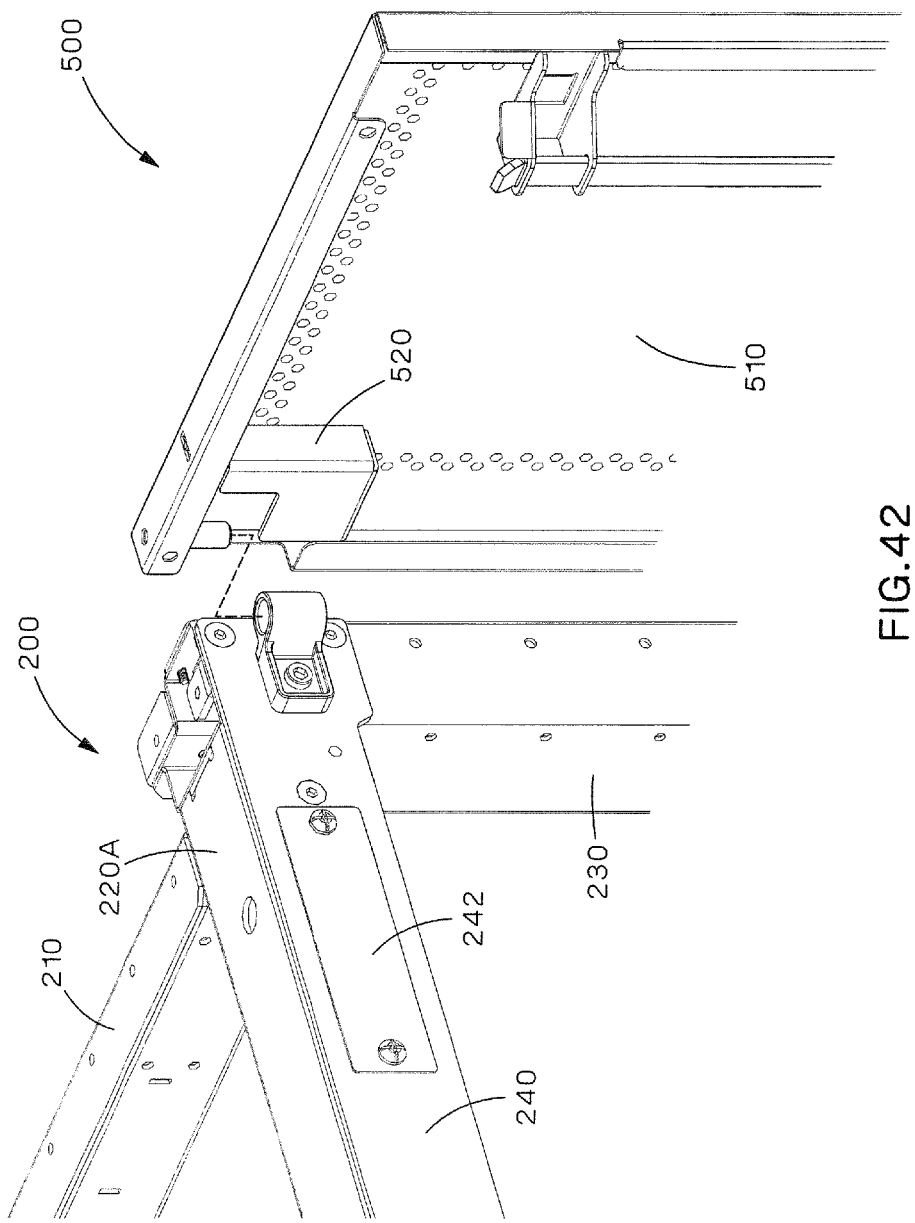
FIG. 42 is an enlarged top back perspective view of detail 42 of FIG. 40.
Figure 43:
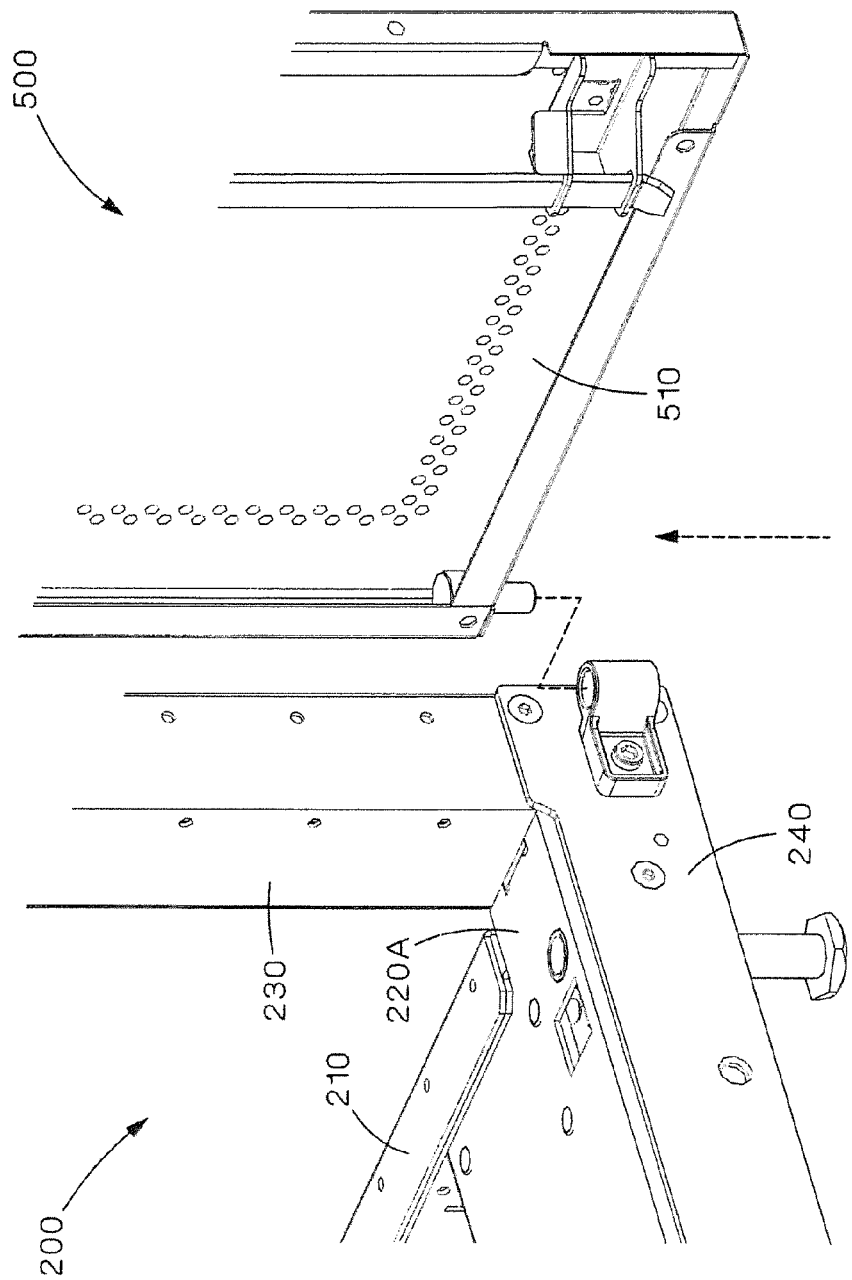
FIG. 43 is an enlarged top back perspective view of detail 43 of FIG. 40.

As shown in FIGS. 38 and 40, back door 500 includes back door panels 510, which are rotatably connected to cabinet frame 200, and more particularly, face plate 240, and ultimately, vertical post 230, and rotate from closed position (FIG. 38) to open position (FIG. 40). Additionally, as shown in FIGS. 42 and 43, back door panels 510 are removably connected to cabinet frame 200, and include flanges 520 to prevent removal of back door panels 510 when closed.

Figure 44:
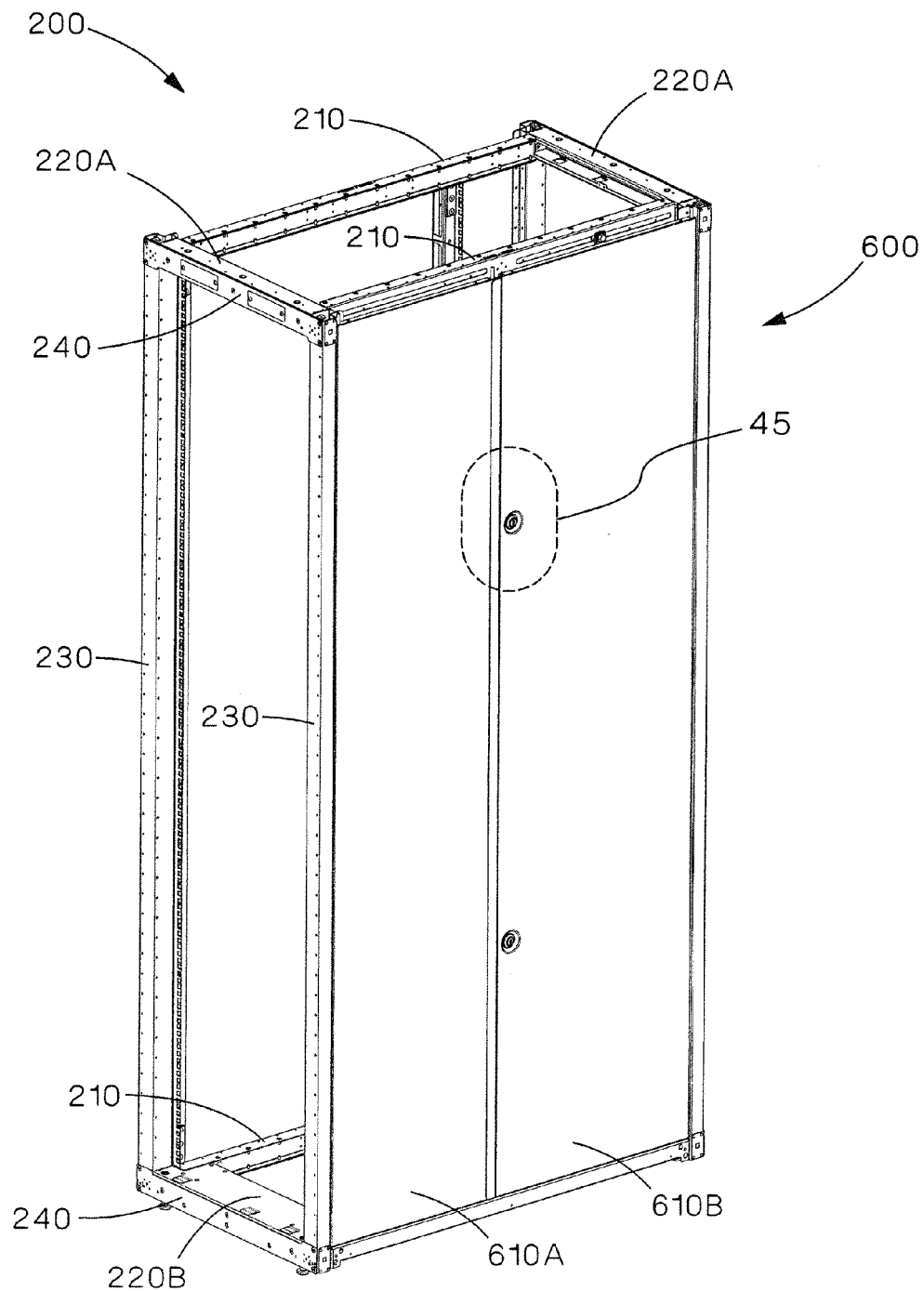
FIG. 44 is a top front perspective view of the cabinet frame of FIG. 4, showing the side door installed and in a closed position.
Figure 45:
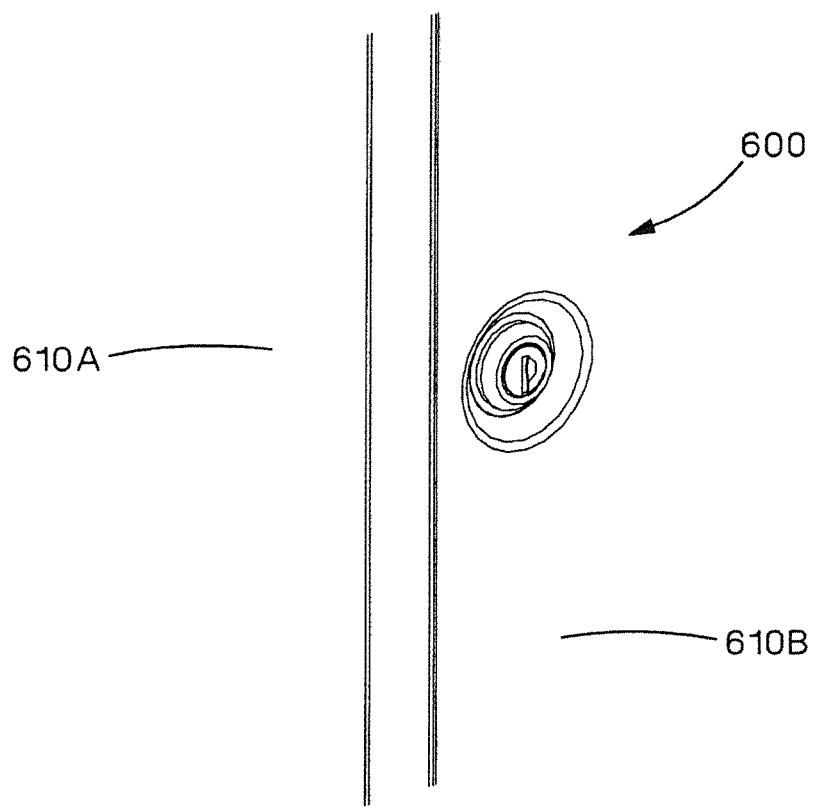
FIG. 45 is an enlarged top front perspective view of detail 45 of FIG. 44.
Figure 46:
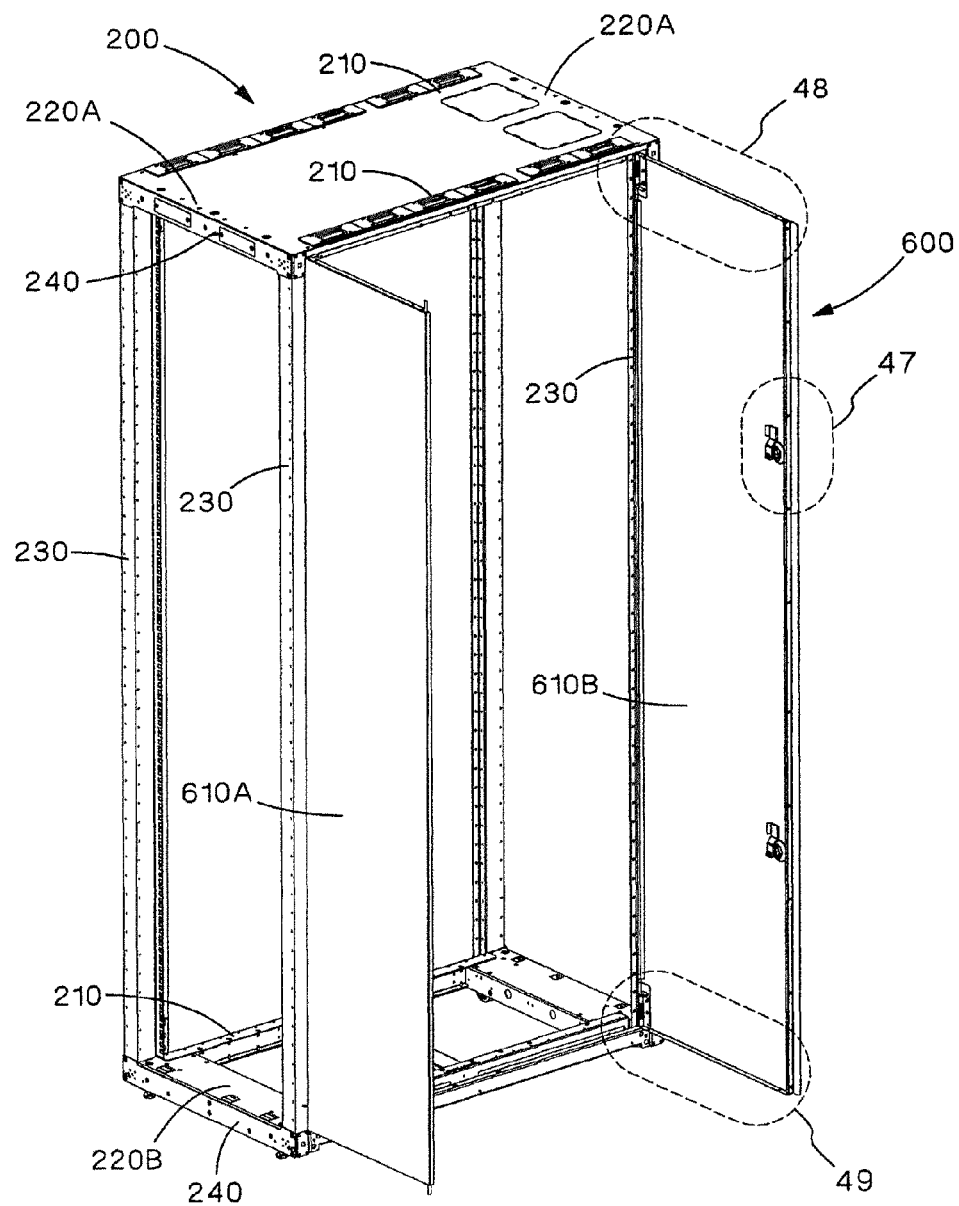
FIG. 46 is a top front perspective view of the cabinet frame of FIG. 44, showing the side door in an open position.
Figure 47:
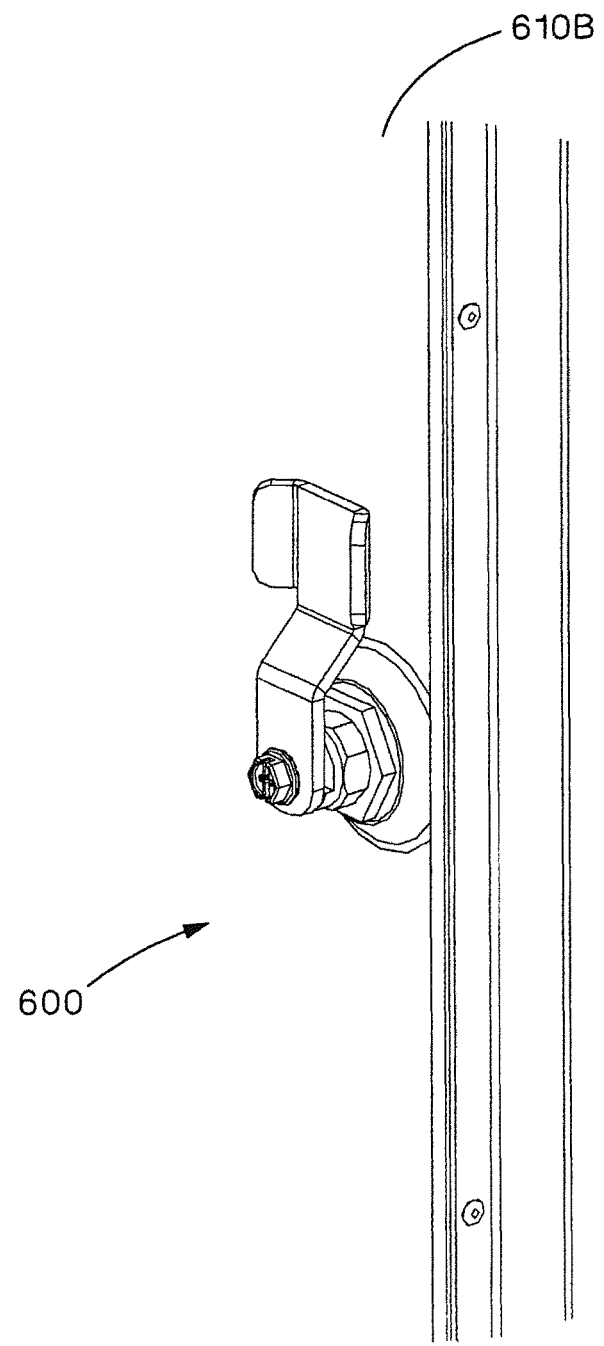
FIG. 47 is an enlarged top front perspective view of detail 47 of FIG. 46.
Figure 48:
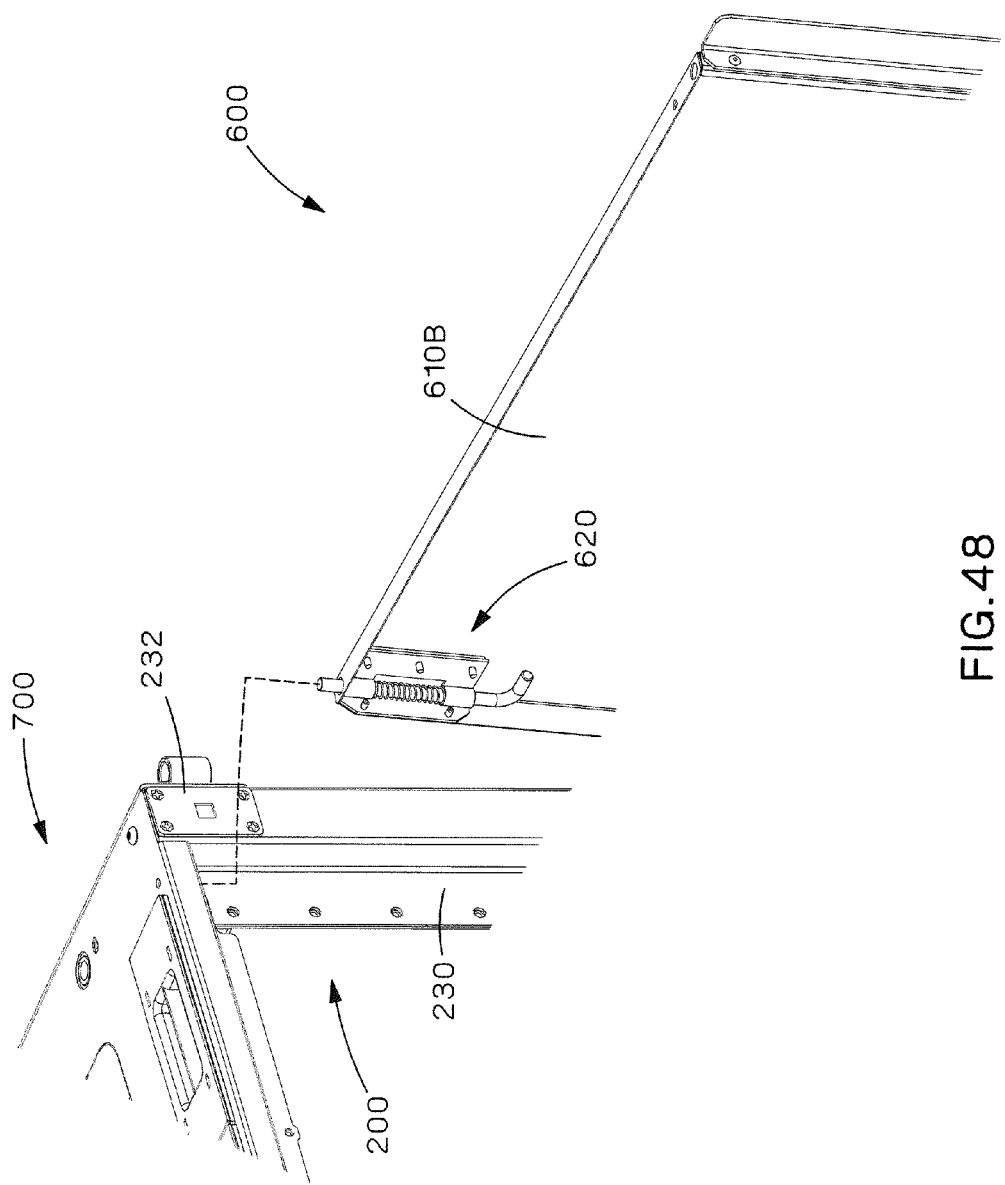
FIG. 48 is an enlarged top front perspective view of detail 48 of FIG. 46.
Figure 49:
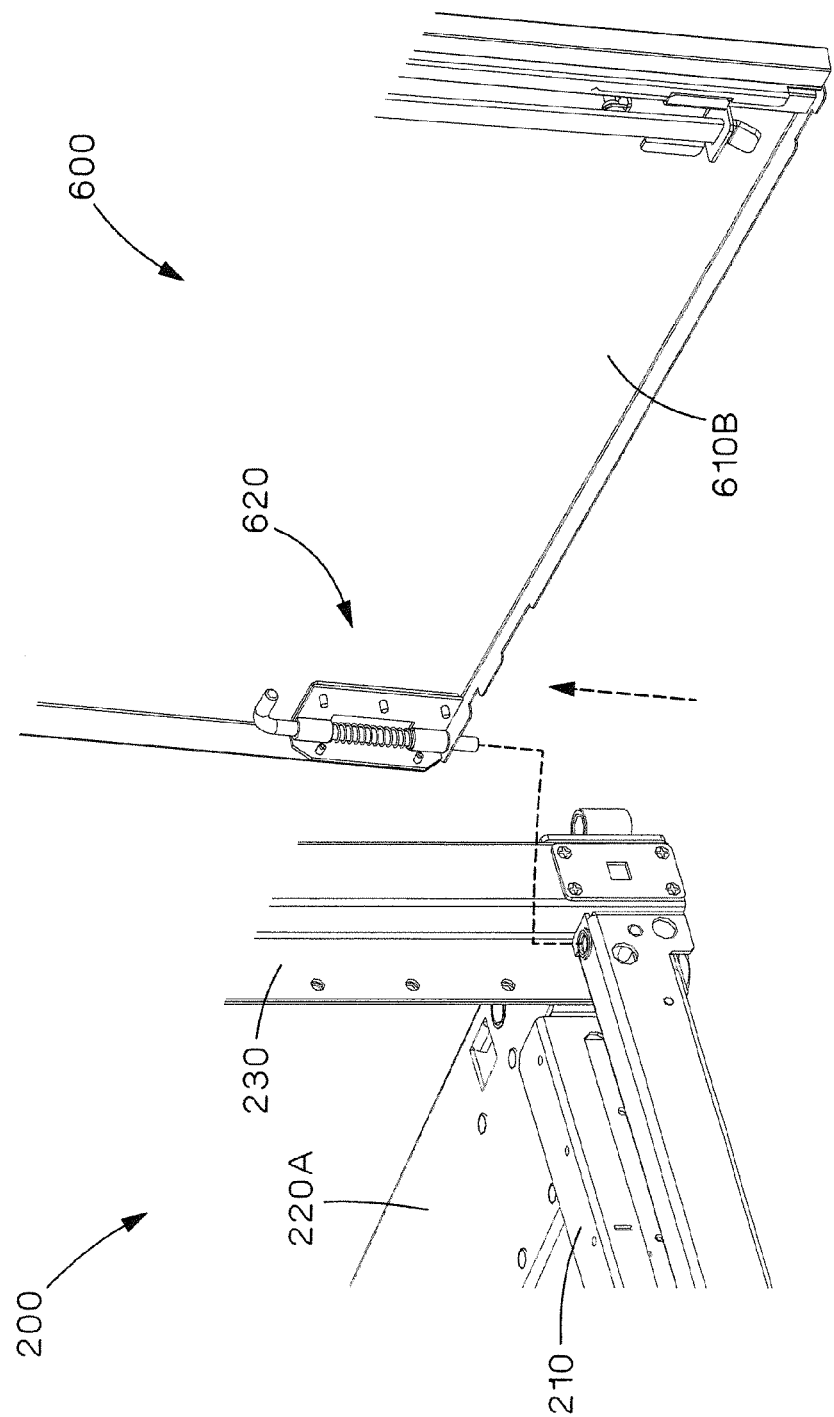
FIG. 49 is an enlarged top front perspective view of detail 49 of FIG. 46.
Figure 50:
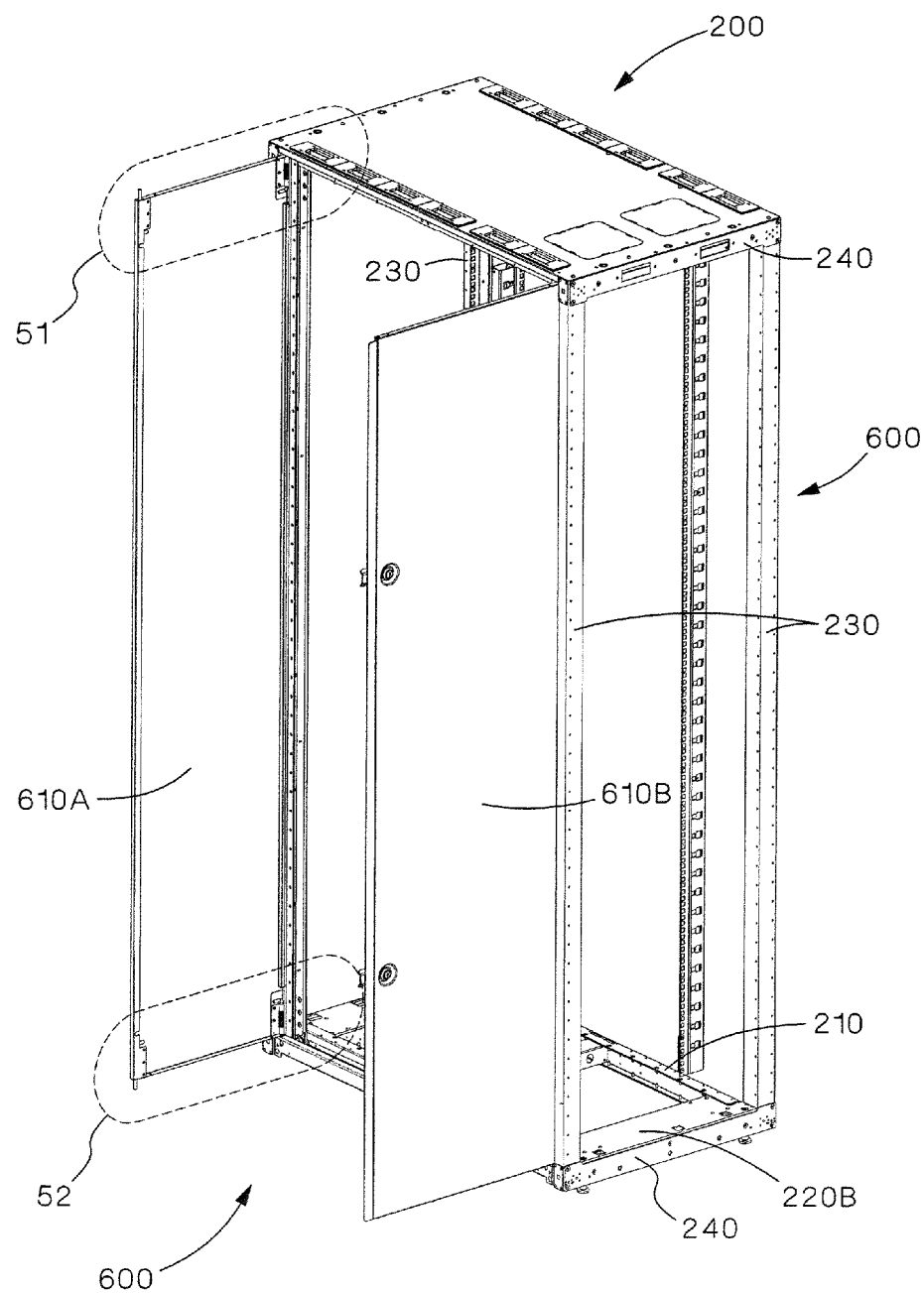
FIG. 50 is a top back perspective view of the cabinet frame of FIG. 44, showing the side door in an open position.
Figure 51:
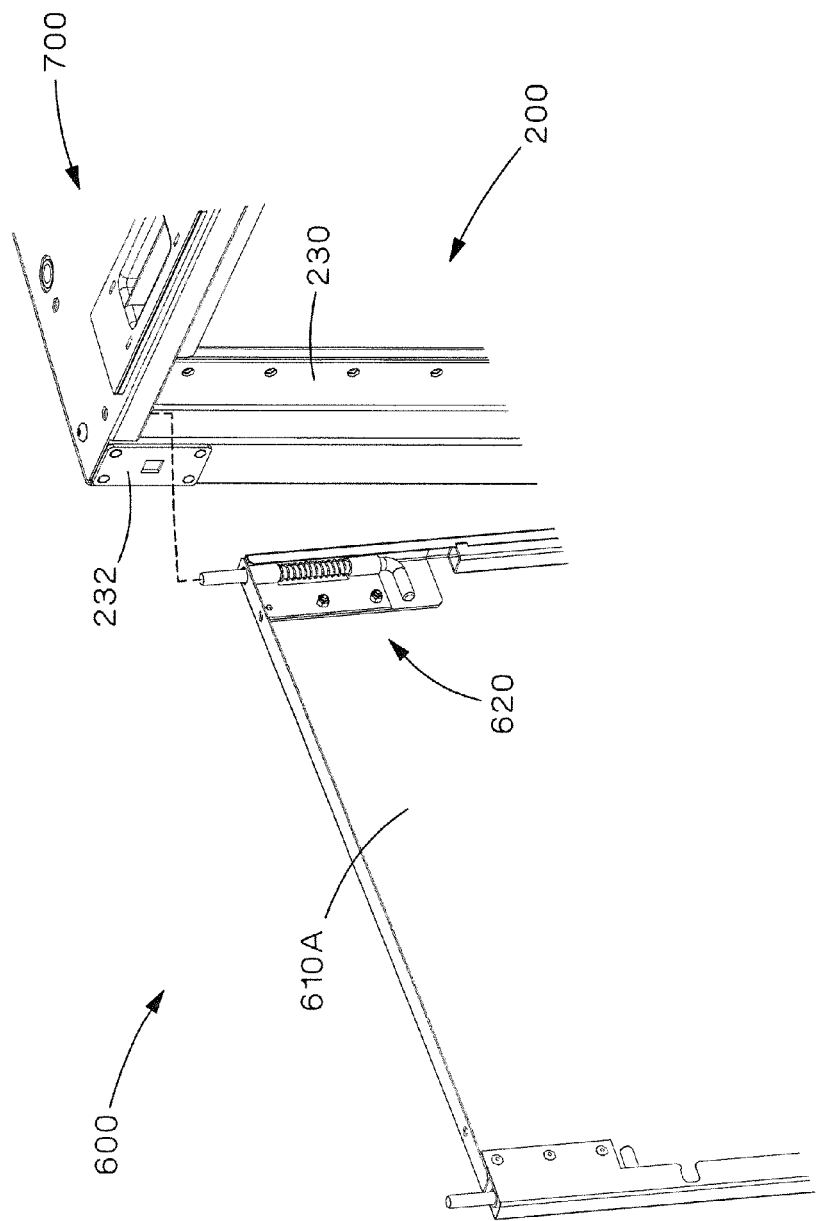
FIG. 51 is an enlarged top back perspective view of detail 51 of FIG. 50.
Figure 52:
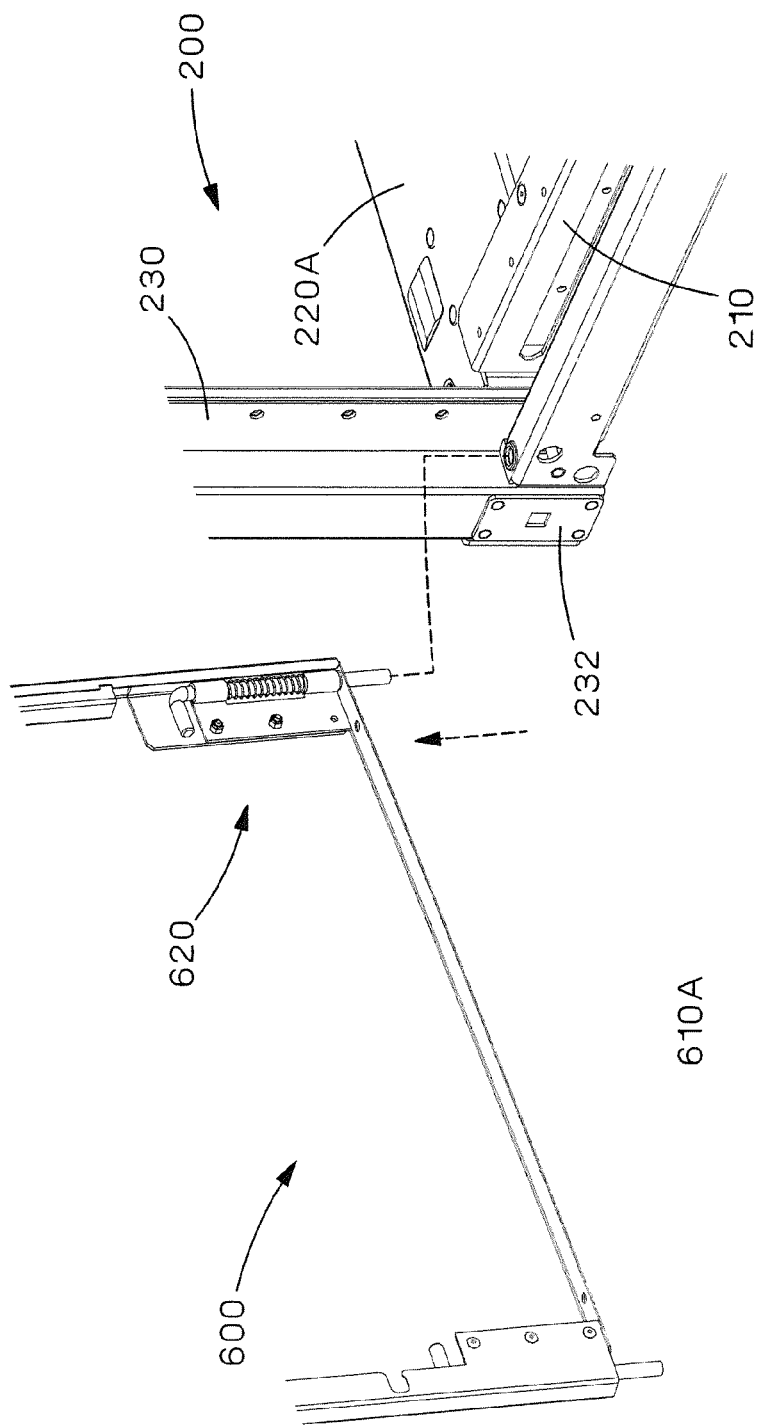
FIG. 52 is an enlarged top back perspective view of detail 52 of FIG. 50.

As shown in FIGS. 44, 46, and 50, side door 600 includes side door panels 610A, 610B, which are rotatably connected to cabinet frame 200, and more particularly, vertical posts 230, as well as top cap 700, and rotate from closed position (FIG. 46) to open position (FIGS. 46 and 50). Additionally, as shown in FIGS. 48, 49, 51, and 52, side door panels 610A, 610B are removably connected to cabinet frame 200, as well as top cap 700, and include spring-loaded hinge pins 620 for quick and easy installation and removal thereof.

Figure 53:
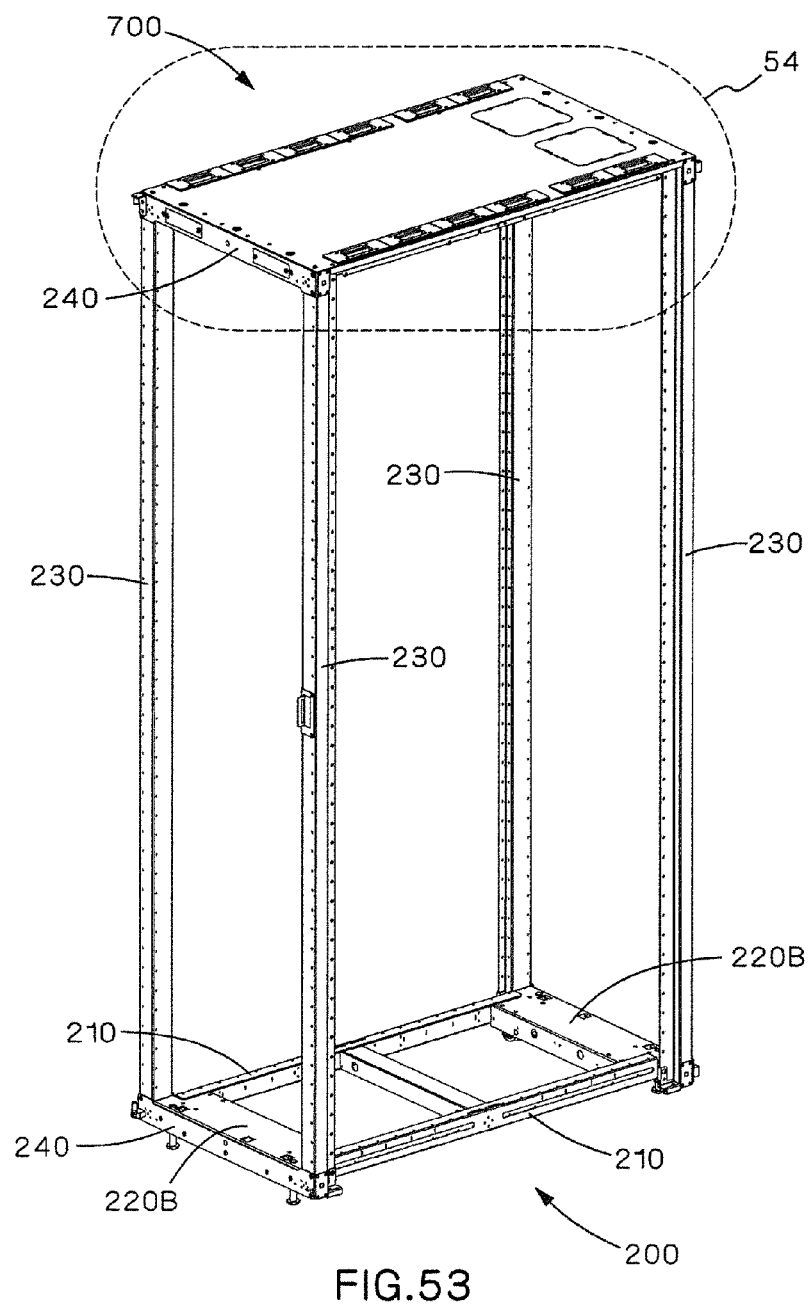
FIG. 53 is top front perspective view of the cabinet frame of FIG. 4, showing the top cap installed.
Figure 54:
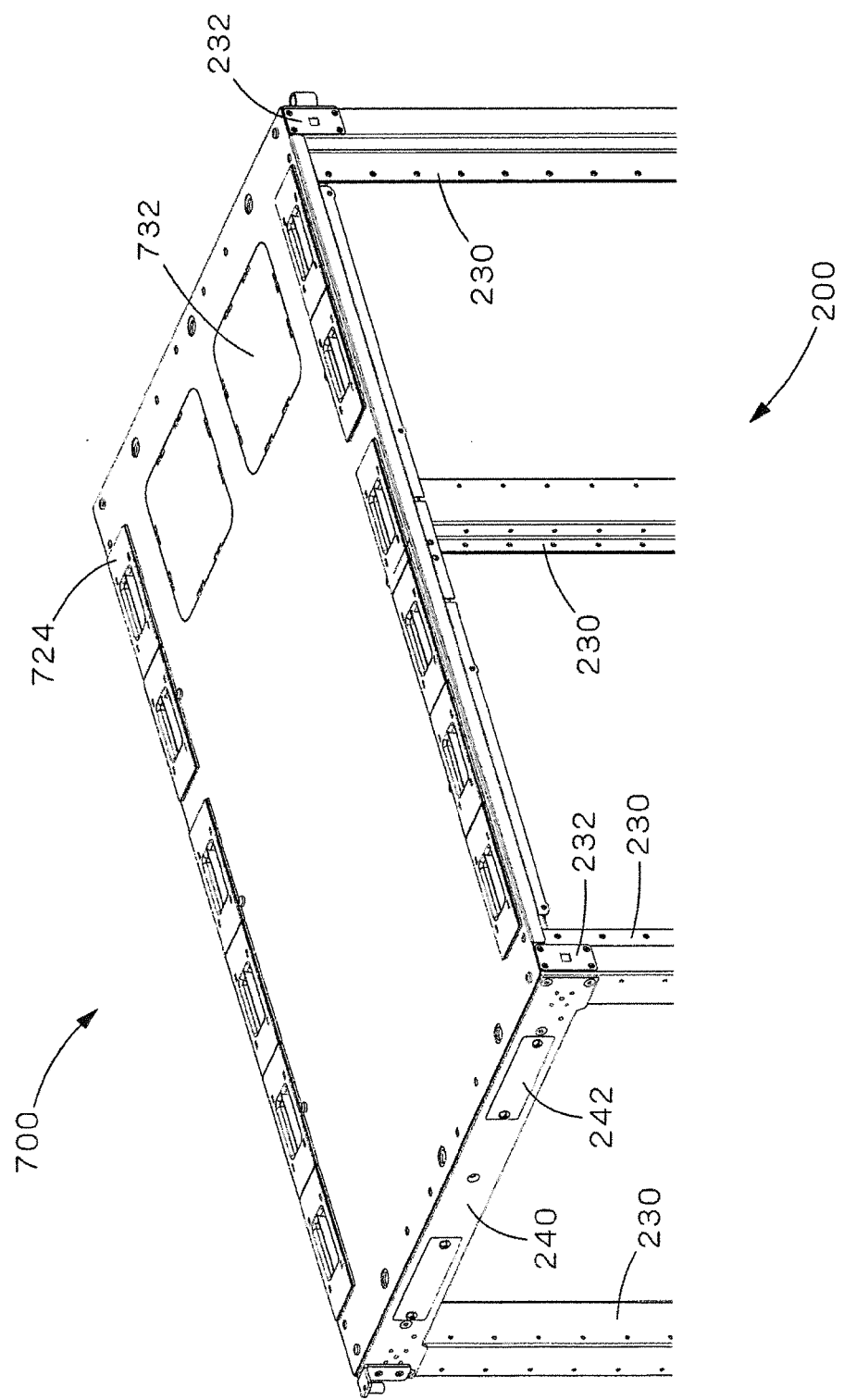
FIG. 54 is an enlarged top front perspective view of detail 54 of FIG. 53.
Figure 55:
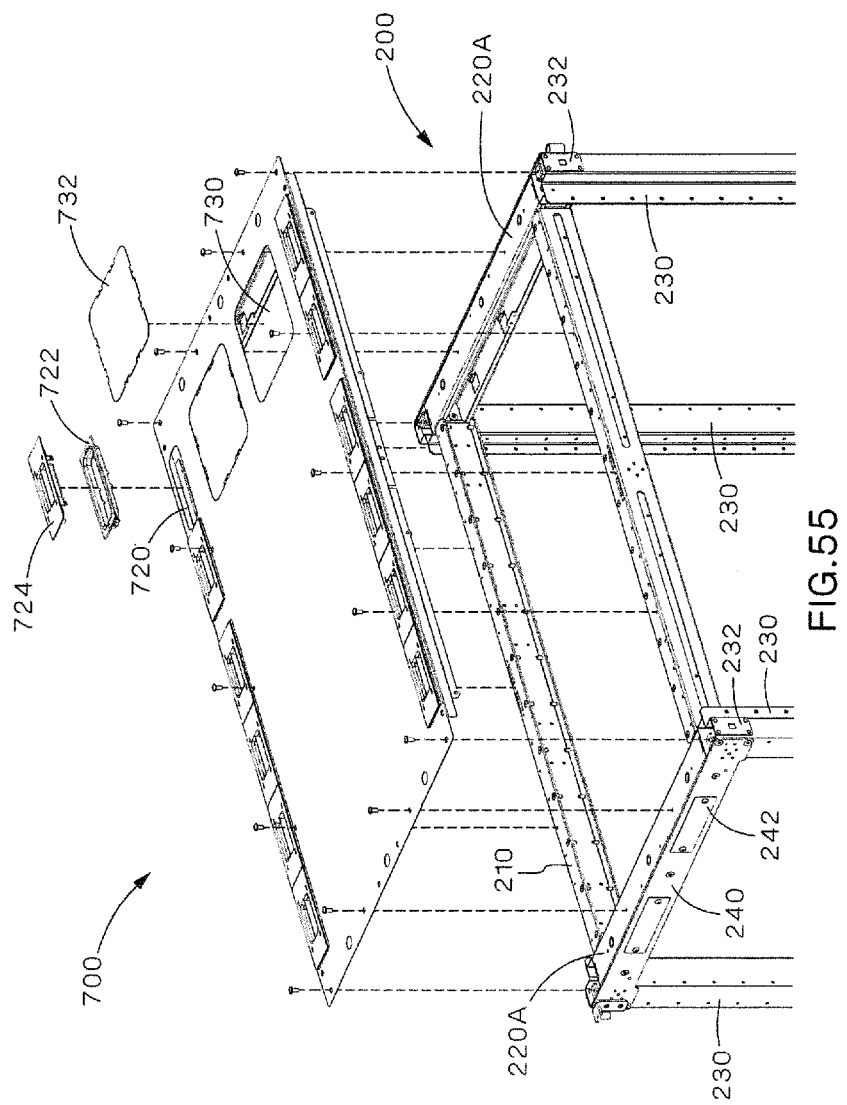
FIG. 55 is a partially exploded top front perspective view of FIG. 54.
Figure 56:
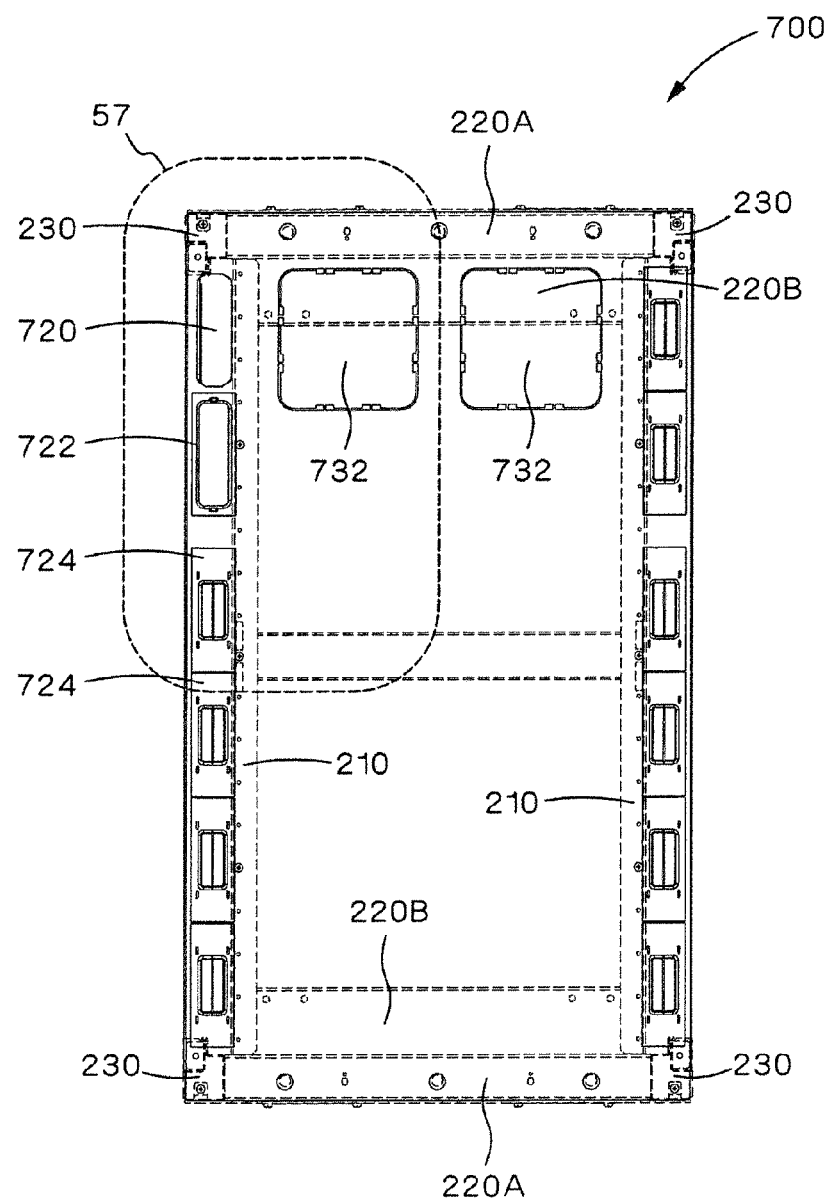
FIG. 56 is a top view of the top cap of FIG. 53, showing the cabinet frame below it in hidden lines.
Figure 57:
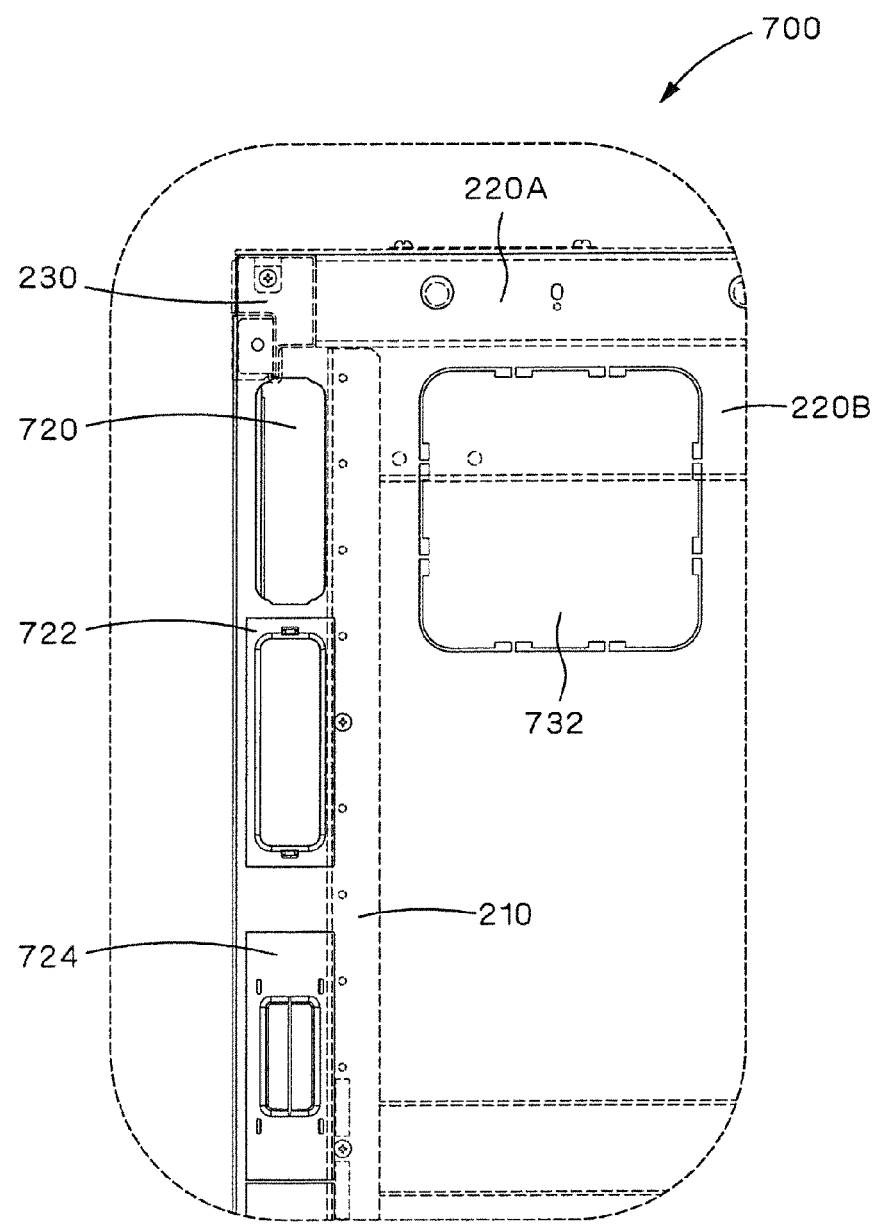
FIG. 57 is an enlarged top view of detail 57 of FIG. 56.
Figure 58:
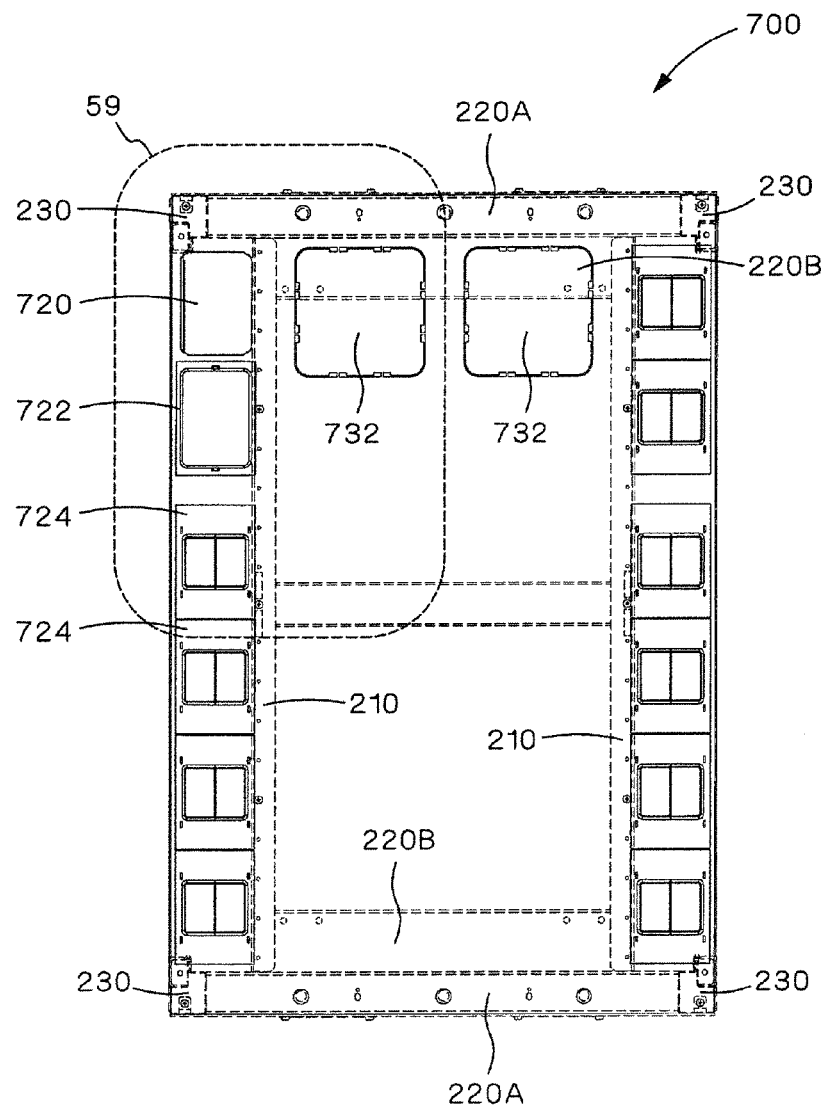
FIG. 58 is a top view of a top cap for a cabinet frame having a width (e.g., 700 mm) greater than the width (e.g., 600 mm) of the cabinet frame of FIG. 53, showing the wider cabinet frame below it in hidden lines and some of the grommets partially or fully removed.
Figure 59:
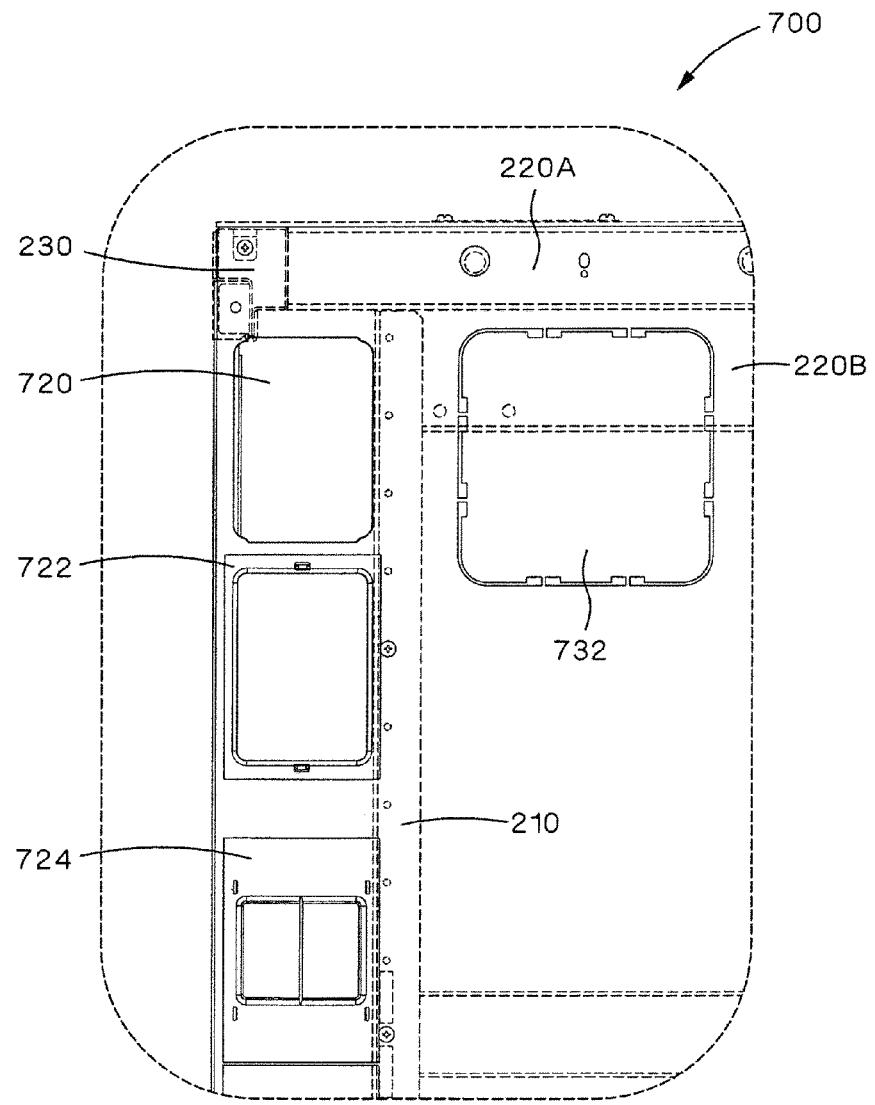
FIG. 59 is an enlarged top view of detail 59 of FIG. 58.
Figure 60:
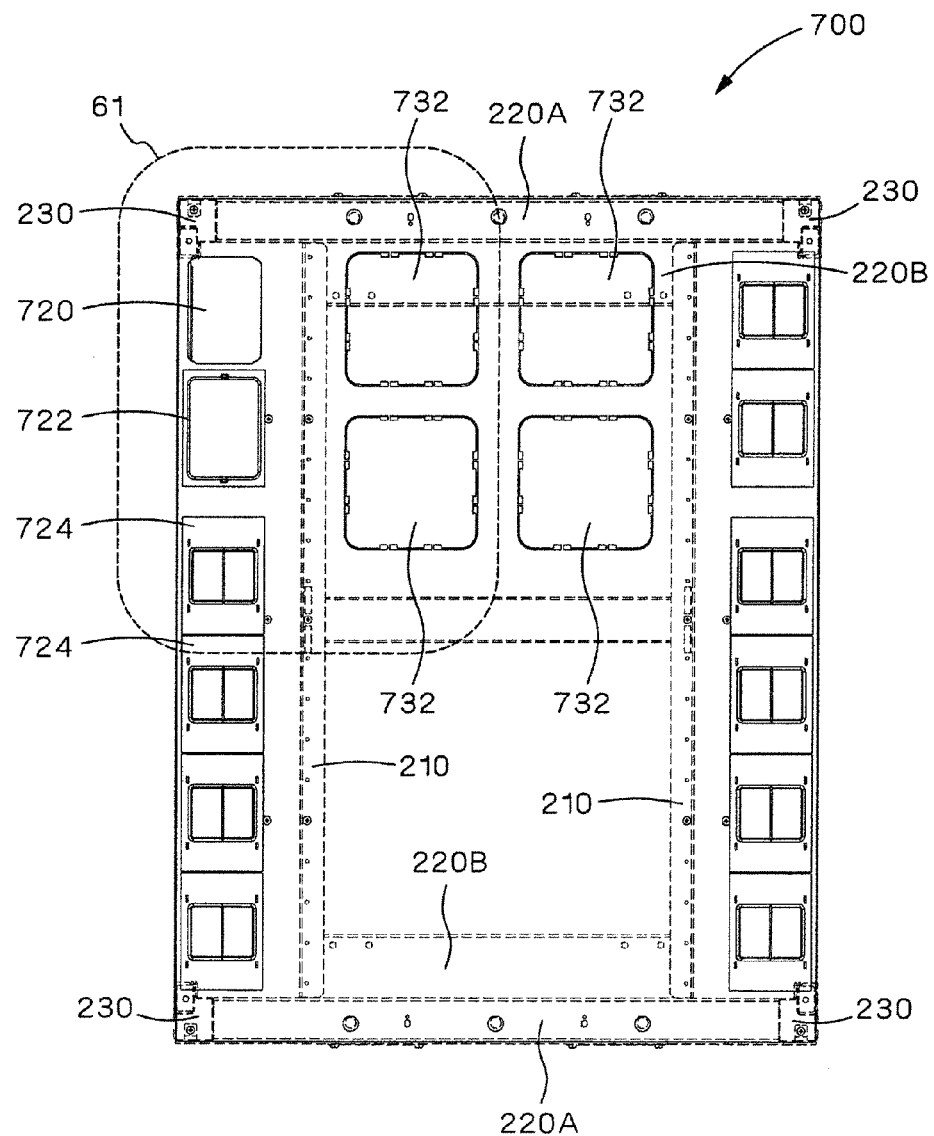
FIG. 60 is a top view of a top cap for a cabinet frame having a width (e.g., 800 mm) greater than the width (e.g., 600 mm) of the cabinet frame of FIG. 58, showing the wider cabinet frame below it in hidden lines and some of the grommets partially or fully removed.
Figure 61:
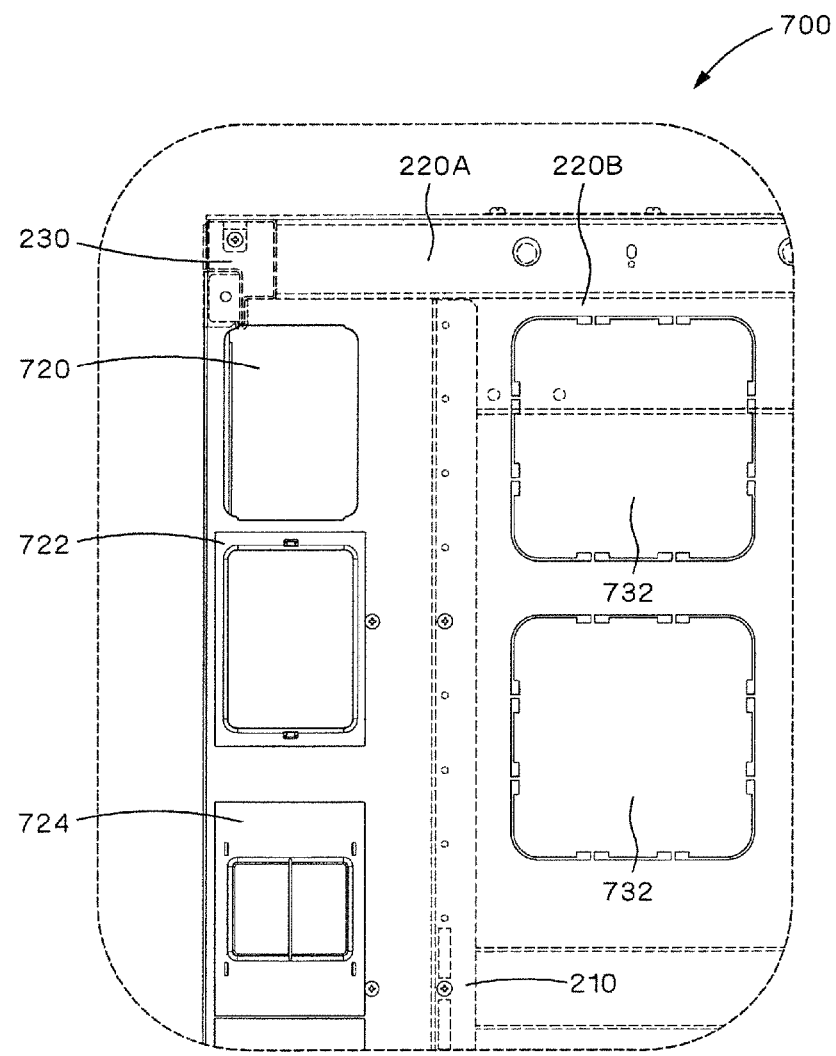
FIG. 61 is an enlarged top view of detail 61 of FIG. 60.

As shown in FIGS. 53-55, top cap 700 is removably connected to cabinet frame 200, and more particularly, front-to-back beams 210 and side-to-side beams 220A of top frame 250A and vertical posts 230, for example, using removable connectors, such as nuts and bolts and screws, and includes data cable openings 720, for example, fitted with grommets 722 and grommet covers 724, disposed above the sides of sever cabinet 100, and more particularly, cable-routing areas 280, and power cable openings 730, for example, fitted with knock-outs 732, disposed above the back of server cabinet 100.

As the width of server cabinet 100 is increased, for example, from 600 mm (FIGS. 56 and 57) to 700 mm (FIGS. 58 and 59) and 800 mm (FIGS. 60 and 61), the width of data cable opening 720 is increased, for example, to accommodate the additional width of cable-routing area 280.

In certain embodiments of the present invention, sensors (not shown), such as door position sensors and environmental sensors (e.g., temperature, humidity, etc.) are mounted on cabinet frame 200, for example, in openings 224, 244.

In certain embodiments of the present invention, modular jacks (not shown), such as Panduit's Mini-Com® modular jacks, are mounted, for example, in openings 224, 244 for quick and easy connection and disconnection of door-mounted electronics, such as handles, keypads, readers, and sensors.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed is:

1. A frame for a cabinet, comprising:
    a side-to-side beam;
    a front-to-back beam connected to the side-to-side beam;
    a vertical post connected to the side-to-side beam,
        wherein the front-to-back beam is inset relative to the vertical post to form a cable-routing area along a side of the frame;
    an equipment rail removably connected to the front-to-back beam; and
    a vertical blanking panel removably connected to the equipment rail and the vertical post.

2. The frame of claim 1, wherein the vertical post is removably connected to the side-to-side beam.

3. The frame of claim 1, wherein the front-to-back beam is inset relative to an intersection of the side-to-side beam and the vertical post.

4. The frame of claim 1, wherein the front-to-back beam is perpendicular to the side-to-side beam and the vertical post is perpendicular to the front-to-back beam and the side-to-side beam.

5. The frame of claim 1, wherein the side-to-side beam includes a cable-routing opening.

6. The frame of claim 5, further comprising a cover plate removably connected to the side-to-side beam and aligned with the cable-routing opening.

7. The frame of claim 5, further comprising a modular jack disposed in the cable-routing opening.

8. The frame of claim 5, further comprising a sensor disposed in the cable-routing opening.

9. The frame of claim 1, further comprising a face plate removably connected to the side-to-side beam and the vertical post.

10. The frame of claim 9, wherein the face plate includes a face plate opening aligned with a cable-routing opening in the side-to-side beam.

11. The frame of claim 10, further comprising a cover plate removably connected to the face plate and aligned with the face plate opening.

12. The frame of claim 1, further comprising a top cap removably connected to at least one of the front-to-back beam, the side-to-side beam, and the vertical post, wherein the top cap includes at least one cable-routing opening aligned with the cable-routing area.

13. The frame of claim 12, further comprising a side panel rotatably connected to the top cap and the vertical post.

14. The frame of claim 1, further comprising a caster connected to the side-to-side beam.

15. The frame of claim 1, further comprising a leveling leg connected to the side-to-side beam.

16. A frame for a cabinet, comprising:
    a side-to-side beam;
    a front-to-back beam connected to the side-to-side beam;
    a vertical post connected to the side-to-side beam,
        wherein the front-to-back beam is inset relative to the vertical post to form a cable-routing area along a side of the frame;
    an equipment rail removably connected to the front-to-back beam; and
    an accessory bracket removably connected to the equipment rail and at least one accessory removably connected to the accessory bracket.

17. The frame of claim 16, wherein the accessory includes a patch panel cassette.

18. The frame of claim 16, wherein the accessory includes a cable management finger.

* * * * *